(12) United States Patent
Watkins et al.

(10) Patent No.: US 11,133,118 B2
(45) Date of Patent: Sep. 28, 2021

(54) PATTERNED NANOPARTICLE STRUCTURES

(71) Applicant: University of Massachusetts, Boston, MA (US)

(72) Inventors: James Watkins, South Hadley, MA (US); Michael R. Beaulieu, Chicopee, MA (US); Nicholas R. Hendricks, South Deerfield, MA (US)

(73) Assignee: University of Massachusetts, Boston, MA (US)

( * ) Notice: Subject to any disclaimer, the term of this patent is extended or adjusted under 35 U.S.C. 154(b) by 747 days.

(21) Appl. No.: 13/900,248

(22) Filed: May 22, 2013

(65) Prior Publication Data
US 2014/0072720 A1 Mar. 13, 2014

Related U.S. Application Data

(60) Provisional application No. 61/650,214, filed on May 22, 2012.

(51) Int. Cl.
*B32B 3/10* (2006.01)
*H01B 1/08* (2006.01)
(Continued)

(52) U.S. Cl.
CPC .......... *H01B 1/08* (2013.01); *H01B 3/10* (2013.01); *H01B 13/003* (2013.01);
(Continued)

(58) Field of Classification Search
None
See application file for complete search history.

(56) References Cited

U.S. PATENT DOCUMENTS 5,626,800 A 5/1997 Williams et al.
5,691,846 A 11/1997 Benson, Jr. et al.
(Continued)

OTHER PUBLICATIONS

Plastics Assembly: Electrically Conductive Polymers. Published Nov. 29, 2010.*
(Continued)

*Primary Examiner* — Christopher M Polley
(74) *Attorney, Agent, or Firm* — Wolf, Greenfield & Sacks, P.C.

(57) ABSTRACT

Aspects relate to patterned nanostructures having a feature size not including film thickness of below 5 microns. The patterned nanostructures are made up of nanoparticles having an average particle size of less than 100 nm. A nanoparticle composition, which, in some cases, includes a binder material, is applied to a substrate. A patterned mold used in concert with electromagnetic radiation function to manipulate the nanoparticle composition in forming the patterned nanostructure. In some embodiments, the patterned mold nanoimprints a suitable pattern on to the nanoparticle composition and the composition is cured through UV or thermal energy. Three-dimensional patterned nanostructures may be formed. A number of patterned nanostructure layers may be prepared and suitably joined together. In some cases, a patterned nanostructure may be formed as a layer that is releasable from the substrate upon which it is initially formed. Such releasable layers may, in turn, be arranged to form a three-dimensional patterned nanostructure in accordance with suitable applications.

55 Claims, 49 Drawing Sheets

(51) Int. Cl.

| | |
|---|---|
| *H01B 3/10* | (2006.01) |
| *H01B 13/00* | (2006.01) |
| *H01L 51/00* | (2006.01) |
| *H01M 8/124* | (2016.01) |
| *H01M 4/04* | (2006.01) |
| *H01M 6/40* | (2006.01) |
| *B82Y 30/00* | (2011.01) |
| *H01L 51/44* | (2006.01) |
| *H01M 8/1286* | (2016.01) |
| *H01L 51/52* | (2006.01) |

(52) U.S. Cl.
CPC .......... *H01L 51/0015* (2013.01); *H01M 4/04* (2013.01); *H01M 6/40* (2013.01); *H01M 8/124* (2013.01); *B82Y 30/00* (2013.01); *H01L 51/442* (2013.01); *H01L 51/5209* (2013.01); *H01L 2251/5369* (2013.01); *H01M 4/0433* (2013.01); *H01M 8/1286* (2013.01); *Y02P 70/50* (2015.11)

(56) References Cited

U.S. PATENT DOCUMENTS

| | | | |
|---|---|---|---|
| 5,777,433 | A | 7/1998 | Lester et al. |
| 5,882,774 | A | 3/1999 | Jonza et al. |
| 6,376,590 | B2 | 4/2002 | Kolb et al. |
| 6,656,990 | B2 | 12/2003 | Shustack et al. |
| 7,074,463 | B2 | 7/2006 | Jones et al. |
| 7,078,276 | B1 * | 7/2006 | Zurcher ............... B22F 9/20 257/E21.703 |
| 7,264,872 | B2 | 9/2007 | Walker, Jr. et al. |
| 7,282,272 | B2 | 10/2007 | Jones et al. |
| 7,317,047 | B2 * | 1/2008 | Hsu ................... B82Y 10/00 252/512 |
| 7,427,438 | B2 | 9/2008 | Jones et al. |
| 7,491,441 | B2 | 2/2009 | Pokorny et al. |
| 7,524,528 | B2 * | 4/2009 | Kodas ................. C09D 11/30 29/620 |
| 7,547,467 | B2 | 6/2009 | Olson et al. |
| 7,691,294 | B2 * | 4/2010 | Chung ................ C09D 5/24 242/159 |
| 7,745,101 | B2 | 6/2010 | Tutt et al. |
| 7,977,240 | B1 * | 7/2011 | Rockenberger ....... C09D 11/52 257/E21.273 |
| 2003/0124259 | A1 * | 7/2003 | Kodas ................. C09D 11/30 427/376.6 |
| 2003/0175411 | A1 * | 9/2003 | Kodas ................. C09D 11/30 427/58 |
| 2005/0282945 | A1 | 12/2005 | Faris |
| 2006/0147703 | A1 | 7/2006 | Walker et al. |
| 2006/0189113 | A1 * | 8/2006 | Vanheusden ......... B22F 1/0018 438/597 |
| 2006/0254502 | A1 * | 11/2006 | Garrou ................ C23C 18/206 117/84 |
| 2010/0135937 | A1 * | 6/2010 | O'Brien .............. A61K 8/02 424/59 |
| 2011/0033672 | A1 | 2/2011 | Yang et al. |
| 2011/0056398 | A1 * | 3/2011 | Weiss ................. B41D 7/00 101/483 |
| 2011/0081538 | A1 * | 4/2011 | Linton ................ C30B 7/08 428/323 |
| 2011/0126734 | A1 | 6/2011 | Joly et al. |
| 2011/0288215 | A1 | 11/2011 | Shultz et al. |
| 2012/0288697 | A1 * | 11/2012 | Wu .................... C23C 2/04 428/216 |
| 2012/0318675 | A1 * | 12/2012 | Guillet ................ B82Y 30/00 205/122 |

OTHER PUBLICATIONS

Common Insulating Materials from Professional PLastics. Obtainted Nov. 23, 2016.*
Conductivity of Semiconductor by electrical4u.com (Obtained May 24, 2018).*
Comprehensive List of Transparent Polymers by SpecialChem (Year: 2017).*
Transition metal oxide nanoparticles as efficient catalysts in oxidation reactions by Akbari et al (Year: 2017).*
Ahn et al., Dynamic Nanoinscribing for continuous and seamless metal and polymer nanogratings. Nano Letters. 2009; 9(12):4392-7.
Beattie et al., Si electrodes for Li-Ion batteries—A new way to look at an old problem. Journal of the Electrochemical Society. 2008;155(2):A158-A163.
Beckel et al., Thin films for micro solid oxide fuel cells. Journal of Power Sources. 2007; (173):325-45.
Boukamp et al., All-Solid Lithium Electrodes with mixed-conductor matrix. Journal of Electrochemical Society. 1981; 128(4):725-9.
Burda et al., Chemistry and Properties of Nanocrystals of Different Shapes. Chemical Reviews. 2005;(105):1025-102.
Choi et al., Direct imprint of conductive silver patterns using nanosilver particles and UV curable resign. Microelectronic Engineering. 2009; (86):622-7.
Daga et al., Hydrogen bond assisted assembly of well-ordered polyhedral oligomeric silsesquioxane-Block copolymer composites. Macromolecules. 2011;44:6793-9.
Duoss et al., Sol-Gel Inks for Direct-Write Assembly of Functional Oxides. Advanced Materials. 2007;19(21):3485-9.
Gao et al., Alloy Formation in Nanostructured Silicon. Advanced Materials. 2001;13(11):816-9.
Gupta et al., Entropy-driven segregation of nanoparticles to cracks in multilayered composite polymer structures. Nature Materials. 2006; (5):229-33.
Haruta et al., Low-Temperature Oxidation of CO over Gold Supported on TiO2, α-Fe2O3, and Co3O4. Journal of Catalysis. 1993;(144):175-92.
Hayashi et al., Selective Vapor-Phase Epoxidation of Propylene over AU/TiO2 Catalysts in the presence of oxygen and hydrogen. Journal of Catalysis. 1998; (178):566-75.
Ingrosso et al., An epoxy photoresist modified by luminescent nanocrystals for the fabrication of 3D High-Aspect-Ratio microstructures. Advanced Functional Materials. 2007; (17): 2009-17.
Ok et al., Continuous Patterning of Nanogratings by Nanochannel-Guided Lithography on Liquid Resists. Advanced Materials. 2011; (23):4444-8.
Kade et al., The power of Thiol-ene chemistry. Journal of Polymer Science Part A: Polymer Chemistry. 2010;48:743-50.
Kim et al., Fabrication of a conductive nanoscale electrode for functional devices using nanoimprint lithography with printable metallic nanoink. Microelectronic Engineering. 2010; (87):839-42.
Ko et al., Direct nanoimprinting of metal nanoparticles for nanoscale electronics fabrication. Nano Letters. 2007; (7)7:1869-77.
Larcher et al., Recent findings and prospects in the field of pure metals as negative electrodes for Li-ion batteries. Journal of Materials Chemistry. 2007; (17):3759-72.
Lee et al., Silicon nanoparticles-graphene paper composites for Li ion battery anodes. Chemical Communications. 2010;(46):2025-7.
Lee et al., Nanocomposites derived from phenol-functionalized si nanoparticles for high performance lithium ion battery anodes. Chemistry of Materials. 2009; (21):6-8.
Lee et al., Nanoparticle alignment and repulsion during failure of glassy polymer nanocomposites. Macromolecules. 2006; (39):7392-6.
Lewis et al., Direct Ink Writing of Three-Dimensional Ceramic Structures. Journal of the American Ceramic Society. 2006; 89(12):3599-609.
Lewis, Direct Ink Writing of 3D Functional Materials. Advanced Functional Materials. 2006; (16):2193-204.
Li et al., Responsive Assemblies: Gold nanoparticles with mixed ligands in microphase separated block copolymers. Advanced Materials. 2008; (20):1462-6.
Li et al., Electrochemical and Solid State Letters. 1999; (2):547-9.
Lin et al., Nanoparticle-driven assembly of block copolymers: A simple route to ordered hybrid materials. Journal of the American Chemical Society. 2011; (133):6513-6.

(56) References Cited

OTHER PUBLICATIONS

Litzelman et al., Opportunities and challenges in materials development for thin film solid oxide fuel cells. Fuel Cells 08. 2008; (5): 294-302.

O et al., Recent advances in microdevices for electrochemical energy conversion and storage. International Journal of Energy Research. 2007; (31):548-75.

Park et al., Nanoscale Patterning and Electronics on Flexible Substrate by Direct Nanoimprinting of Metallic Nanoparticles. Advanced Materials. 2008; (20):489-96.

Persano et al., Soft Nanopatterning on Light-Emitting Inorganic-Organic Composites. Advanced Functional Materials. 2008; (18):2692-8.

Reboud et al., Spontaneous Emission control of colloidal nanocrystals using nanoimprinted photonic crystals. Applied Physics Letters. 2007; (90):011115-3.

Sinha et al., A Three-Dimensional mesoporous titanosilicate support for gold nanoparticles: Vapor-Phase epoxidation of propene with high conversion. Angewandte Chem. International Edition. 2004;(43):1546-8.

Subramania et al., Gallium nitride based logpile photonic crystals. Nano Letters. 2011;11(11):4591-6.

Subramania et al., Log-Pile $TiO_2$ Photonic Crystal for Light Control at Near-UV and Visible Wavelengths. Advanced Materials. 2010;22:487-91.

Subramania et al., Nano-lithographically fabricated titanium dioxide based visible frequency three dimensional gap photonic crystal. Optics Express. 2007;15(20):13049-57.

Tamborra et al., Nanocrystal-Based Luminescent Composites for Nanoimprinting Lithography. Small. 2007;3(5):822-8.

Taylor et al., Nanoimprinted electrodes for micro-fuel cell applications. Journal of Power Sources. 2007; (171):218-23.

Tietz et al., From powder properties to fuel cell performance—A holistic approach for SOFC cathode development. Solid State Ionics. 2008; (179):1509-15.

Zanella et al., Alternative Methods for the Preparation of Gold Nanoparticles Supported on $TiO_2$. The Journal of Physical Chemistry B. 2002; 106(31):7634-42.

Jackman et al., Fabrication of Submicrometer Features on Curved Substrates by Microcontact Printing. Science. Aug. 4, 1995;269:664-6.

Wilbur et al., Microfabrication by Microcontact Printing of Self-Assembled Monolayers. Advanced Materials. 1994;6(7):600-4.

Cherniavskaya et al., Edge transfer lithography of molecular and nanoparticle materials. Langmuir. 2002;18:7029-34.

Jackman et al., Fabrication of submicrometer features on curved substrated by microcontact printing. Science. Aug. 4, 1995;269:664-6.

Perl et al., Microcontact printing: limitations and achievements. Advanced Materials. 2009;21:2257-68.

Techane et al., Simulation and modeling of self-assembled monolayers of carboxylic acid thiols on flat and nanoparticle gold surfaces. Analytical Chemistry. 2011;83:6704-12.

Wilbur et al., Microfabrication by microcontact printing of self-assembled monolayers. Advanced Materials. 1994;6:600-4.

Caseri, Nanocomposites of polymers and metals or semiconductors: Historical background and optical properties. Macromol. Rapid Commun. 2000;21:705-722.

Cummins et al., Inkjet printing of conductive materials: a review. Circuit World. 2012;38(4):193-213.

Doering et al., Handbook of Semiconductor Manufacturing Technology Second Edition, Chapter 16: Damascene Copper Electroplating. CRC Press. 2008:6 pages.

Hecht, Optics, Third Edition, Chapter 4: The Propagation of Light. Addison Wesley Longman, Inc. 1998:85-7.

Kamyshny et al., Conductive Nanomaterials for Printed Electronics. Small. 2014;10(17):3515-35.

Kim et al., Refractive Index Tuning of Hybrid Materials for Highly Transmissive Luminescent Lanthanide Particle—Polymer Composites. ACS Appl. Mater. Interfaces. 2018;10:9038-47.

Kim et al., Use of copper ink for fabricating conductive electrodes and RFID antenna tags by screen printing. Current Applied Physics. 2012;12:473-8.

Kipphan, Handbook of Print Media. Springer-Verlag Berlin Heidelberg. 2001:132.

Lü et al., High refractive index organic—inorganic nanocomposites: design, synthesis and application. Journal of Materials Chemistry. 2009;19:2884-901.

Madou, Fundamentals of Microfrabrication: The Science of Miniaturization, Second Edition. CRC Press LLC. 2002:344-6.

Shacham-Diamand et al., 30 years of electroless plating for semiconductor and polymer micro-systems. Microelectronic Engineering. 2015;132:35-45.

Ting et al., Selective Electroless Metal Deposition for Integrated Circuit Fabrication. J. Electrochem. Soc. Feb. 1989;136(2):456-62.

Wu, Inorganic nanomaterials for printed electronics: a review. Nanoscale. 2017;9:7342.

\* cited by examiner

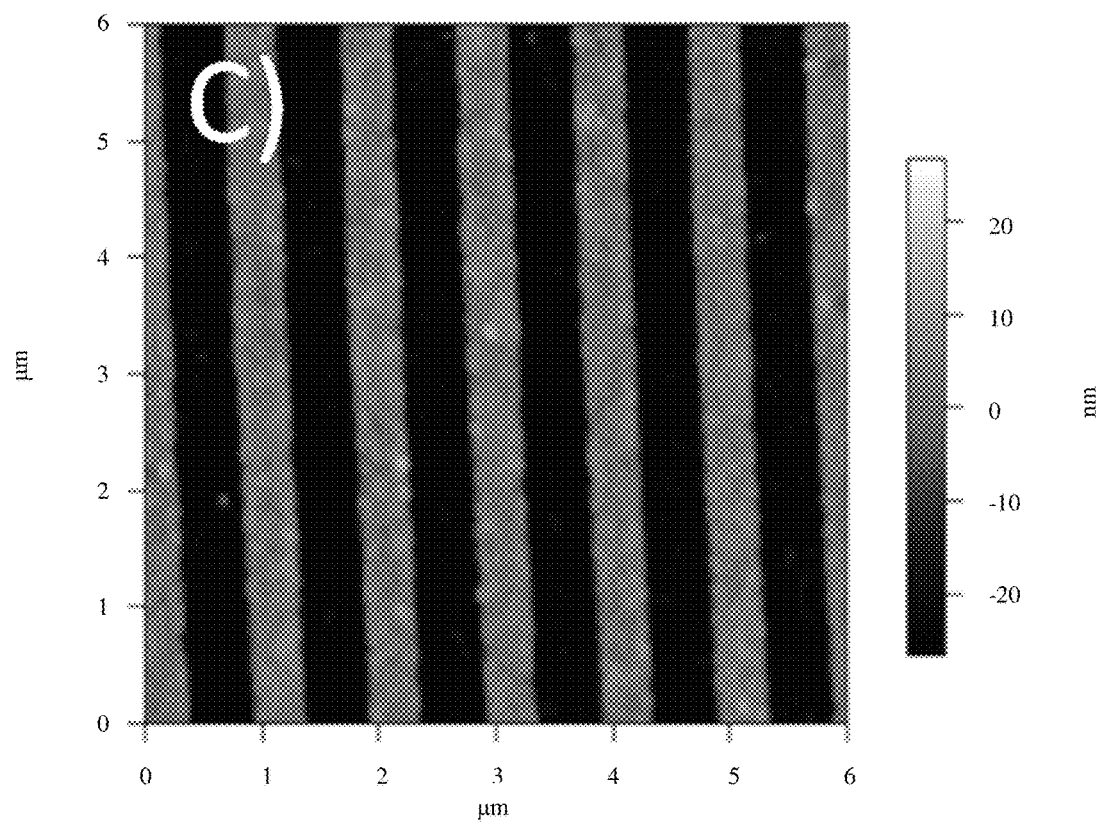
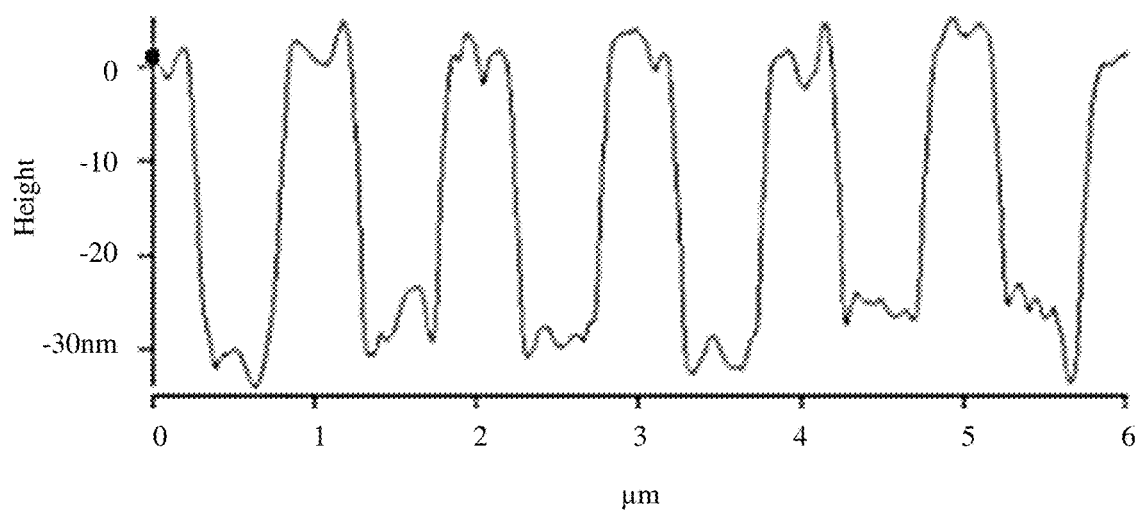
Fig. 2C

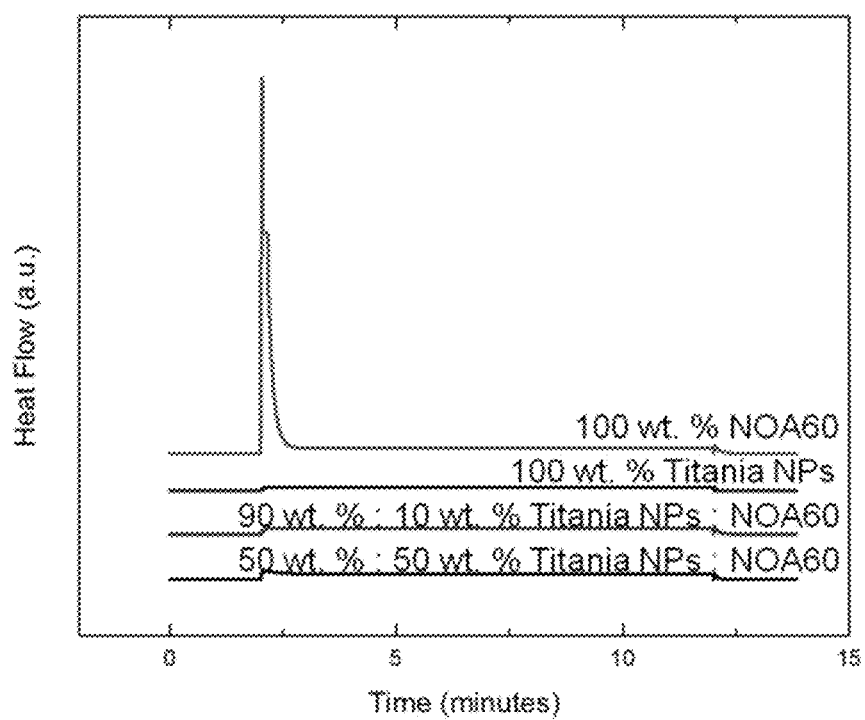
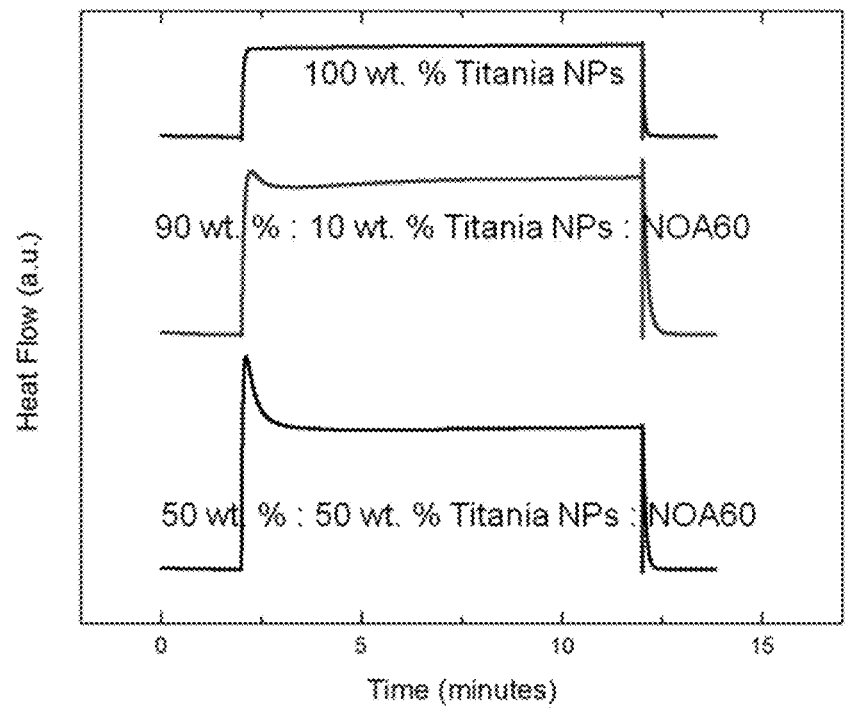
Fig. 24

ASTM D 3359 with Scotch Tape 810

| % TiO₂ | Rating |
|---|---|
| 100 | 5A* |
| 90 | 5A* |
| 80 | 5A* |
| 70 | 5A |
| 60 | 5A |
| 50 | 5A |

*Adhesive was left behind on top of the film

ASTM D 3359 Rating System
5A – No peeling or removal.
4A – Trace peeling or removal along incisions or at their intersections.
3A – Jagged removal along incisions up to 1/16" on either side.
2A – Jagged removal along most incisions up to 1/8" on either side.
1A – Removal from most of the area of the X under the tape.
0A – Removal beyond the area of the X.

Fig. 25

NOA60
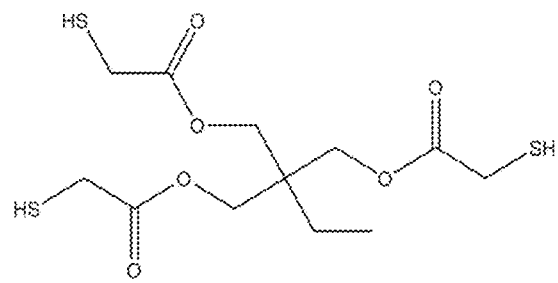
Trimethylolpropane Tris(2-mercaptoacetate)
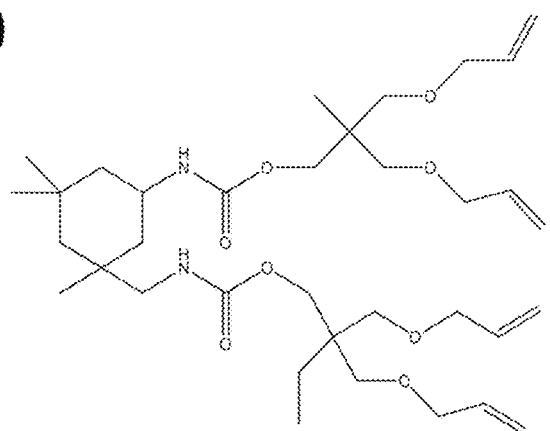
Urethane based Tetra Functional Allyl Ene
Fig. 26

| wt% TiO$_2$ Nanoparticles | RMS (nm) |
|---|---|
| 50 | 5.41 |
| 60 | 5.10 |
| 70 | 4.85 |
| 80 | 4.70 |
| 90 | 4.97 |
| 100 | 4.68 |

Fig. 28

PATTERNED NANOPARTICLE STRUCTURES

RELATED APPLICATIONS

This application claims the benefit under 35 U.S.C. § 119(e) of priority to U.S. Provisional Patent Application Number 61/650,214, filed May 22, 2012, the contents of which is herein incorporated by reference in its entirety for all purposes.

FEDERALLY SPONSORED RESEARCH

This invention was made with government support under contract number CMMI-1025020 awarded by the National Science Foundation. The government has certain rights in the invention.

FIELD OF INVENTION

Aspects described herein relate generally to patterned nanostructures comprising nanoparticles.

BACKGROUND

Devices having improved optical and electronic properties have gained increasing interest, particularly at the sub-micron length scale. Such devices may be composed of inorganic materials such as metals, metal oxides, semiconductors (e.g., silicon), carbonaceous or other amorphous, crystalline and/or semi-crystalline compositions. Traditional manufacturing techniques for semiconductors having certain opto-electronic properties involve subtractive processes where material is built up and removed through various mask/etch processes. The types of materials that are involved using these techniques are limited. Further, such subtractive processes can be expensive and wasteful.

Direct write techniques have been used as an additive process to produce patterns of metal oxides and other materials by precipitation and coagulation of inks dispensed from nozzles of parallel ink heads. This technique, however, has a number of disadvantages by being slow, limited to large micron scale dimensions, unable to be used to manipulate semi-crystalline, crystalline or conducting compositions at low temperature, and is not easily scalable.

Accordingly, improved additive techniques for forming patterned structures having dimensions at sub-micron lengths through high-speed manufacturing processes would provide advantages to the current state of the art.

SUMMARY

Patterned nanoparticle structures suitable for various applications, and related components, systems, and methods associated therewith are provided.

In an illustrative embodiment, a material is provided. The material comprises a plurality of nanoparticles formed as a patterned nanostructure having a feature size not including film thickness of below 5 microns, wherein the plurality of nanoparticles have an average particle size of less than 100 nm.

In another illustrative embodiment, a method of forming a patterned nanostructure is provided. The method includes applying a nanoparticle composition to a surface of a substrate, the nanoparticle composition including a plurality of nanoparticles having an average particle size of less than 100 nm; and using electromagnetic radiation in cooperation with a patterned mold and/or mask to manipulate the nanoparticle composition and form the patterned nanostructure, wherein the patterned nanostructure has a feature size not including film thickness of below 5 microns.

In a further illustrative embodiment, a method of forming a three-dimensional patterned nanostructure is provided. The method includes forming a first patterned nanostructure layer having a first feature size not including film thickness below 5 microns, the first patterned nanostructure layer including a first plurality of nanoparticles having an average particle size of less than 100 nm. The method also includes forming a second patterned nanostructure layer having a second feature size not including film thickness below 5 microns, the second patterned nanostructure layer including a second plurality of nanoparticles having an average particle size of less than 100 nm; and placing the second patterned nanostructure layer over the first patterned nanostructure layer.

The foregoing is a non-limiting summary of the invention, which is defined by the attached claims. Other aspects, embodiments, features and advantages will become apparent from the following description. Each reference incorporated herein by reference is incorporated in its entirety. In cases of conflict or inconsistency between an incorporated reference and the present specification, the present specification will control.

BRIEF DESCRIPTION OF THE DRAWINGS

The accompanying drawings are not intended to be drawn to scale. For purposes of clarity, not every component may be labeled in every drawing. In the drawings:

FIG. 24 illustrates photo-DSC thermograms of patterned nanoparticle structures in accordance with some examples;

FIG. 25 depicts measures of adhesion of patterned nanoparticle structures in accordance with some examples;

FIG. 26 shows chemical structures for a component of a patterned nanoparticle structure in accordance with some examples;

FIG. 28 shows a table indicating the roughness of the planar films as a function of nanoparticle loading in accordance with some examples;

DETAILED DESCRIPTION

Figure 1A:
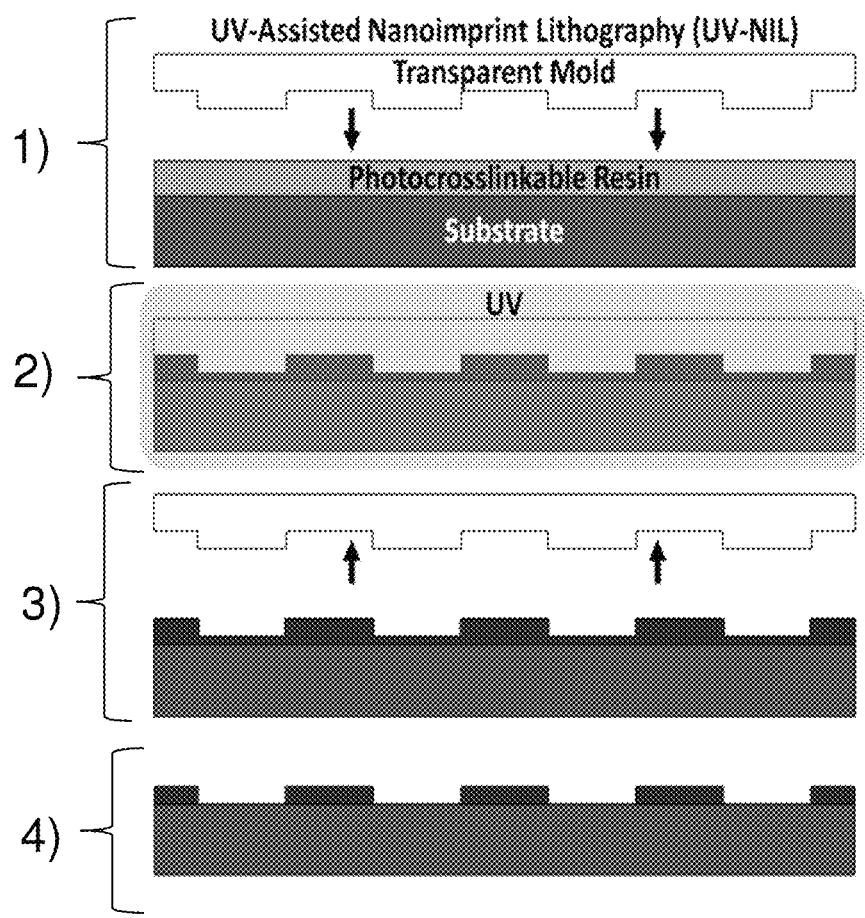
FIG. 1A shows processing steps for ultraviolet-assisted nanoimprint lithography.

The present disclosure relates to patterned nanostructures having a plurality of nanoparticles where the patterned nanostructure has a feature size that is below 5 microns (e.g., below 3 microns, below 1 micron, below 500 nm). As determined herein, a feature size of a patterned nanostructure is considered to be a designed dimension having resulted from a patterning fabrication process of a nanoparticle composition other than the film thickness of the nanostructure itself or other incidental surface asperities. In some cases, the feature size is considered to be a critical dimension of the patterned nanostructure. Some examples of feature sizes include, but are not limited to, a width of patterned lines (straight or curved), a frequency of periodic structures, a distance between edges of a geometric structure, etc. In some embodiments, the plurality of nanoparticles of the patterned nanostructure may have an average particle size of less than 100 nm.

Methods are described that involve direct, additive fabrication of metal oxide (e.g., amorphous, crystalline, semi-crystalline), metal and semiconductor nanostructures via patterning compositions of nanoparticles. Such methods may employ any suitable type of electromagnetic radiation, such as ultraviolet (UV), near-IR, thermal, visible, infrared or any other appropriate radiation. Forming a patterned nanostructure having a feature size of below 5 microns may involve applying a nanoparticle composition to a surface of a substrate. Electromagnetic radiation is used in cooperation with a patterned mold to manipulate the nanoparticle composition and form the patterned nanostructure. For instance, using nanoimprint lithography (NIL), a patterned mold may be appropriately placed into contact (e.g., pressed) with the nanoparticle composition having been applied to the surface of the substrate resulting in a nanoparticle composition having a pattern that conforms to the shape of the patterned mold. The nanoparticle composition may then be cured or crystallized, for example, through crosslinking of various components of the composition from exposure to a suitable energy source, such as heat or ultraviolet radiation. Other techniques may be used, such as nanoinscribing, photolithography, capillary force lithography and/or electron beam lithography.

Aspects of the present disclosure provide for crystalline nanostructured devices comprising metal oxide nanoparticles to be fabricated via an additive process that has a number of advantages.

One advantage of nanostructured devices described herein is that such devices may be tuned to exhibit particular optoelectronic properties (e.g., refractive index, transmittance, reflectance, etc.) based on certain aspects of how they are fabricated, such as the particular percent combination of materials, type of materials incorporated, etc.

Another advantage is that nanostructured devices may be fabricated so as to exhibit a relatively small amount of volume contraction upon calcination. In certain methods of fabrication, metal oxides to be processed into a nanostructured device are initially provided in a composition that has a substantial amorphous state. When such compositions are subject to a step of calcination (for crystallization of the overall composition), there is a tendency for the volume of the composition to shrink substantially, which may be disruptive to the general structure of the material. However, in accordance with embodiments of the present disclosure, metal oxide nanoparticles that are highly crystalline (e.g., 90-95% crystalline) are initially provided. A sol-gel precursor is used as a binder (e.g., rather than a polymer binder) together with the metal oxide nanoparticles to form a nanostructure composition. The nanostructure composition including the metal oxide nanoparticles and sol-gel precursor is then subject to calcination, which causes the amorphous portion of the composition to shrink. However, because the composition is predominantly crystalline in its initial state (metal oxide nanoparticles and sol-gel precursor combination), the composition is subject to minimal shrinkage, such as that shown in the Example provided in FIG. 10.

For instance, in some embodiments, the percent reduction in thickness upon calcination of a nanostructured layer, fabricated in accordance with embodiments described herein, may be less than 50% (e.g., less than 40%, less than 35%, less than 30%, less than 25%, less than 20%, less than 15%, less than 10%) for compositions where metal oxide nanoparticles are initially provided at a weight percentage of greater than 20% (e.g., greater than 30%, greater than 35%, greater than 40%, greater than 50%, greater than 60%, greater than 70%, greater than 80%, greater than 90%, greater than 95%). It is believed that because the sol-gel precursor already has crystalline properties along with the metal oxide, upon calcination, there is an overall reduction in shrinkage of the nanoparticle composition that would otherwise occur.

Patterned nanostructures described herein may be made into a three-dimensional (3D) patterned structure having one or more features each having a characteristic feature size (e.g., width, spacing, diameter, radius, ridge dimension, pitch, etc.). For example, a first patterned nanostructure layer having a first feature size below 5 microns may be formed separately, or in combination with, a second patterned nanostructure layer having a second feature size below 5 microns. The second patterned nanostructure layer may be placed over the first patterned nanostructure layer. Both the first and second patterned nanostructure layers may include nanoparticles having an average particle size of less than 100 nm. Any suitable number of patterned nanostructure layers may be formed and incorporated into a stack of patterned nanostructure layers where each layer has its own pattern. In some embodiments, a patterned nanostructure layer may be prepared in a manner so as to be releasable from the substrate upon which it was formed. For example, an intermediate layer may be employed between the substrate and the nanoparticle composition. Accordingly, the patterned nanostructure layer may be joined with other layers so as to form a 3D nanostructure.

In some embodiments, UV-assisted NIL is employed. UV-assisted NIL may confer a number of advantages, such as low temperature fabrication of predominantly crystalline structures, the ability to directly pattern structures having a feature size as small as the dimension of the nanoparticle being patterned, the ability to rapidly pattern large areas in a scalable manner, the ability to stack patterned structures to form 3D nanostructured composites, and others.

The present disclosure describes compositions and methods for patterning nanocomposite films or coatings containing nanoparticles and UV curable, thermally curable and/or chemically cross-linked materials to generate patterned nanostructures. Various compositions including a variety of nanoparticles and curable materials are discussed herein and may be successfully patterned into nanostructures with sub-500 nm feature size and larger dimensions through the use of nanoimprint lithography, nanoinscribing lithography, photolithography or variants of these techniques. These compositions can be either aqueous or organic solvent based, which allows for the solvent to be chosen based on the desired application. Nanoparticles contemplated to be incorporated for use in forming patterned nanostructures include metal oxides, mixed metal oxides, metals, and/or other suitable materials, or combinations thereof.

In an embodiment, nanoparticles are free of covalently bound ligands. For example, the nanoparticles are non-functionalized. The nanoparticles can be dielectric, semiconducting or conducting. The nanostructures can be comprised of one or more compositions of nanoparticles and one or more sizes of nanoparticles. The coating solution that includes the nanoparticle composition may contain dopants, functional additives, functional polymers, metal oxide precursors or sols, or organics that persist throughout or on the structure.

In some embodiments, layers containing the patterned nanoparticles can be stacked in any suitable manner. For instance, free standing patterned nanostructures can be released from a support structure as patterned nanostructure layers, and the patterned nanostructure layers may, in turn, be stacked to create 3D nanostructures. An advantage of this approach, relative to the current state of the art, is the ability to create nanostructures having sub-wavelength dimensions, which allow for controlled manipulation of various wavelengths of light and electromagnetic waves.

Nanoparticles having dimensions (e.g., width, diameter, etc.) less than 100 nm may exhibit similar or different properties from those of the bulk material. As dimensions become quite small, the properties of the nanoparticles can be size dependent. For instance, small nanoparticles can exhibit a number of interesting properties, such as catalytic, magnetic, mechanical, electrical and optical properties, that are either not observed in their bulk material counterparts or exhibit enhancement when isolated as a nanoparticle. To take advantage of the properties of nanoparticles, nanocomposite materials may be developed to incorporate nanoparticles into various host matrices such as polymers, block copolymers and metal oxides. In some embodiments, the plurality of nanoparticles of a nanoparticle composition may have an average particle size (e.g., width, diameter) of less than 100 nm, less than 90 nm, less than 80 nm, less than 70 nm, less than 60 nm, less than 50 nm, less than 40 nm, less than 30 nm, less than 20 nm, less than 10 nm, less than 5 nm, or less than 2 nm.

Using methods described herein (e.g., NIL, NIS, photolithography), the patterned nanostructure comprising the nanoparticle composition has a feature size of less than 5 microns, less than 4 microns, less than 3 microns, less than 2 microns, less than 1 micron, less than 500 nm, less than 300 nm, less than 100 nm, less than 50 nm, or less than 20 nm. For instance, nanoparticle compositions may have features that are columnar in cross section (e.g., according to a master mold having a particular line width, depth and pitch). Such features may have a width or height of 10-1000 nm, 50-500 nm, 100-300 nm, and/or may also exhibit a high aspect ratio, for example, 2:1, 2.5:1, 3:1, 3.5:1, 4:1, 4.5:1, 5:1, 6:1, 7:1, 8:1, 9:1, 10:1, or higher. It can be appreciated that the patterned nanostructure may include any suitable shape or geometric configuration, such as columns, rows, striped, complex/irregular shapes, arcuate or polygonal patterns and having appropriate dimensions.

Nanoparticle compositions may include a binder material that can be derived, for example, from any suitable curable monomers, oligomers, polymers, metal oxide precursors, metal oxide sols, sol-gel precursors and/or other reactive or crosslinkable media. Nanoparticles may be in contact with the binder material. For example, the binder material may be located between nanoparticles such that a majority of the nanoparticles are separated by the binder material. Depending on the preferred characteristics of the patterned nanostructure, the binder material may be an insulative or a conductive material.

In some embodiments, nanoparticle compositions can be processed using photolithography to induce regioselective reaction of the nanoparticles or the binder material such that certain regions of the composition can be removed by subsequent steps including photolithographic development in water or other solvent. In some embodiments, combinations of photolithography and imprint lithography can be employed. In some embodiments, reactive media can be provided as functional groups on the nanoparticles or as ligands bound to the nanoparticles. The nanoparticle composition may include dopants, surface modifiers, fullerenes or other functional materials that influence the behavior and characteristics of the nanostructures.

To incorporate nanoparticles into polymers, two general approaches may be considered—in-situ formation of nanoparticles with polymers; and/or blending crystalline nanoparticles with polymers. The fabrication of composites from in-situ formation of nanoparticles can be accomplished by physical or chemical methods. The use of in-situ reactions may often involve harsh processing conditions and/or involve post-composite formation processing steps to generate a desired nanoparticle.

Nanoparticle compositions may be prepared from pre-synthesized nanoparticles and, in some cases, may remove a number of disadvantages associated with in-situ nanoparticle generation. For example, synthesis of the nanoparticle may be performed in a separate reaction prior to incorporation into the overall system. The separation of nanoparticle formation from composition formation may allow for the nanoparticle to retain advantageous properties, such as crystallinity, without performing additional post-composition formation steps, such as crystallization procedures of either high-temperature or hydrothermal treatments.

In taking advantage of various properties afforded to nanoparticle compositions (e.g., nanoparticle polymer composites), such as conductivity and refractive index characteristics, the compositions may be patterned in particular areas and geometries. NIL offers the capability of providing nanometer resolution, large area patterning and favorable throughput. Two general methods of imprint lithography may be used to produce nanoscale features—Thermal nanoimprint lithography (TNIL) and ultraviolet-assisted nanoimprint lithography (UV-NIL).

Nanoimprint lithography, generally, is a method of fabricating nanometer scale patterns at low cost, high throughput and high resolution. NIL creates patterns by using a mold to mechanically deform a softer imprint resist (e.g., a nanoparticle composition coated on to the surface of a substrate) and exposing the imprint resist to subsequent processes (e.g., heat/UV curing). It can be appreciated that molds may exhibit characteristics that are comprised of but not limited to rigid or flexible characteristics. While TNIL and UV-NIL are suitable methods for patterning a nanoparticle composition, other methods may be used, in addition to methods other than imprint lithography.

As shown in FIG. 1A, in UV-NIL, for some embodiments, a photocrosslinkable resin (e.g., a nanoparticle composition) is formed on or applied to a surface of a substrate. A transparent mold is brought into contact with the photocrosslinkable resin, mechanically deforming the resin so as to conform to the shape of the mold. While the mold is maintained on the photocrosslinkable resin, the resin is exposed to UV radiation resulting in the resin being crosslinked. After the resin is crosslinked, the mold is removed, leaving the resin having an appropriately patterned structure.

Figure 1B:
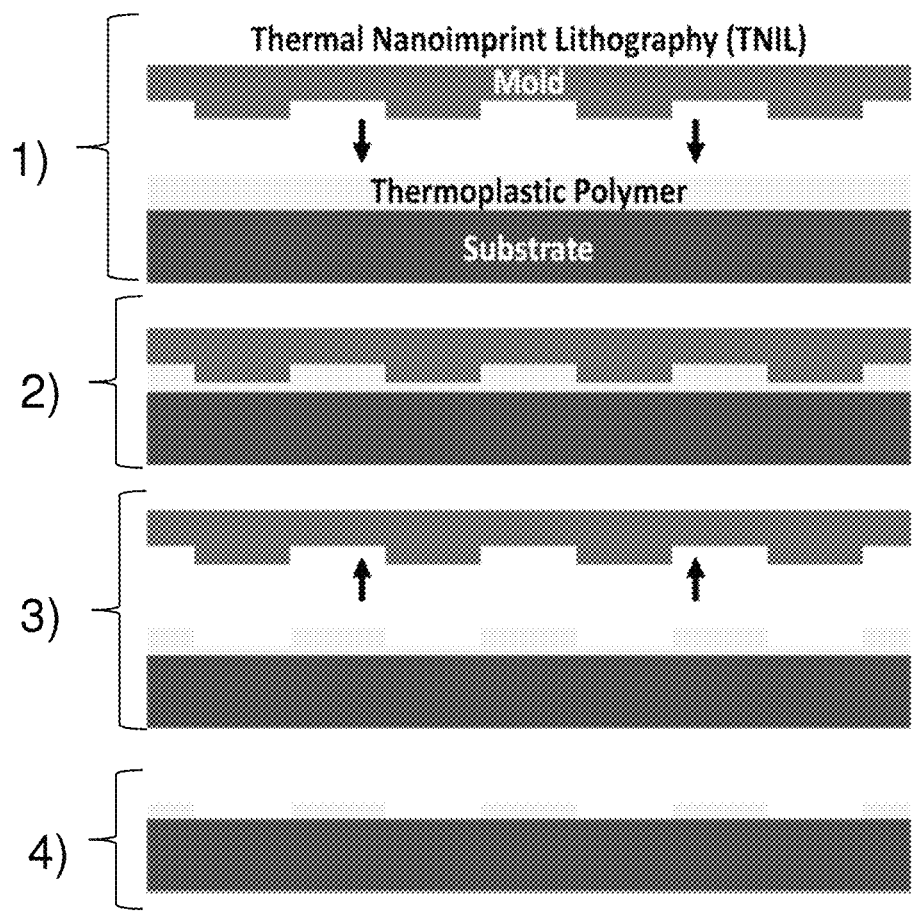
FIG. 1B shows processing steps for thermal nanoimprint lithography.

FIG. 1B illustrates an example of thermal nanoimprint lithography, which is similar to UV-NIL except that heat is used to cure the resin (e.g., a nanoparticle composition) rather than UV radiation. As shown in the example, a thermal (curable) composition is formed on a substrate. An appropriate mold having a suitable pattern is brought into contact with the thermal (curable) composition and the composition is heat cured.

Figure 1C:
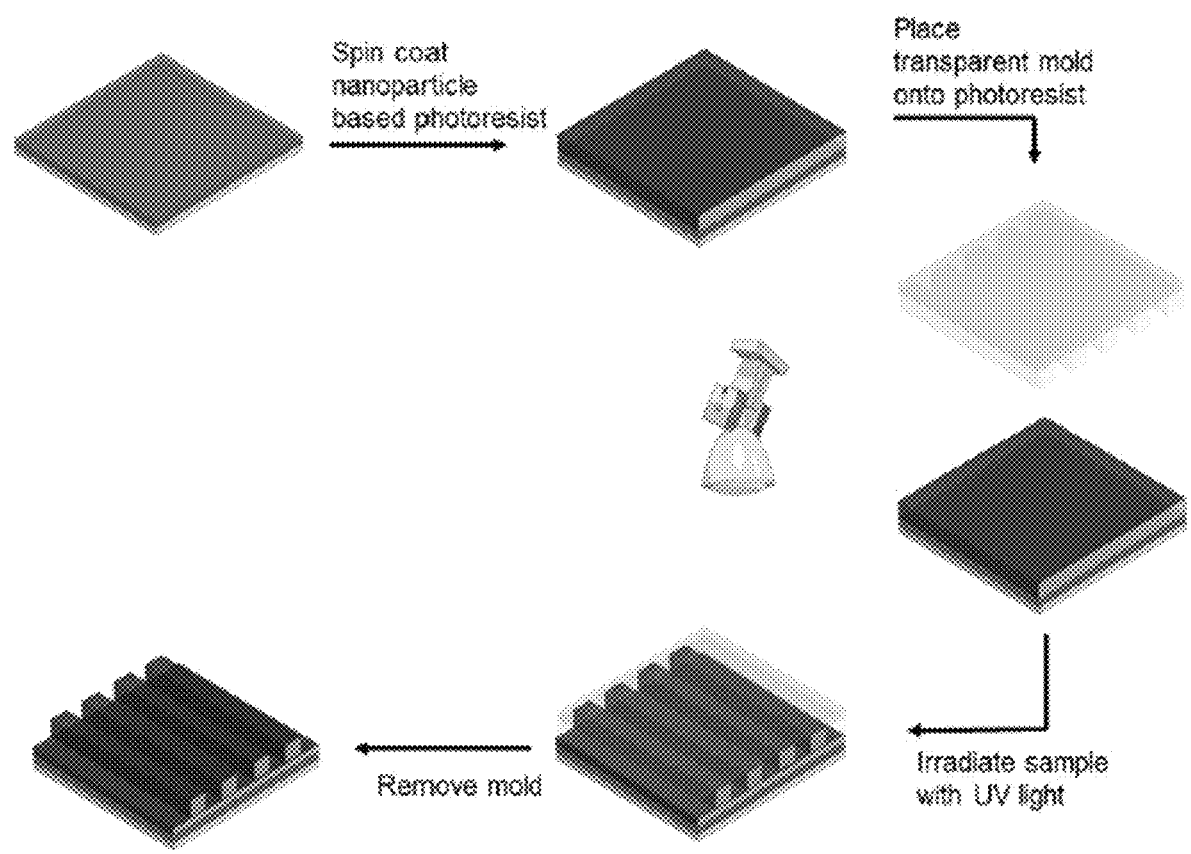
FIG. 1C shows a schematic for ultraviolet-assisted nanoimprint lithography.
Figure 2A:
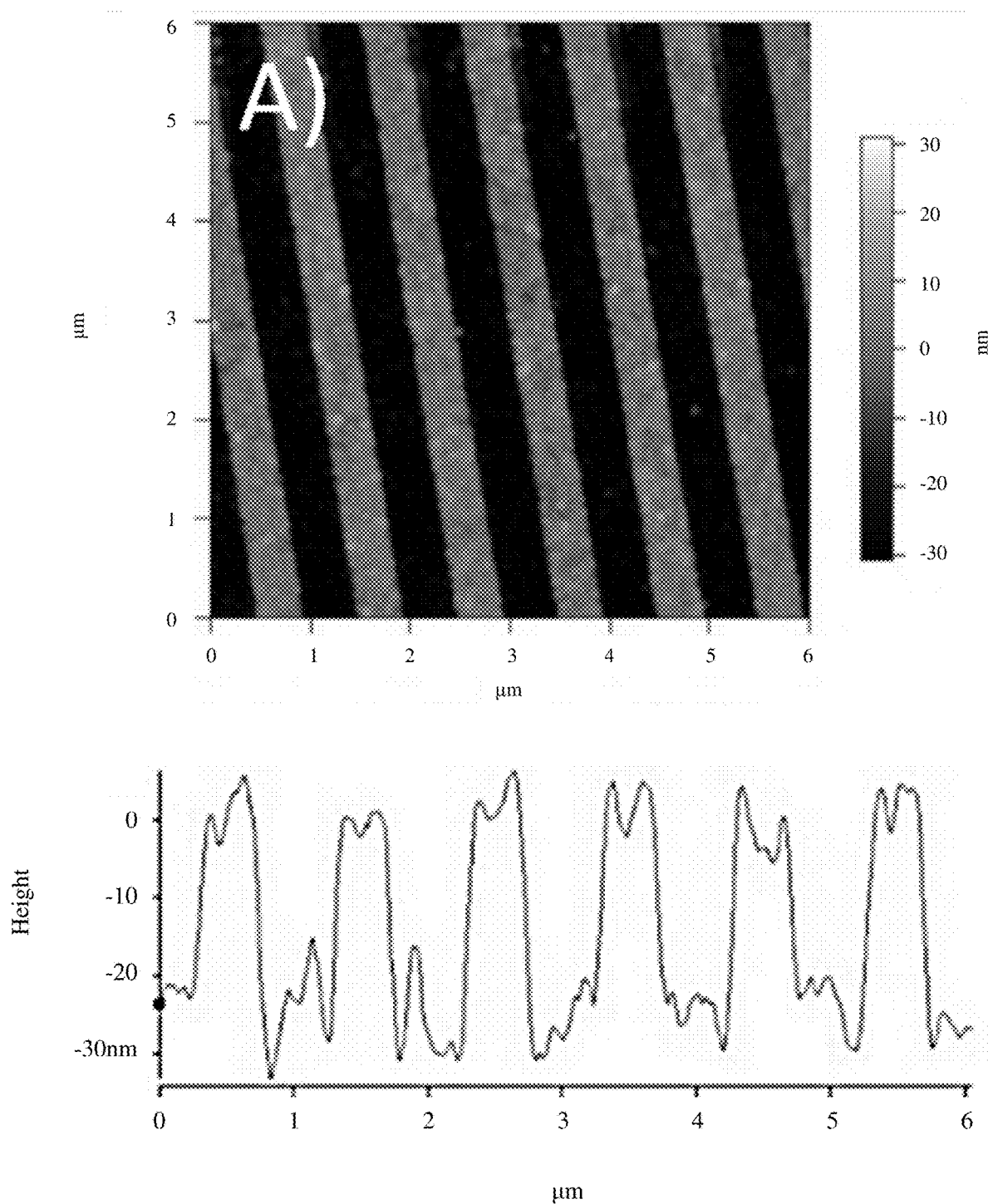
FIG. 2 illustrates atomic force microscope (AFM) images of patterned nanoparticle structures having a line pattern in accordance with some examples.
Figure 2B:
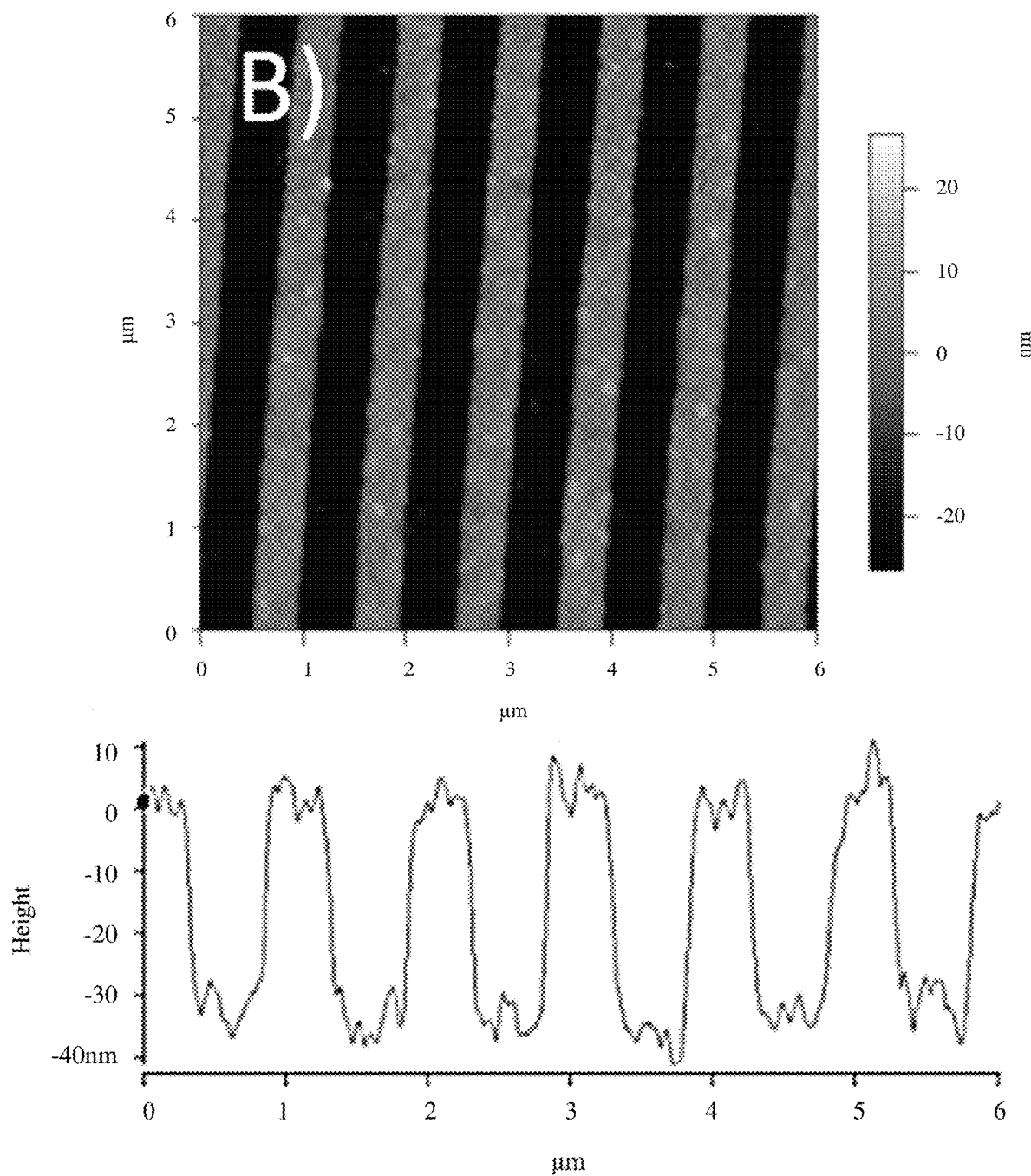
Figure 2D:
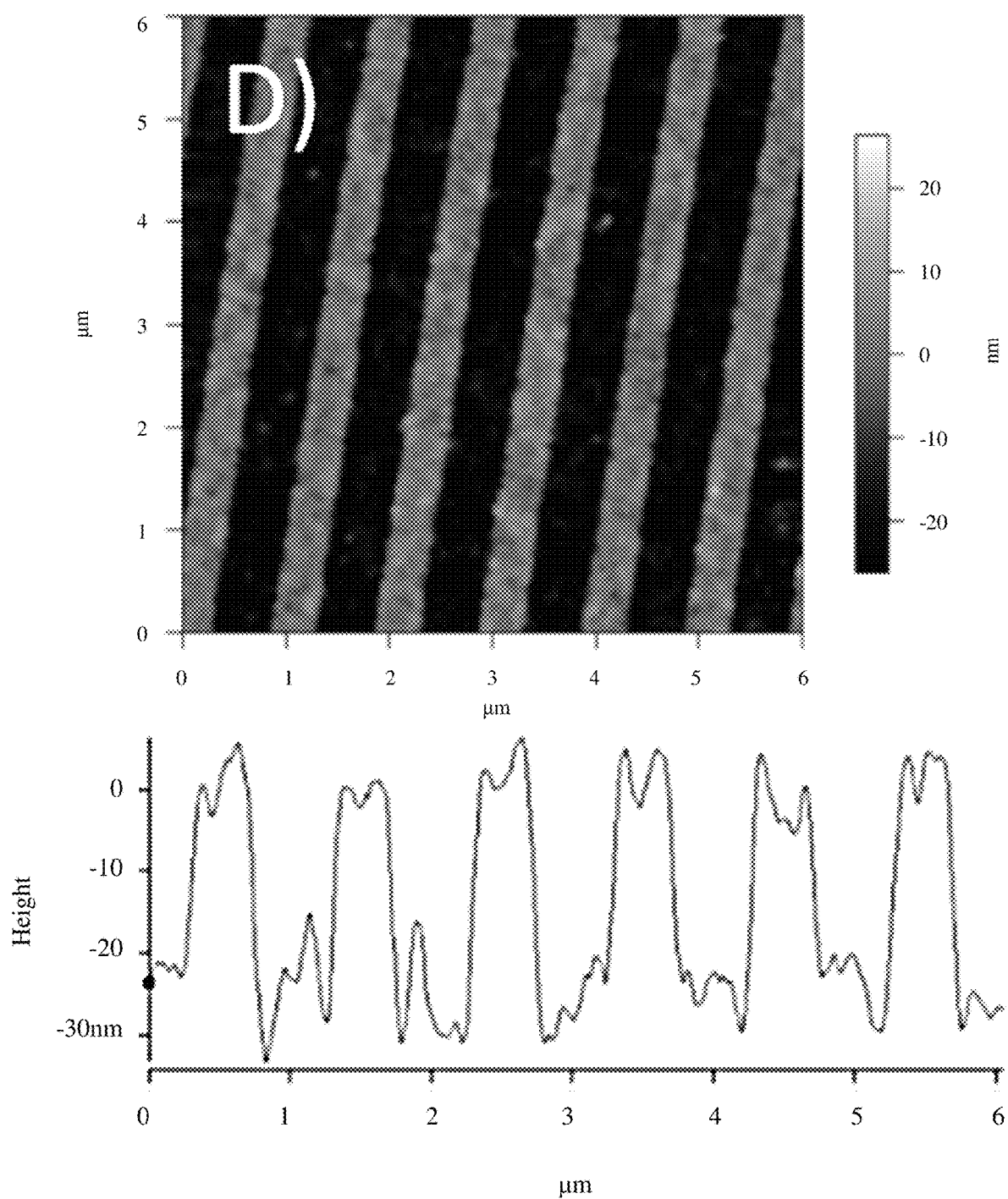
Figure 2E:
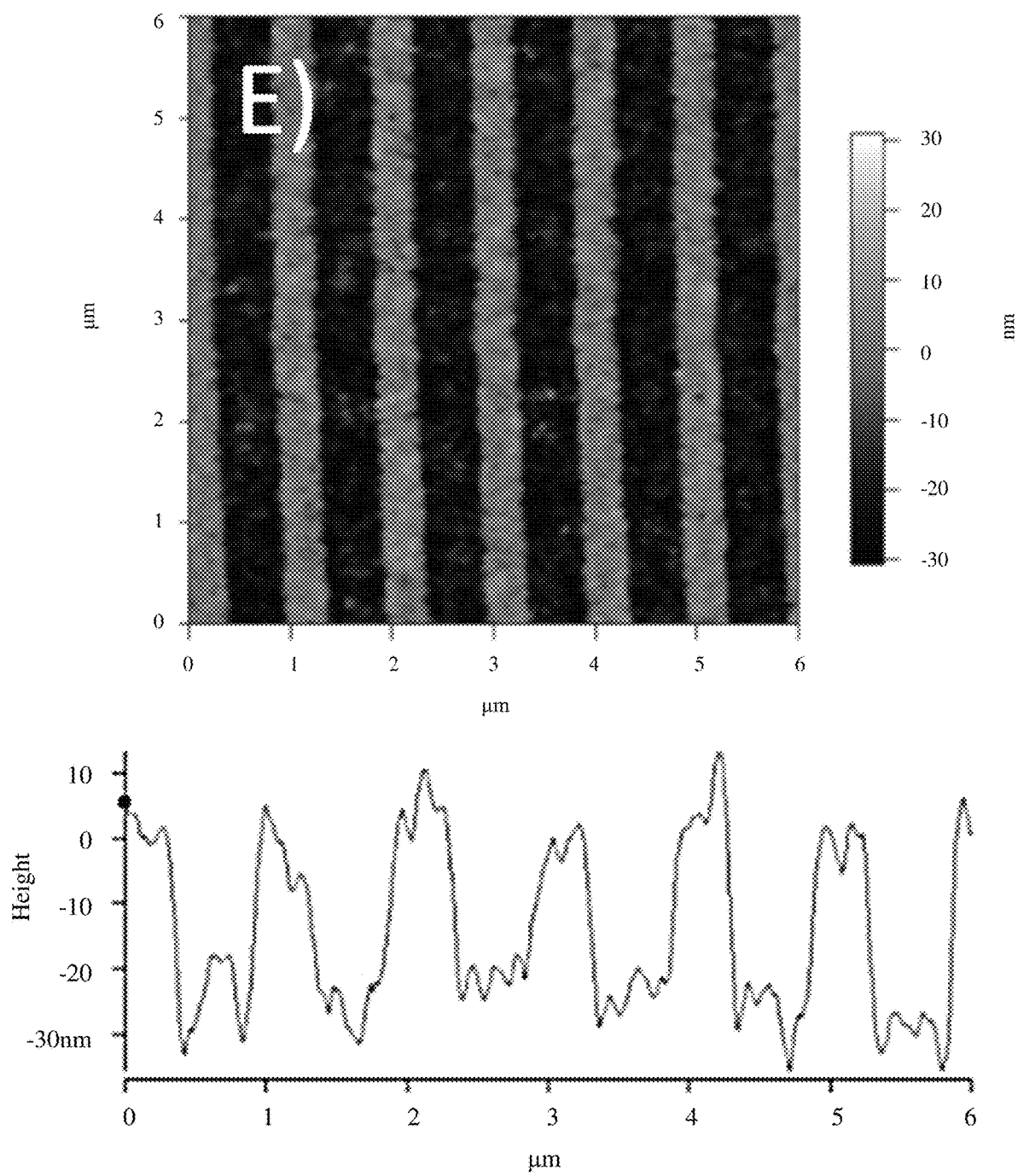
Figure 2F:
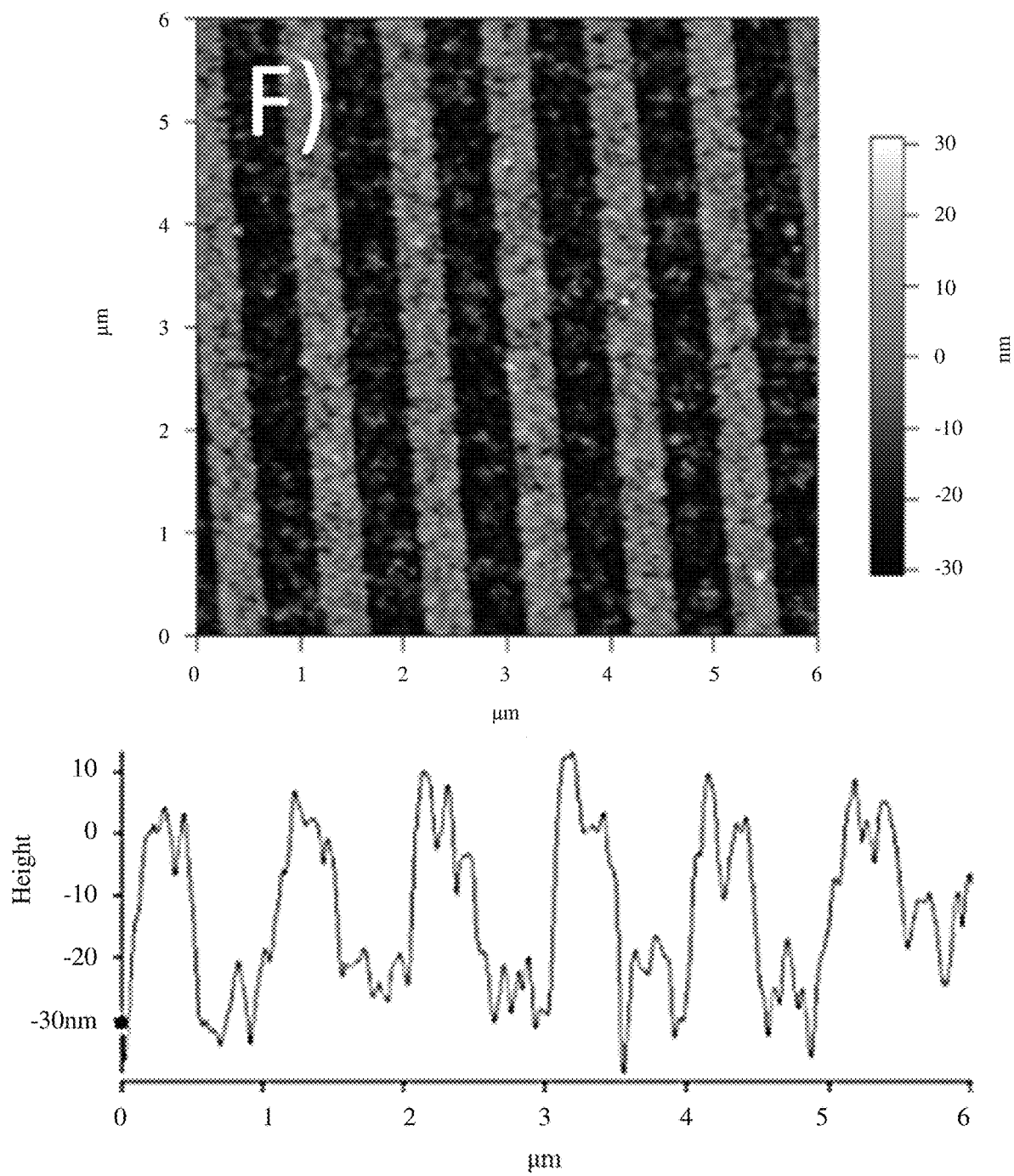

FIG. 1C shows a schematic of an example process for patterning a nanoparticle composite using solvent assisted UV-NIL. Here, a nanoparticle composition is spin coated as a photoresist on to a substrate. A transparent mold is placed over and on to the nanoparticle composition. When the mold is firmly situated so that the nanoparticle composition conforms to the shape of the mold, the system is irradiated with UV light allowing for the nanoparticle composition to cure. Once the nanoparticle composition is fully cured, the mold is removed, and the patterned nanoparticle composition remains for further processing and use.

In some embodiments, nanoparticle compositions are manipulated to form a patterned nanostructure by exposing the nanoparticle composition to a temperature of less than 200 C, less than 150 C, less than 100 C, less than 50 C, or room temperature. In some embodiments, in forming the patterned nanostructure, the nanoparticle composition is exposed to a temperature no greater than room temperature, no greater than 30 C, no greater than 40 C, no greater than 50 C, no greater than 100 C, no greater than 150 C, no greater than 200 C, no greater than 250 C, no greater than 300 C, no greater than 350 C and no greater than further temperatures in 50 C increments up to 2000 C. For example, a patterned nanostructure may be formed from nanoparticles without a step of annealing or sintering of the nanoparticles.

Alternatively, nanoinscribing (NIS) lithography may be used, which relies on site-specific plastic deformation of the underlying composition (e.g., at slightly elevated pressures) through contact with a relatively stiffer mold to yield the patterned nanostructure. In some cases, nanoinscribing involves a mold having an appropriate pattern of channels that are dragged through the nanoparticle composition so as to form a suitable pattern in the composition itself. The nanoparticle composition with the pattern inscribed therein is then appropriately cured. NIS provides the ability to pattern continuous nanostructures of thin films of metals, metal oxides, and/or functional polymers at room temperature or elevated temperatures via localized heating. In some embodiments, NIS, NIL or any other suitable technique may be used to generate patterned nanostructures, which may have feature sizes smaller than 500 nm, in nanostructures including, for example, metal oxide, mixed metal oxide, carbonaceous nanoparticles including fullerenes and graphene, metal nanoparticles, and/or combinations thereof.

Photolithography may also be used where, essentially, a portion of the nanoparticle composition is removed so as to form the patterned nanostructure. Photolithography is a subtractive process where, in some embodiments, a photoresist is applied over the nanoparticle composition coated on the substrate and a mask is applied over the photoresist. The system is then exposed to an appropriate amount of radiation (e.g., UV light) distributed toward the photoresist according to the mask pattern and the portion of the photoresist that is exposed to the radiation is removed. Through an appropriate etching and removal process, the nanoparticle composition is then suitably patterned. In some embodiments, using photolithography to fabricate the patterned nanostructures may involve the nanoparticle composition itself being used as a photoresist.

In some embodiments, during curing and/or crystallization, the nanoparticle composition is selectively heated due to exposure to radiation originating from an optical pulse source. For instance, the surface of the nanoparticle composition may be selectively heated (e.g., between 800-900

C) without substantial heating occurring to the bulk of the composition. Such selective heating may be useful when fabricating crystalline nanoparticle films on a substrate where it may be undesirable to expose the underlying substrate to excessive heat (e.g., a flexible polymeric substrate).

Selective heating may occur may any suitable method. In some embodiments, surface selective heating may occur through short, high-energy pulses, such as those that arise from an optical pulsed flash lamp (e.g., Xenon emission source) that emits radiation ranging from ultraviolet to near-infrared wavelengths. The flash sequence of the pulsed source may be tuned so as to adjust the amount of heat and the degree of penetration to which the nanoparticle composition is exposed. A generalized approach is provided for patterning a diverse array of nanoparticle and nanoparticle compositions (e.g., single or composite compositions) which may include, for example, crystalline metal oxide nanoparticles, mixed metal oxide nanoparticles and metal oxide nanoparticles/metal oxide precursor compositions. Such nanoparticle compositions may exhibit favorable properties, such as good mechanical integrity, high optical transparency, tunable refractive indices, good electrical conductivity, good thermal conductivity, and others. In some embodiments, the nanoparticles may be amorphous. In some embodiments, the nanoparticles can be metals, semiconductors or carbonaceous compositions including fullerenes, graphene, and graphene oxides. Such nanoparticle compositions are capable of being patterned by UV-NIL, NIS, or any other suitable technique.

Nanoparticle compositions (e.g., nanoparticle polymer composites) for patterning via UV-NIL may be aqueous or non-aqueous based. In some embodiments, nanoparticle compositions include nanoparticles mixed with a binder material. For example, nanoparticle compositions may comprise water and/or a polar aprotic diluent and a polar protic diluent, a colloidal inorganic oxide, and/or an inorganic precursor, and/or a thermally curable, and/or UV curable, and/or chemically crosslinkable photoresist.

Nanoparticles may initially be obtained as a solution with a predominantly aqueous solvent (e.g., greater than 90% by weight water). Though, the high degree of polarity of the water may give rise to a surface tension that may interfere with the quality of formation of the patterned nanostructure (e.g., the patterned nanostructures are still able to form, but not as precisely when the surface tension of the solvent is so high). Accordingly, in some embodiments, the initial nanoparticle composition may be subject to a solvent exchange where the water is essentially replaced with a different solvent (e.g., alcohol, organic solvent, etc.) that exhibits a less degree of polarity than water, reducing the surface tension of the overall composition. For example, preparing the nanoparticle composition may involve exchanging a first aqueous solvent comprising greater than 90% by weight water with a second generally non-aqueous solvent comprising less than 10% by weight water. A small amount of water may still be present after solvent exchange has occurred.

Such a non-aqueous solvent may include any suitable combination of an aprotic solvent (e.g., N-methyl pyrrolidone, dimethyl sulfoxide, dimethylformamide, dioxane and hexamethylphosphorotriamide, tetrahydrofuran), a protic solvent (e.g., alcohols, methanol, ethanol, formic acid, ammonia, etc.), or any other suitable solvent which exhibits less polarity than water. Aprotic solvents are solvents that are able to dissolve ions, yet, for the most part, lack an acidic hydrogen or a labile proton. Aprotic solvents generally do not undergo hydrogen bonding and are able to stabilize ions. Protic solvents are solvents that have a hydrogen atom bound to an oxygen (e.g., hydroxyl group) or a nitrogen (e.g., amine group) and are able to dissociate and donate a proton. Protic solvents generally undergo hydrogen bonding and are able to stabilize ions.

In some embodiments, patterned nanostructures may include nanoparticles, crosslinked nanoparticles, and nanoparticle composite systems. In some embodiments, patterned nanostructures may be formed from metal oxide and mixed metal oxide systems with nanoparticle composite systems ranging from 10 wt. % to 100 wt. % with a binder material such as a UV curable monomer, sol-gel precursor, and/or prepolymer material that is capable of undergoing UV-NIL.

The concentration of nanoparticles in the nanoparticle composition can vary by any suitable amount. For example, the nanoparticles may comprise greater than or equal to 50% by weight, greater than or equal to 60% by weight, greater than or equal to 70% by weight, greater than or equal to 80% by weight, greater than or equal to 90% by weight, or 100% by weight of the patterned nanostructure or of the nanoparticle composition. The nanoparticles may also comprise less than or equal to 50% by weight, of the patterned nanostructure or of the nanoparticle composition. The concentration of binder material in the nanoparticle composition may vary appropriately. In some embodiments, the binder material may comprise less than or equal to 50% by weight, less than or equal to 40% by weight, less than or equal to 30% by weight, less than or equal to 20% by weight, less than or equal to 10% by weight, or 0% by weight of the patterned nanostructure or of the nanoparticle composition. The binder material may also comprise greater than or equal to 50% by weight, of the patterned nanostructure or of the nanoparticle composition.

In some embodiments, the binder material of the nanoparticle composition may include an optical adhesive material. An optical adhesive may be transparent or translucent. In some cases, when an optical adhesive is exposed to UV light, the material cures (e.g., crosslinks). The relative concentration of nanoparticle and optical adhesive material, the type of nanoparticle, and the porosity of the nanoparticle composition may ultimately affect the refractive index of the patterned nanostructure. For example, when the nanoparticle concentration of the nanoparticle composition is greater, the refractive index of the patterned nanostructure may also be greater. Accordingly, the refractive index of patterned nanostructures comprising nanoparticles described herein may be suitably tuned. In some embodiments, the refractive index of patterned nanostructures may range between about 1.0 and about 5.0, between about 1.0 and about 3.0, between about 1.0 and about 1.5, between about 1.1 and about 1.7, or between 1.5 and 2.5. Optical adhesive materials may be insulative, semi-conductive or conductive in nature.

Patterned nanostructures may be fabricated as three-dimensional patterned nanostructures, for example, provided as layers in a stacked arrangement. In some embodiments, such a stacked arrangement may include multiple patterned nanostructure layers where each of the patterned nanostructure layers has a particular refractive index. The refractive index of each of the patterned nanostructure layers may be tuned in accordance with embodiments described herein, for example, based on the overall composition (e.g., relative weight/volume percentage of ingredients) of the layer.

In some embodiments, patterned nanostructure layers of a three-dimensional stack may have refractive indices such that the stacked nanostructure exhibits a gradient of refractive indices. For example, one end of a three-dimensional stack of patterned nanostructure layers may exhibit a relatively low refractive index (e.g., 1.1-1.5) and an opposing end of the three-dimensional stack may exhibit a relatively high refractive index (e.g., 1.5-4.0, 1.5-2.0, 2.0-3.0). Accordingly, patterned nanostructure layers positioned in between the opposing ends may have refractive indices that correspond with their relative position within the stack so as to result in a generally smooth refractive index gradient across the three-dimensional nanostructure. A material having a refractive index gradient, in general, facilitates light penetration further into the material. In some embodiments, a stacked nanostructure having a refractive index gradient may be used as a light trapping device.

Alternatively, refractive indices of patterned nanostructure layers of a three-dimensional stack may be configured such that the stacked nanostructure exhibits an alternating arrangement of refractive indices. For instance, in three-dimensional nanostructure stack, patterned nanostructure layers having a relatively low refractive index (e.g., 1.1-1.5) may be positioned so as to alternate with patterned nanostructure layers having a relatively high refractive index (e.g., 1.5-4.0, 1.5-2.0, 2.0-3.0). A material having layers that have refractive indices that alternate between relatively high and relatively low values will exhibit generally reflective properties. Thus, in some embodiments, a stacked nanostructure having refractive indices that are positioned in an alternating arrangement between high and low values may be used as a light reflecting device.

Alternatively, nanoparticle compositions may be patterned with the addition of a precursor, for example, comprising metal oxide, sol-gel or sol as a dopant or crosslinker. These precursors (e.g., sol-gel precursor) may be similar to or different from the inorganic nanoparticle being patterned. In some embodiments, the binder material may comprise a sol-gel precursor material, such as a suitable metal oxide, metal alkoxide or other material that acts as a precursor for producing a gel network. Non-limiting examples of sol-gel precursors include cerium sol-gel precursors (e.g., cerium (III) nitrate hexahydrate) gadolinia sol-gel precursors (e.g., gadolinium (III) nitrate hexahydrate), zirconia sol-gel precursors (e.g., zirconium (IV) (isopropoxide)$_n$(acetyl acetonate)$_m$), and others.

Figure 27:
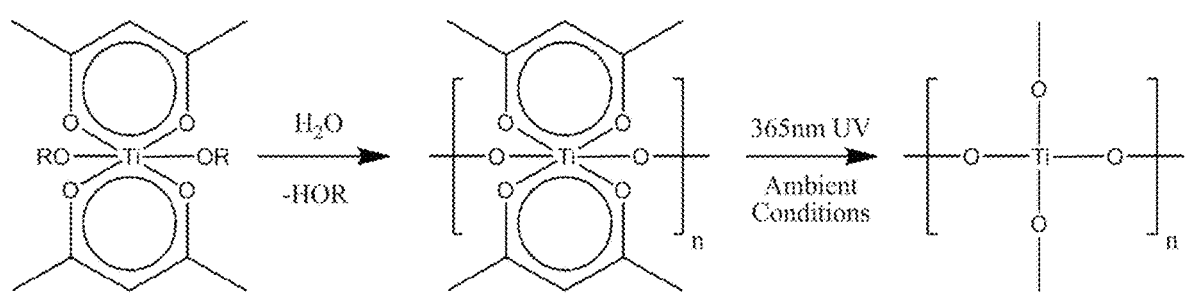
FIG. 27 illustrates a crosslinking mechanism involved in preparing a patterned nanoparticle structure in accordance with some examples.

For instance, when it is preferred that charge transfer be permitted between interfaces of the nanoparticles, when cured, the binder material may exhibit conductive properties. That is, the insulative polymeric features of the system may be effectively replaced by a conductive phase. The composition is then exposed to UV radiation so as to cure the binder material, yielding a conductive phase. FIG. 27 depicts an example of a mechanism where a sol-gel precursor material (or any other appropriate material) mixed with nanoparticles undergoes a step of hydrolysis and cross-linking.

Any combination of nanoparticles may be incorporated in the nanoparticle composition from which the patterned nanostructure is formed. Non-limiting examples of such nanoparticle combinations include ruthenium dioxide ($RuO_2$) and titanium dioxide ($TiO_2$), iridium dioxide ($IrO_2$) and $TiO_2$, zirconium dioxide ($ZrO_2$), hafnium dioxide ($HfO_2$), zinc oxide (ZnO), silicon (Si), barium titanate ($BaTiO_3$), strontium titanate (SrTiO3), aluminum oxide ($Al_2O_3$) and yttrium oxide ($Y_2O_3$), cerium oxide ($CeO_2$) and yttrium oxide stabilized zirconium oxide (YSZ), gadolinia doped cerium dioxide (GDC), indium oxide ($In_2O_3$) doped with tin oxide ($SnO_2$) (indium tin oxide), antimony oxide $Sb_2O_3$) doped with tin oxide ($SnO_2$ (antimony tin oxide), $Al_2O_3$ doped with ZnO (antimony zinc oxide), iron oxide ($Fe_2O_3$, $Fe_3O_4$) and iron platinum (FePt), and metal chalcogenides, such as: lead sulfide (PbS), gallium phosphide (GaP), indium phosphide (InP), lead selenide (PbSe), lead telluride (PbTe), amongst others. For example, $TiO_2$ particles may be initially obtained in a crystalline state. In some embodiments, nanoparticle compositions may include mixtures or dissimilar nanoparticles with dopants including dyes, fullerenes, infrared emitting nanoparticle (e.g., $CeF_3$: Yb—Er) or quantum dots. Another embodiment includes patterning nanoparticles or mixtures of dissimilar nanoparticles and/or metal oxide precursors or sols, and/or dopants using NIS. In some embodiments, nanoparticles comprise carbonaceous-based materials, such as fullerenes, mesoporous carbon nanoparticles, thermally exfoliated graphite, carbon nanotubes, diamond nanoparticles, graphene, and other forms of carbonaceous materials. Other embodiments include the selective exposure of the nanoparticles and mixtures of nanoparticles to thermal, hydrothermal, laser and PulseForge annealing procedures.

Nanoparticle compositions may be applied to substrates in a manner where such compositions may be optionally removable or releasable from the respective substrate once the patterned nanostructure is formed. Accordingly, free-standing patterned nanostructured layers may be formed. As a result, 3D fabrication of patterned nanostructures comprising suitable nanoparticle mixtures with optional dopants/additives may occur by subsequent layering of the patterned nanostructures in a stacked arrangement and/or at various angles. Any appropriate number of patterned nanostructure layers may be arranged (e.g., stacked, placed side by side, overlapping, etc.) according to any suitable configuration to yield a 3D patterned nanostructure. For example, such 3D patterned nanostructures may be arranged in a way that manipulates electromagnetic radiation in a desirable manner (e.g., light trapping, light reflecting, etc.).

Patterned nanostructure layers may be free-standing films or films supported by permanent or sacrificial substrates. 3D layered structures may include layers of the patterned nanostructures comprising nanoparticle compositions cured on substrates as well as stacked layers of patterned nanostructures that have been released from their substrates post-cured and appropriately transferred to create the 3D layered assembly or combination of layers with or without substrates. Substrates may be released prior to the transfer of the patterned nanostructure layers, during the transfer of the patterned nanostructure layers, or after the transfer of the patterned nanostructure layers.

Methods of release of a patterned nanostructure layer from a substrate include but are not limited to use of an intermediate release layer bound to the substrate or a substrate with poor adhesion to the patterned composition, use of a sacrificial release layer that is removed during processing using solvents, use of a multi-layer release strategy based on orthogonal solvents, or removal of the release layer by use of thermal treatment or electromagnetic irradiation. For example, during fabrication, the nanoparticle composition may be applied directly to the surface of a substrate which, in some cases, may give rise to strong adhesion between the nanoparticle composition and the substrate once the patterned nanostructure is formed. However, in some embodiments, an intermediate layer is provided in between the substrate and the nanoparticle composition such that upon formation of the patterned nanostructure, the nanoparticle composition may be more easily released from the substrate than would otherwise be the case without the intermediate layer.

In some embodiments, patterned nanostructure layers are prepared using roll-to-roll manufacturing. For example, a substrate may be coated with a nanoparticle composition using slot die coating or any other suitable method and subsequently patterned using roll-to-roll UV-assisted nanoimprint lithography or roll-to-roll nanoinscribing. The nanoparticle composition can be applied as a coating to any suitable substrate such as glass, silicon and flexible substrates, such as polymers, metal foils, poly(ethylene terephthalate) (PET), poly(ethylene naphthalate) (PEN), amorphous glass, and polyimide. The ability to coat and pattern such nanoparticle compositions on flexible substrates (e.g., plastic) allows for the use of high throughput and continuous manufacturing capabilities such as roll-to-roll manufacturing. For example, the patterned mold may be provided as a roll in the shape of a wheel or other arcuate shape and the flexible substrate having a nanoparticle composition coated thereon may be placed in contact with and may move along the patterned mold in a continuous fashion. As the nanoparticle composition and substrate system moves continuously along the rotating patterned mold while in contact with the patterned mold, an appropriate amount of irradiation (e.g., electromagnetic radiation, heat, UV radiation) may be applied to the composition. Once the nanoparticle composition moves out of contact with the patterned mold, the patterned nanostructure is suitably cured and formed.

In some embodiments, patterned nanostructure layers may involve coating nanoparticle compositions on rigid substrates such as silicon wafers or glass or transparent conductive oxides. For example, patterned nanostructure layers may be prepared by a roll-to-plate manufacturing process where the substrate on which the nanoparticle composition is coated upon is provided as a plate, yet the patterned mold is provided as a roll, similar to the roll described above for roll-to-roll manufacturing. Accordingly, as the substrate moves continuously along the rotating patterned mold, the nanoparticle composition is appropriately cured. Once the nanoparticle composition comes out of contact with the patterned mold, the patterned nanostructure is formed.

The nanoparticles and/or the binder material of the patterned nanostructure may be treated in any suitable manner before or after final formation. For example, the nanoparticles may be treated to induce or increase their level of crystallinity. Such treatments can include thermal, hydrothermal processes, treatment with plasmas and UV irradiation. In some embodiments, the patterned nanostructure may be treated to remove organics. Such treatments can include thermal, hydrothermal processes, treatment with plasmas and UV irradiation.

In some embodiments, the patterned nanostructure may be further coated so as to reduce porosity within the structures or distribute materials within the pores or at the surface of the structures. Such processes may include but are not limited to atomic layer deposition, chemical vapor deposition, supercritical fluid deposition, electrodeposition, electroless depositions, surface modification, vapor phase infusion, liquid infusion, supercritical infusion, polymerization, surface induced polymerization, radical polymerization, electrochemical polymerization, sol gel chemistry, deposition of self-assembled monolayers, layer-by-layer depositions, chemical grafting at the surface, microwave induced grafting or polymerization, UV-induced reaction or polymerization, or other suitable processes.

Potential Applications

A number of non-limiting applications that certain embodiments related to the present disclosure are described below. Such applications and uses are merely exemplary and do not encompass the full scope of the invention.

Fabrication of Hybrid Photovoltaic Devices with Hierarchical Structure

Hybrid photovoltaic devices constructed from metal-oxide/polymer materials may require structuring of the active layer to increase efficiency. By structuring the active layer of hybrid photovoltaic devices, an increased amount of surface area may be realized, resulting in greater interfacing between the semiconducting materials as well as direct carrier pathways to the electrodes. Titanium dioxide ($TiO_2$), amongst other materials such as zinc oxide (ZnO), may be used as a metal oxide material for hybrid photovoltaic devices. Approaches described herein of patterning the active area of hybrid photovoltaic devices may rely on the patterning of inorganic nanoparticles, which are semiconducting and not covalently functionalized, with imprint lithography.

Through approaches in accordance with various embodiments, inorganic nanoparticles are capable of being crystalline, which may be required to obtain efficient hybrid photovoltaic devices, and does not require an additional high-temperature sintering process to obtain a suitable level of crystallinity of the inorganic material. The lack of a high-temperature sintering process requirement allows for embodiments described herein to be scaled to continuous manufacturing platforms, such as roll-to-roll (R2R) or roll-to-plate processing, as discussed above. Non-covalently functionalized inorganic nanoparticles are readily available as highly-loaded (≥20 wt. %) dispersions in water and are able to undergo a simple solvent exchange to solvents having a higher boiling point and lower polarity than water. To further enhance the efficiency of hybrid photovoltaic devices, dopants and/or dyes, either in the form of nanoparticles or small molecules, can be incorporated into the nanoparticle dispersion with ease.

Electrodes and Electrolytes for Solid Oxide Fuel Cells (SOFCs)

It is beneficial to reduce the overall structural dimension of solid oxide fuel cells (SOFCs) through microfabrication techniques. The term micro solid oxide fuel cell (μ-SOFCs) is often used when SOFCs are produced with microfabrication techniques. Such a reduction in magnitude has potential to achieve reduced ohmic and transport losses, increase the volumetric energy and power densities, improve the energy conversion efficiency, reduce the operation temperature and unlock new applications. There is also growing interest in developing well-defined, geometry controlled, nanostructured electrodes, such as cerium dioxide or ceria ($CeO_2$), and electrolyte materials, such as yttria-stablized zirconia (YSZ), to improve performance and provide electrodes for modeling of parameters such as oxygen reduction, diffusion length and nano-ionic effects. Patterning the interface created between the electrode and the electrolyte material in μ-SOFCs with nanoscopic features achievable with NIL may be performed.

Zirconium dioxide, or zirconia ($ZrO_2$), nanoparticles with various yttria ($Y_2O_3$) dopant levels, or YSZ nanoparticles, may be incorporated into nanoparticle compositions to create patterned nanostructures. $Y_2O_3$ dopant levels may range from 3 mol. % to 10 mol. %. The nanoparticles crystallite size ranges from 10-12 nm and are available as acidic aqueous dispersions. The substrate for SOFC will be a YSZ crystal and will be patterned with either $CeO_2$ or YSZ nanoparticles. Patterning of these materials may increase the area of the triple phase boundary line, which is where fuel may come into contact with the electrode and the electrolyte, which in this case is either patterned $CeO_2$ or YSZ nanoparticles.

Structuring of Transparent Conductive Oxide (TCO) Materials

Transparent conductive oxide (TCO) materials, such as indium doped tin oxide (ITO) and zinc oxide (ZnO), have been a reliable source of transparent electrodes due to high optical transparency and high electrical conductivities. Applications that utilize TCOs include displays, solar cells and organic light emitting diodes (OLEDs). To further increase the efficiencies of the applications mentioned above, the TCOs may require patterning into arbitrary structures to either increase surface area or to trap light. Approaches described herein for patterning nanoparticles will not only allow TCO materials to be patterned into desired geometries but will also allow the patterning approach to be applied to roll-to-roll manufacturing platforms for more affordable production of transparent electrodes.

Nanopatterned High Performance Lithium Ion Battery Anodes

For rechargeable lithium (Li) ion batteries to be effective for automobile and stationary storage applications, power density, cost and cycling lifetime should be improved. Increasing the storage capacity of anode materials through the incorporation of silicon has been studied. Silicon possesses the highest theoretical gravimetric and volumetric storage capacities ($Li_{15}Si_4 \approx 3579$ mA h/g, 8340 mA h/mL) and has been under study. The drawback of silicon as an anode material is the large volumetric expansion during cycling, which causes the anode to fracture and thus reduces electrical contact and subsequent performance. Nanoparticles of silicon may be better suited to accommodate the volume change than the bulk counterpart. However, due to the high surface energy of silicon, the nanomaterial will begin to aggregate through electrical sintering and result in reduced anode performance.

One way to reduce this electrical sintering is to use a mesoporous carbon nanoparticle in combination with phenol capped silicon nanoparticles. To additionally increase the surface area and, in turn, the lithium storage capacity, these mixed nanoparticle systems can be patterned with high aspect ratio features to be used as high performance lithium ion battery anodes. The nanostructured features will increase the surface area, which will yield higher intercalation of the lithium ions and overall higher storage capacities. This mixed particle system should reduce the drawbacks of silicon by itself, without sacrificing the lithium storage capacity and create lithium ion anodes with extended lifetimes.

Anti-Reflective Patterning and Coating

Anti-reflective coatings may be constructed through a multilayer coating that has a graded transition in refractive index that reduces the refractive index from air (n=1.0) to the substrate of interest ($n_{PET}$=1.57, $n_{Glass}$=1.52). However, through this approach a multilayer coating may be needed, whereas by patterning a nanoparticle composite with tunable refractive index, this process can be achieved with only one coating, which has a patterned nanostructure (e.g., nanoimprinted). Features of the patterned nanostructure may allow for a graded refractive index from the air to the substrate. Features that are used with anti-reflective coatings may be inspired by a moth's eye. Moth's use a non-close packed nipple nanostructure to reduce the reflectance of their eyes. These non-close packed nipples allow for a graded refractive index from 1.0 to the refractive index of the substrate, reducing the reflectance and in turn, increasing the transmittance. By forming a patterned nanostructure (e.g., via nanoimprinting) from the UV-sensitive nanoparticle composition, the reflectance of the coating can be significantly reduced when compared to the uncoated substrate.

The nanoparticles that will be utilized for these compositions are based on high refractive index metals and metal oxides that do not absorb or fluoresce in the visible spectrum. Some nanoparticles of interest are $TiO_2$, $CeO_2$, $ZrO_2$, indium tin oxide (ITO), and metal chalcogenides, such as: lead sulfide (PbS), gallium phosphide (GaP), indium phosphide (InP), lead selenide (PbSe), lead telluride (PbTe), etc. These nanoparticles may have particle sizes less than 40 nm, as well as the mean particle aggregate size will be less than this in order to be below the Rayleigh scattering limit. These nanoparticles may be combined with a 365 nm UV-sensitive photoresist in either a polar aprotic solvent or aqueous based composition. The $TiO_2$ nanoparticles have a tunable refractive index of 1.58 (neat photoresist) to 1.9 (for 90 wt % $TiO_2$ nanoparticles) at 800 nm. Once an appropriate mold or photoresist is made, the coating can be patterned (e.g., nanoimprinted) with a non-close packed array of different spacing to create anti-reflective coatings.

Creation of Metastructures and Metamaterials

Metamaterials are comprised of metals or dielectrics that are patterned at length scales below the operating wavelength of interest. These patterned materials are arranged in different geometries to yield responses to electromagnetic excitation that does not exist in nature. The alteration of the electromagnetic waves incident upon these engineered metamaterials can result in negative refraction, subwavelength imaging, and cloaking. However, these metamaterials are often limited to narrow bands of frequencies and the fabrication at large scales is difficult and tedious. Embodiments described herein can remedy the scalability problem by using a large scale manufacturing platform, roll-to-roll manufacturing. A solution processable metamaterial can be created by subsequent layering of patterned metal and/or dielectric nanoparticle free standing structures.

Creation of Photonic Bandgap Materials

Photonic bandgap materials may be created using vacuum processing techniques, interference lithography, or direct write techniques, all of which are limited to small scalability or low throughput or both. Aspects described herein enables a solution processable photonic bandgap structure by subsequent layering of patterned high refractive index free standing structures.

EXAMPLES

The following examples are intended to illustrate certain embodiments of the present invention, but are not to be construed as limiting and do not exemplify the full scope of the invention.

Materials

Metal oxide nanoparticles were obtained stabilized by either acid or base. Several different nanoparticle systems were employed, including $TiO_2$, $Fe_2O_3$, $CeO_2$ and $ZrO_2$. Norland optical adhesive 60 (NOA60) was obtained from Norland Products Inc. FIG. 26 shows the proposed chemical structure of NOA60. Poly(acrylic acid) (PAA, 1800 g/mol), poly(vinyl alcohol) (PVOH, Mowiol 4-88, Mowiol 40-88) and acetyl acetone (AcAc) ReagentPlus® 99% were obtained from Sigma-Aldrich. Bimodal polystyrene (PS, 45,000 g/mol) was obtained from Scientific polymers. Methanol (MeOH) and N-methyl pyrrolidone (NMP) were obtained from Fisher Scientific. Titanium diisopropoxide bis(acetylacetonate), 70%, solution in isopropanol and (heptadecafluoro-1,1,2,2-tetrahydrodecyl)dimethylchlorosilane were obtained from Gelest. Sylgard 184 was obtained from Ellsworth Adhesives. Anatase and rutile titanium dioxide nanoparticles were obtained as aqueous dispersions from a number of vendors, including Nanostructured and Amorphous Materials, Inc., U.S. Research Nanomaterials, Inc. and Evonik Industries, Inc. Cerium dioxide dispersions were obtained as an acidic aqueous dispersion from Nyacol Nano Technologies, Inc. Zirconium dioxide nanoparticles were obtained as an acidic aqueous dispersion from Nyacol Nano Technologies, Inc. and MEL Chemical, Inc. Yttria-stabilized zirconium (YSZ) dioxide nanoparticles were obtained as acidic dispersions in different yttria compositions from MEL Chemicals, Inc.

Soft Mold Fabrication Preparation

Molds were fabricated from silicon gratings with dimensions ranging from 100 nm to 800 nm line widths, 100 nm to 500 nm depths and 500 nm to 1600 nm pitch. These silicon master molds were initially made hydrophobic by applying a self-assembled monolayer to reduce adhesion between the mold and silicon. To react the self-assembled monolayer with the silicon master mold, the mold is first treated with oxygen plasma, then a gas phase reaction of (heptadecafluoro-1,1,2,2-tetrahydrodecyl)dimethylchlorosilane occurs at 80 C for 24 hours. Once the silicon molds were treated, silicone replicas were created. The silicone used was Slygard 184 with a 1:10 ratio of curing agent to base. Once the silicone was well mixed and degassed, the silicon master mold was replicated by thermally curing the silicone at 70 C for 3 hours.

Example 1: Solvent Exchange of Metal Oxide Nanoparticles

A 250 mL beaker was charged with 100 g of the specific acidic or basic metal oxide nanoparticle dispersion or mixed metal oxide nanoparticle dispersion and 50 g each of NMP and MeOH was added. The solvent was then evaporated until most of the residual water was removed. Once the water was removed the solids remaining were diluted to the desired concentration with a 50:50 mixture of NMP and MeOH. The system was subjected to ultra-sonication for 5 minutes to completely re-disperse the nanoparticles into the organic solvents, while maintaining the solution at room temperature with a recirculating water bath. The dispersion after sonication was translucent.

Example 2: High Refractive Index Planar $TiO_2$ Hard Coat

Figure 20:
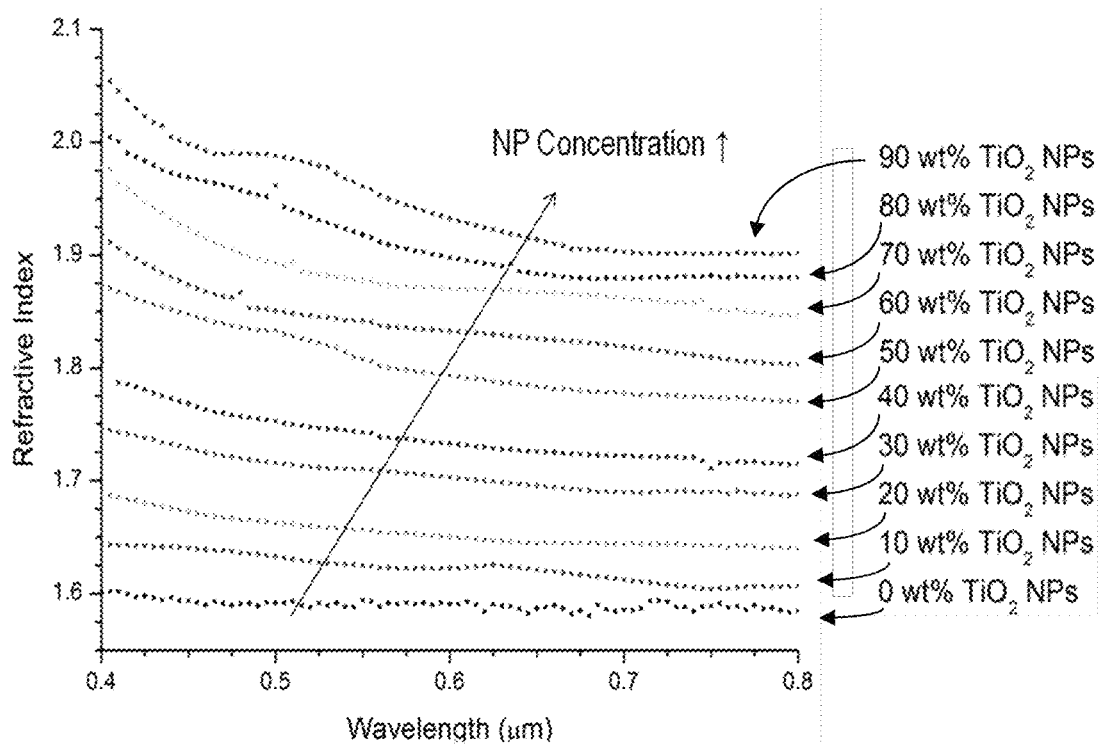
FIG. 20 depicts a graph of refractive index as a function of wavelength of patterned nanoparticle structures in accordance with some examples.

Solvent exchanged titanium dioxide nanoparticles using the procedure from Example 1 (13.2 wt % $TiO_2$ in a 50:50 mixture of NMP:MeOH) was added to a 20 mL glass vial along with a 13.2 wt % solution of NOA60 in NMP in amounts varying from 0 wt % NOA60 to 90 wt % NOA60. The amount of NOA60 that was added was adjusted to obtain the desired refractive index. FIG. 20 illustrates the refractive index versus wavelength of planar patterned nanoparticle nanostructures based on $TiO_2$ (5 nm to 30 nm in particle size) and a commercially available thiol-ene based photoresist (NOA60). The solution was filtered through a 0.2 micron PTFE filter and then spun coat on a substrate (silicon, glass, or plastic, depending on the application) in a low humidity environment at 3000 rpm until no solvent remained (approximately 2 minutes). The coating was then irradiated with 365 nm UV light for 15 min with an intensity of 12 mW/cm$^2$ under a nitrogen environment.

Figure 21:
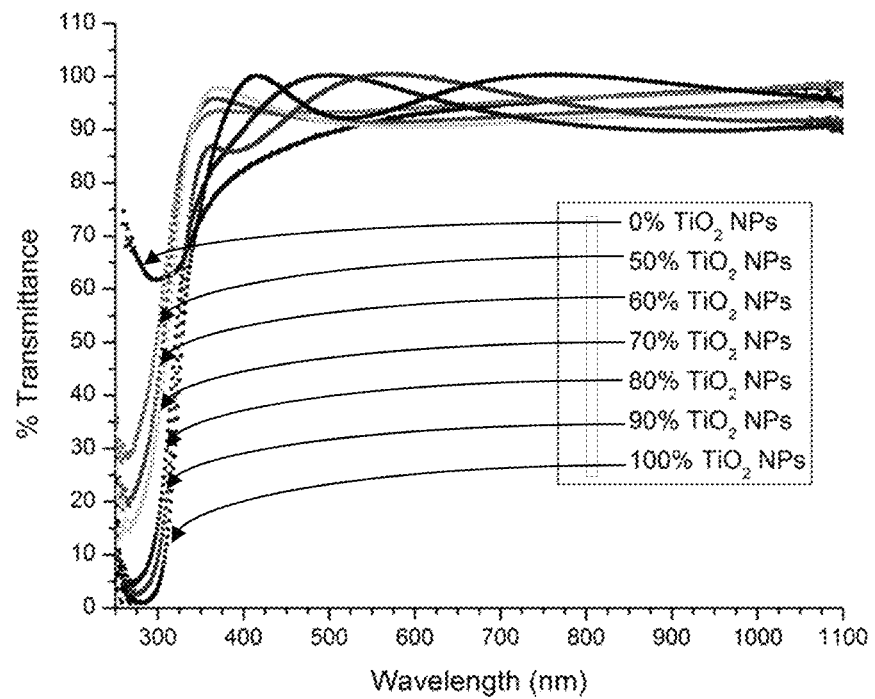
FIG. 21 illustrates a graph of percent transmittance as a function of wavelength of patterned nanoparticle structures in accordance with some examples.
Figure 22:
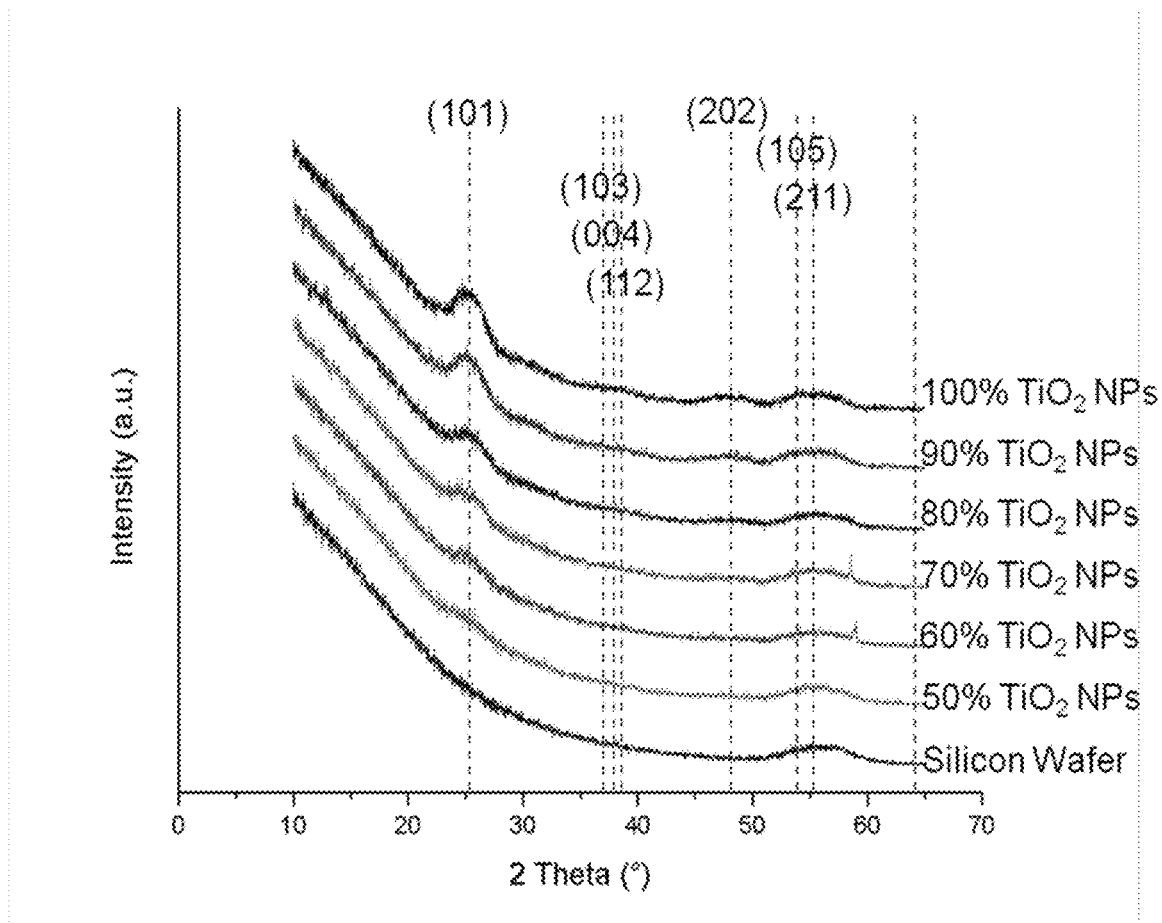
FIG. 22 shows X-ray diffraction results of patterned nanoparticle structures in accordance with some examples.
Figure 23:
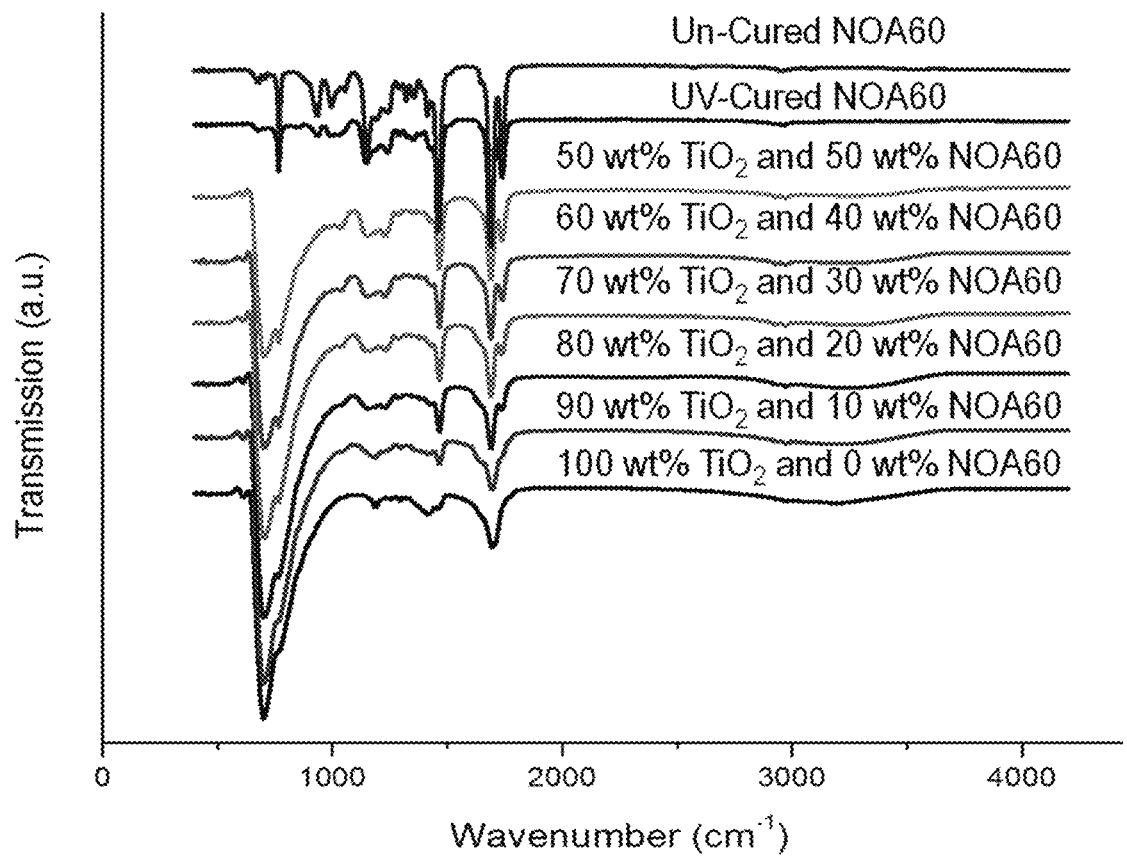
FIG. 23 depicts FT-IR spectra of patterned nanoparticle structures in accordance with some examples.

The as described planar coatings exhibit greater than 90% transparency and refractive index values, at a wavelength of 800 nm, ranging from 1.58 for the neat photoresist to 1.9 for 10 wt % NOA60. FIG. 21 shows UV-Vis spectra of planar patterned nanoparticle nanostructures comprised of a $TiO_2$ nanoparticle (5 nm to 30 nm in particle size) and a commercially available thiol-ene based photoresist (NOA60). FIG. 22 shows X-ray diffraction results of the planar patterned nanoparticle nanostructures showing the characteristic peaks for crystalline anatase $TiO_2$ without a high temperature calcination step with varying amounts of NOA60. FIG. 23 shows FT-IR spectra of patterned nanoparticle nanostructures composed of anatase $TiO_2$ (5 nm to 30 nm in particle size) with and NOA60. FIG. 24 shows a comparison of photo-DSC thermograms of patterned nanoparticle nanostructures of 100 wt % NOA60, 100 wt % $TiO_2$, 90 wt % $TiO_2$ and 10 wt % NOA60, and 50 wt % $TiO_2$ and 50 wt % NOA60.

The adhesion to the silicon substrate is extremely good as can be seen in FIG. 25, which shows adhesion measurements of different patterned nanostructures with varying amounts of NOA60 in relation to $TiO_2$ using ASTM D 3359 with 810 scotch tape. The RMS roughness of the coatings is also quite small (less than 6 nm). FIG. 27 shows the crosslinking mechanism of a titanium sol titanium diisopropoxide bis(acetylacetonate) at 365 nm UV light.

RMS roughness values of planar films based on a nanoparticle nanostructures comprising $TiO_2$ (5 nm to 30 nm particle sizes) using a commercially available thiol-ene based photoresist (NOA60) at different compositions are provided in FIG. 28.

Example 3: Patterned $TiO_2$ Nanoparticle Nanocomposites Using Organic Solvent Dispersible Formulations Solvent exchanged titanium dioxide nanoparticles using the procedure in Example 1 (13.2 wt % $TiO_2$ in a 50:50 mixture of NMP:MeOH) was added to a 20 mL glass vial along with a 13.2 wt % solution of NOA60 in NMP in amounts varying from 0 wt % NOA60 to 90 wt % NOA60. The amount of NOA60 was adjusted to obtain the desired refractive index, as can be seen in FIG. 20. The solution was filtered through a 0.2 micron PTFE filter and then spun coat on a substrate (silicon, glass, or plastic, depending on the application) in a low humidity environment at 3000 rpm for 30 seconds and then the mold was placed on top of the substrate with the coating. The coating was then irradiated with 365 nm UV light for 15 min with an intensity of 12 mW/cm$^2$ under a nitrogen environment. The mold was carefully peeled off of the coating and the characteristic diffraction pattern for the particular mold could be seen over the entire film. The imprinted structures of the different molds and compositions with different refractive indices are shown in FIGS. 2 through 6.

FIG. 2 illustrates 2D and 3D AFM images of patterned $TiO_2$ nanoparticle nanostructures (5 nm to 30 nm in particle size) using a commercially available thiol-ene based photoresist (NOA60). The dimensions of the photoresist mold are 500 nm line width and 500 nm depth with a periodicity of 1.0 micron. FIG. 2 shows images of samples where relative concentrations of nanoparticles and binder in the nanoparticle compositions are follows: A) 100 wt % $TiO_2$ and 0 wt % NOA60, B) 90 wt % TiO$_2$ and 10 wt % NOA60, C) 80 wt % TiO$_2$ and 20 wt % NOA60, D) 70 wt % TiO$_2$ and 30 wt % NOA60, E) 60 wt % TiO$_2$ and 40 wt % NOA60, F) 50 wt % TiO$_2$ and 50 wt % NOA60.

Figure 3:
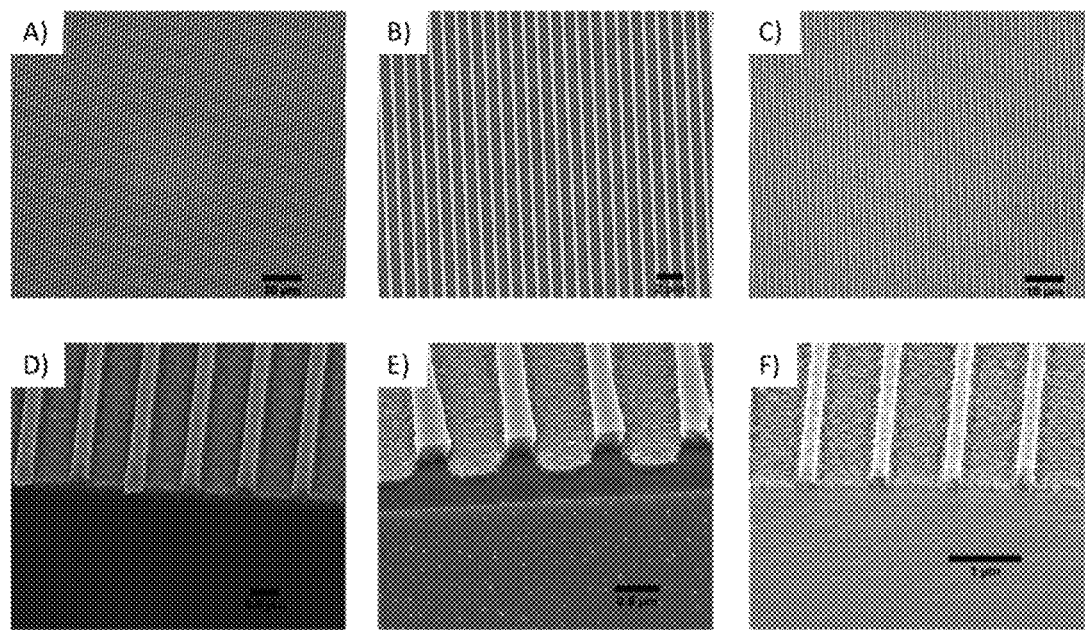
FIG. 3 depicts scanning electron microscope (SEM) images of other patterned nanoparticle structures having a line pattern in accordance with some examples.

FIG. 3 shows SEM images of patterned TiO$_2$ nanoparticle nanostructures (5 nm to 30 nm in particle size) using a commercially available thiol-ene based photoresist (NOA60) with mold dimensions of 500 nm line width, 500 nm depth and 1.0 micron pitch. FIG. 3 shows images of samples where relative concentrations of nanoparticles and binder in the nanoparticle compositions are follows: A) 90 wt % TiO$_2$ and 10 wt % NOA60, B) 80 wt % TiO$_2$ and 20 wt % NOA60, C) 70 wt % TiO$_2$ and 30 wt % NOA60, and 50 degrees tilted SEM images of D) 90 wt % TiO$_2$ and 10 wt % NOA60, E) 80 wt % TiO$_2$ and 20 wt % NOA60, F) 70 wt % TiO$_2$ and 30 wt % NOA60.

Figure 4:
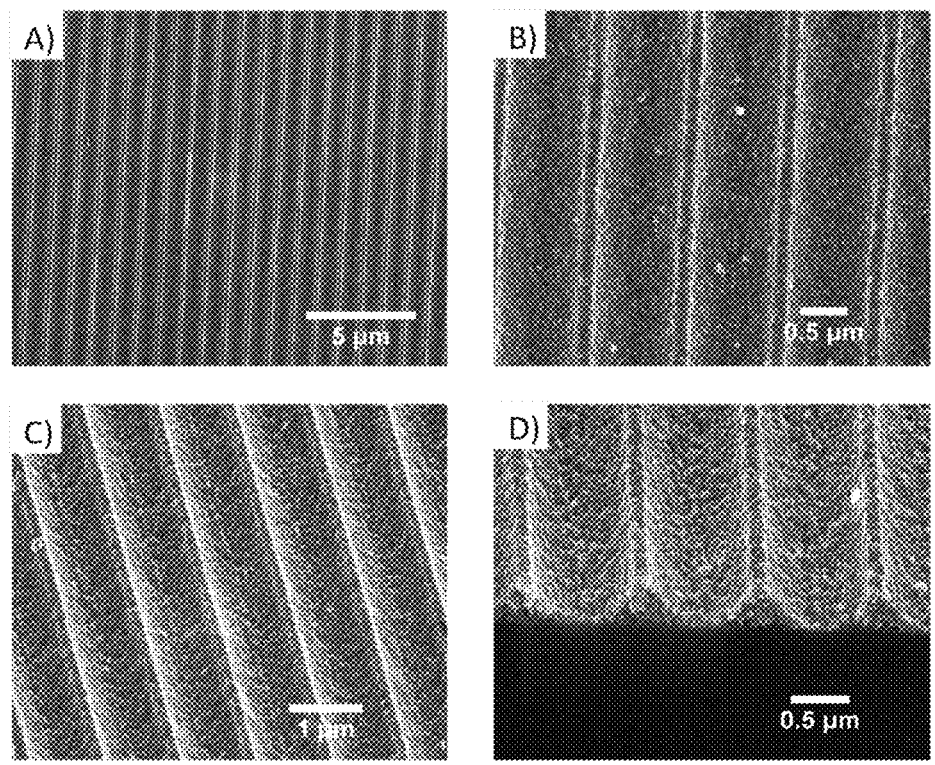
FIG. 4 shows SEM images of patterned nanoparticle structures having a line pattern with triangular shaped cross-sections in accordance with some examples.

FIG. 4 shows SEM images of a triangular grating of patterned TiO$_2$ nanoparticle nanostructures (5 nm to 30 nm in particle size) using a commercially available thiol-ene based photoresist (NOA60) with mold dimensions of 150 nm line width, 500 nm depth and 1.0 micron. FIG. 4 shows images of samples where the relative concentration of the nanoparticle composition is 90 wt % TiO$_2$ and 10 wt % NOA60. A) and B) show top down SEM images; and C) and D) show SEM images 50 degrees tilted.

Figure 5:
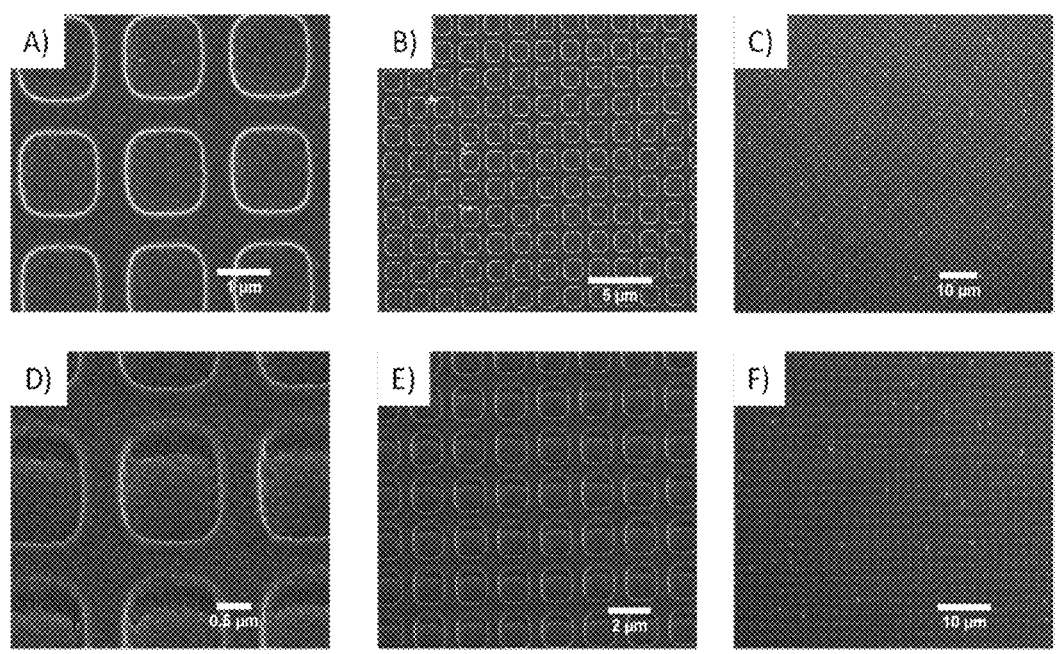
FIG. 5 shows SEM images of patterned nanoparticle structures having rectangular shapes in accordance with some examples.

FIG. 5 shows rectangular via structures of patterned TiO$_2$ nanoparticle nanostructures (5 nm to 30 nm in particle size) using a commercially available thiol-ene based photoresist (NOA60) with mold dimensions of 1.5 micron width, 1.5 micron height, 500 nm depth, and 2 micron pitch. FIG. 5 depicts images of samples where the relative concentration of the nanoparticle composition is 90 wt % TiO$_2$ and 10 wt % NOA60. A), B), and C) are top down SEM images at different magnifications and D), E) and F) are 50 degree tilted SEM images at different magnifications.

Figure 6:
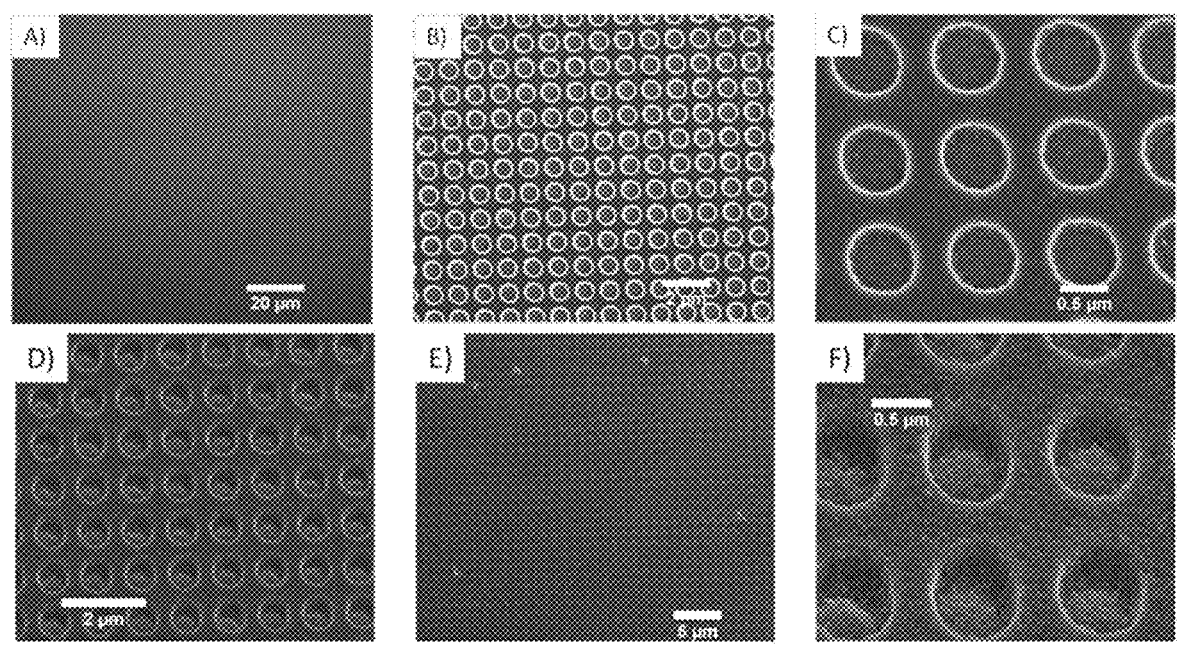
FIG. 6 illustrates SEM images of patterned nanoparticle structures having circular shapes in accordance with some examples.

FIG. 6 shows circular via structures of patterned TiO$_2$ nanoparticle nanostructures (5 nm to 30 nm in particle size) using a commercially available thiol-ene based photoresist (NOA60) with mold dimensions of 1.5 micron width, 1.5 micron height, 500 nm depth, and 2 micron pitch. FIG. 6 depicts images of samples where the relative concentration of the nanoparticle composition is 90 wt % TiO$_2$ and 10 wt % NOA60. A) is a top down SEM images, and B) and C) are 50 degree tilted SEM images at different magnifications.

Example 4: Patterned TiO$_2$ Nanoparticle Nanocomposites Using Water Dispersible Formulations The obtained acidic titanium dioxide nanoparticles were added to a 20 mL glass vial along with a water dispersible, UV-curable photoresist. The solution was filtered through a 0.2 micron PTFE filter and then spun coat on a substrate (can be silicon, glass, or plastic, depending on the application) in a low humidity environment at 3000 rpm for 30 seconds and then the mold was placed on top of the substrate with the coating. The coating was then irradiated with 365 nm UV light for 15 min with an intensity of 12 mW/cm$^2$ under a nitrogen environment. The mold was carefully peeled off of the coating and the characteristic diffraction pattern for the particular mold could be seen over the entire film.

Example 5: Patterned Nanoparticle Composites with Organic Solvent Based Titania Sols Solvent exchanged titanium dioxide nanoparticles using the procedure in Example 1 (13.2 wt % TiO$_2$ in a 50:50 mixture of NMP:MeOH) was added to a 20 mL glass vial along with a 70 wt % solution of titanium diisopropoxide bis(acetylacetonate) in isopropanol in amounts varying from 0 wt % titanium diisopropoxide bis(acetylacetonate) to 90 wt % titanium diisopropoxide bis(acetylacetonate). The amount of titanium diisopropoxide bis(acetylacetonate) that was added was adjusted to obtain the desired refractive index. The solution was filtered through a 0.2 micron PTFE filter and then spun coat on a substrate (silicon, glass, or plastic, depending on the application) in a low humidity environment at 3000 rpm for 30 seconds and then the mold was placed on top of the substrate with the coating. The coating was then irradiated with 365 nm UV light for 15 min with an intensity of 12 mW/cm$^2$. The apparent crosslinking mechanism of the titania sol can be seen in FIG. 27. The mold was released from the coating and the characteristic diffraction pattern for the particular mold could be seen over the entire film.

Figure 29:
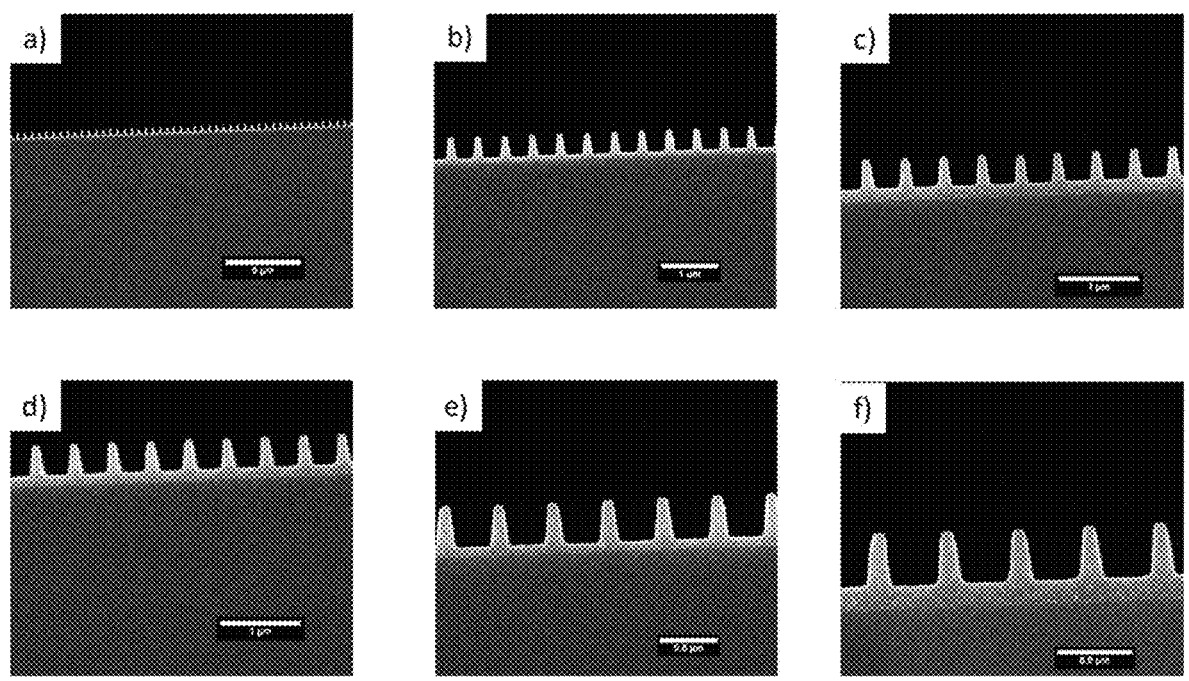
FIG. 29 shows cross sectional SEM images of high aspect ratio patterned nanoparticle structures having a line pattern in accordance with some examples.
Figure 30:
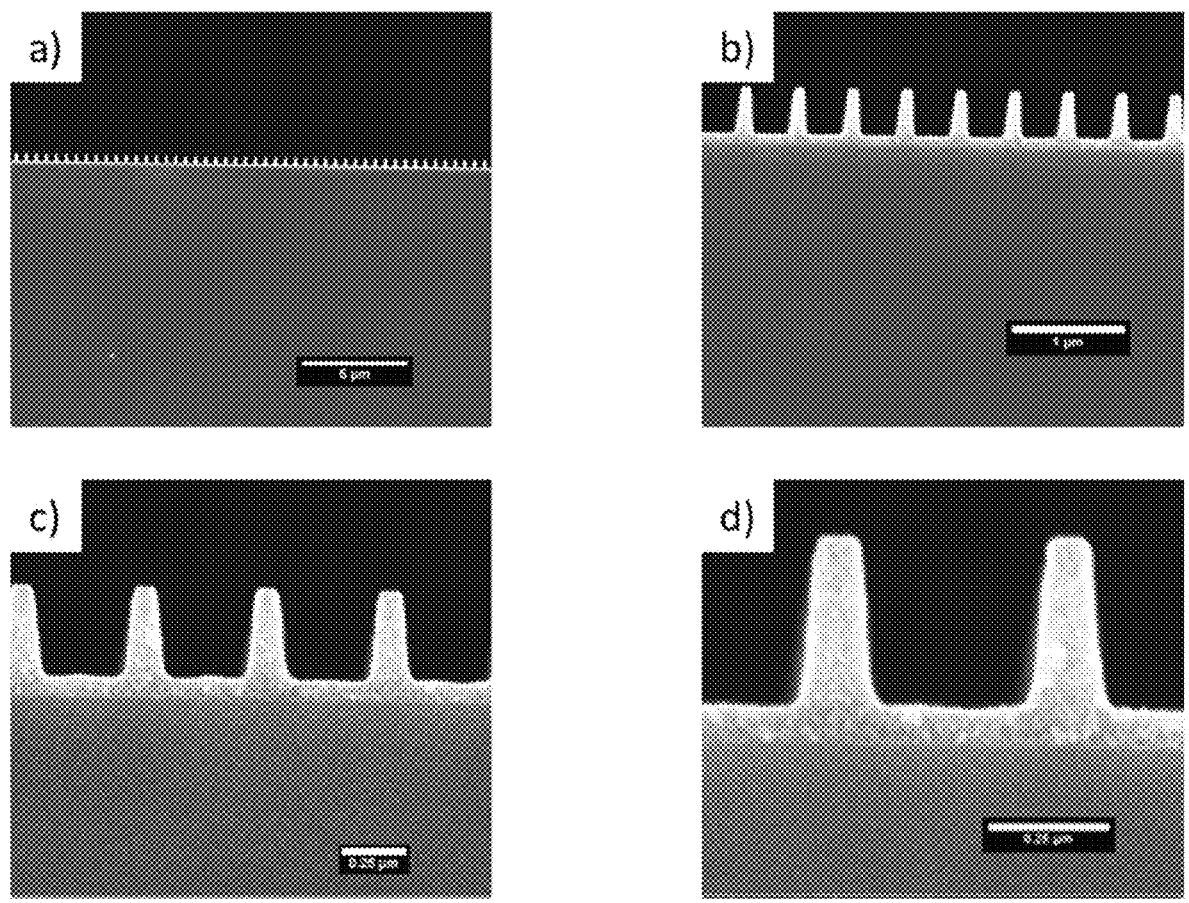
FIG. 30 depicts cross sectional SEM images of high aspect ratio patterned nanoparticle structures having a line pattern in accordance with some examples.

FIG. 29 shows high aspect ratio, cross sectional SEM images at different magnifications for a nanoparticle composition that was uncalcined, 90 wt % TiO$_2$ and 10 wt % titanium diisopropoxide bis(acetylacetonate), using a master mold having dimensions of 250 nm line width, 500 nm depth, and 500 nm pitch. FIG. 30 shows high aspect ratio, cross sectional SEM images at different magnifications for a nanoparticle composition that was calcined at 650 C, 90 wt % TiO$_2$ and 10 wt % titanium diisopropoxide bis(acetylacetonate), using a master mold having dimensions of 250 nm line width, 500 nm depth, and 500 nm pitch. These images show that it is possible, using techniques and processes described herein, to fabricate features extending above the surface that are small (e.g., 50-200 nm wide, 150-300 nm tall) and have a high aspect ratio (e.g., 1.5:1, 2:1, 2.5:1, 3:1, 3.5:1, 4:1, 5:1, etc.), in a repeatable manner.

Example 6: Patterned Nanoparticle Composites Using Water Dispersible Titania Sols The obtained acidic titanium dioxide nanoparticles were added to a 20 mL glass vial along with a 70 wt % solution of titanium diisopropoxide bis(acetylacetonate) in isopropanol in amounts varying from 0 wt % titanium diisopropoxide bis(acetylacetonate) to 90 wt % titanium diisopropoxide bis(acetylacetonate). The amount of titanium diisopropoxide bis(acetylacetonate) that was added was varied to obtain the desired refractive index. The silicone replica mold was exposed to 5 minutes of oxygen plasma to improve the wetting of the water/IPA solution. The solution was filtered through a 0.2 micron nylon filter and then spun coat on a substrate (silicon, glass, or plastic, depending on the application) in a low humidity environment at 3000 rpm for 30 seconds and then the mold was placed on top of the substrate with the coating. The coating was then irradiated with 365 nm UV light for 15 min with an intensity of 12 mW/cm$^2$ under a nitrogen environment.

Figure 7:
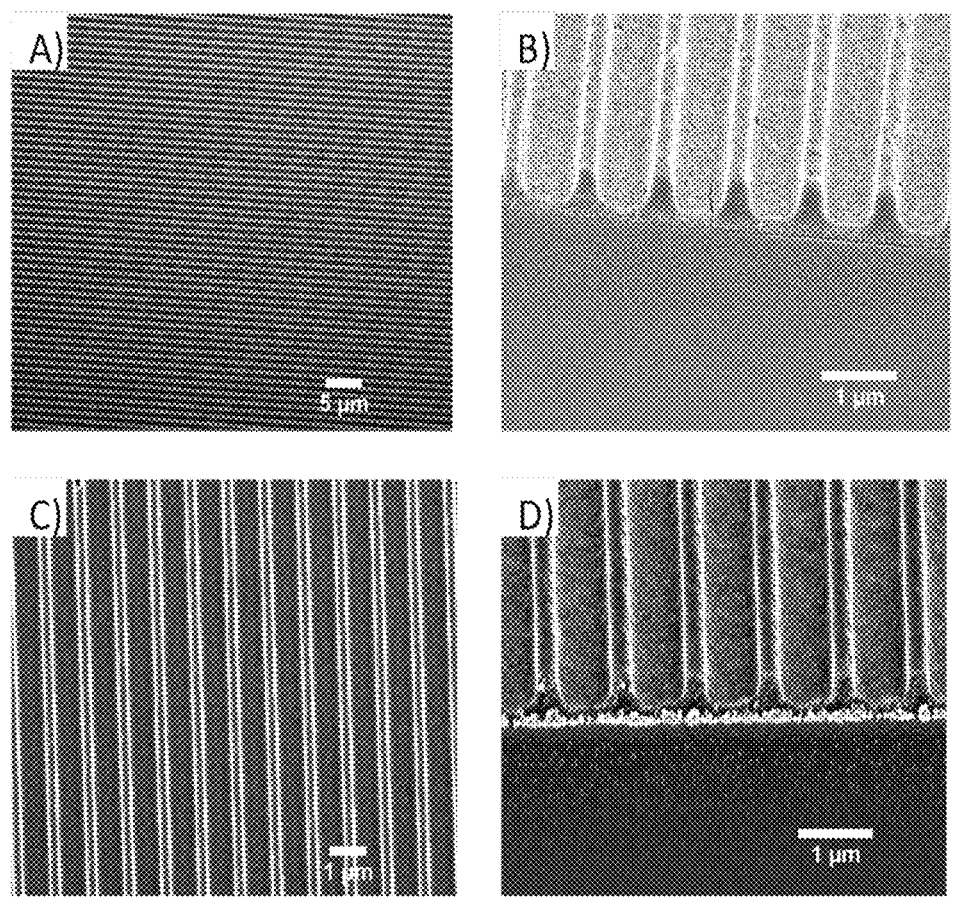
FIG. 7 depicts SEM images of patterned nanoparticle structures having a line pattern in accordance with some examples.

The apparent crosslinking mechanism of the titania sol is shown in FIG. 27. The mold was carefully peeled off of the coating and the characteristic diffraction pattern for the particular mold could be seen over the entire film. FIG. 7 shows SEM of the imprinted patterned TiO$_2$ nanoparticle nanostructures (5 nm to 30 nm in particle size) and a titanium sol (titanium diisopropoxide bis(acetylacetonate)) with mold dimensions of 500 nm line width, 500 nm depth and 1.0 micron pitch. FIG. 7 shows SEM images of samples where relative concentrations of nanoparticles and binder in the nanoparticle compositions are follows: A) 50 wt % TiO$_2$ and 50 wt % titanium diisopropoxide bis(acetylacetonate), C) 90 wt % TiO$_2$ and 10 wt % titanium diisopropoxide bis(acetylacetonate) shown as top down SEM images; and B) 50 wt % TiO$_2$ and 50 wt % titanium diisopropoxide bis(acetylacetonate), D) 90 wt % TiO$_2$ and 10 wt % titanium diisopropoxide bis(acetylacetonate) shown as 50 degrees tilted SEM images.

Figure 8:
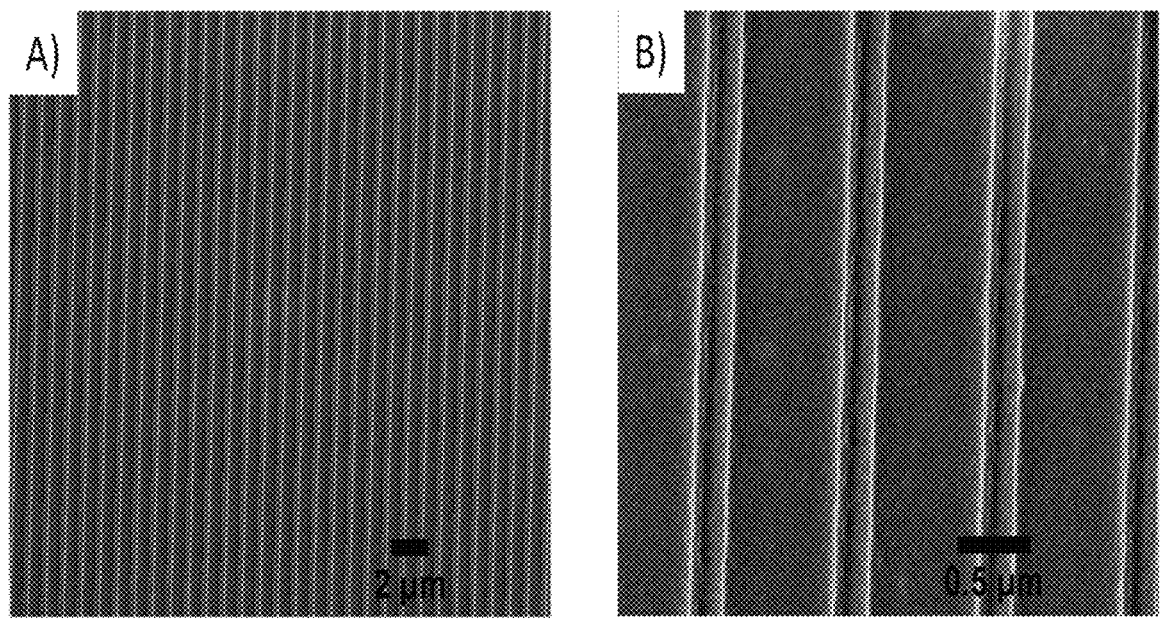
FIG. 8 illustrates SEM images of further patterned nanoparticle structures having a line pattern in accordance with some examples.

Example 7: Patterned CeO$_2$ Nanoparticle Composites Using Organic Solvent Dispersible Formulations Solvent exchanged cerium dioxide nanoparticles using the procedure in Example 1 (10 wt % CeO$_2$ in a 50:50 mixture of NMP:MeOH) was added to a 20 mL glass vial along with a 10 wt % solution of NOA60 in NMP in amounts varying from 0 wt % NOA60 to 90 wt % NOA60. The solution was filtered through a 0.2 micron PTFE filter and then spun coat on a substrate (silicon, glass, or plastic, depending on the application) in a low humidity environment at 3000 rpm for 30 seconds and then the mold was placed on top of the substrate with the coating. The coating was then irradiated with 365 nm UV light for 15 min with an intensity of 12 mW/cm$^2$ under a nitrogen environment. The mold was carefully peeled off of the coating and the characteristic diffraction pattern for the particular mold could be seen over the entire film. FIG. 8 shows top down SEM images of the imprinted nanostructures comprising 100 wt % CeO$_2$ nanoparticles (10 nm to 20 nm particle size) with mold dimensions of 500 nm line width, 500 nm depth and 1.0 micron pitch.

Example 8: Patterned CeO$_2$ Nanoparticle Composites with Cerium Sol-Gel Precursors Solvent exchanged cerium dioxide nanoparticles using the general procedure described in Example 1 (with 10 wt % CeO$_2$ in a 50:50 mixture of NMP:MeOH) was added to a 20 mL glass vial along with a 10 wt % solution of cerium (III) nitrate hexahydrate (Ce(III) (NO$_3$)$_3$) sol-gel precursor in NMP in amounts varying from 0 wt % Ce(III) (NO$_3$)$_3$ to 90 wt % Ce(III) (NO$_3$)$_3$. The solution was filtered through a 0.2 micron PTFE filter and then spun coat on a substrate (silicon, glass, or plastic, depending on the application) in a low humidity environment at 3000 rpm for 30 seconds and then the mold was placed on top of the substrate with the coating.

Figure 9:
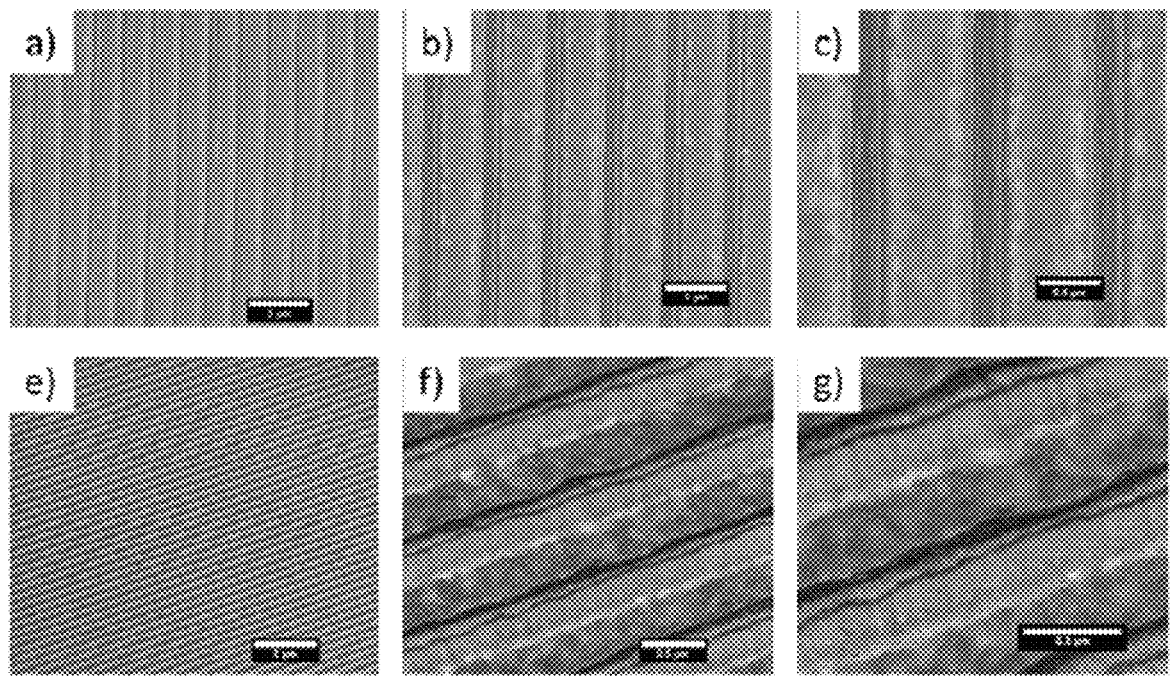
FIG. 9 shows SEM images of patterned nanoparticle structures having a line pattern in accordance with some examples.
Figure 10:
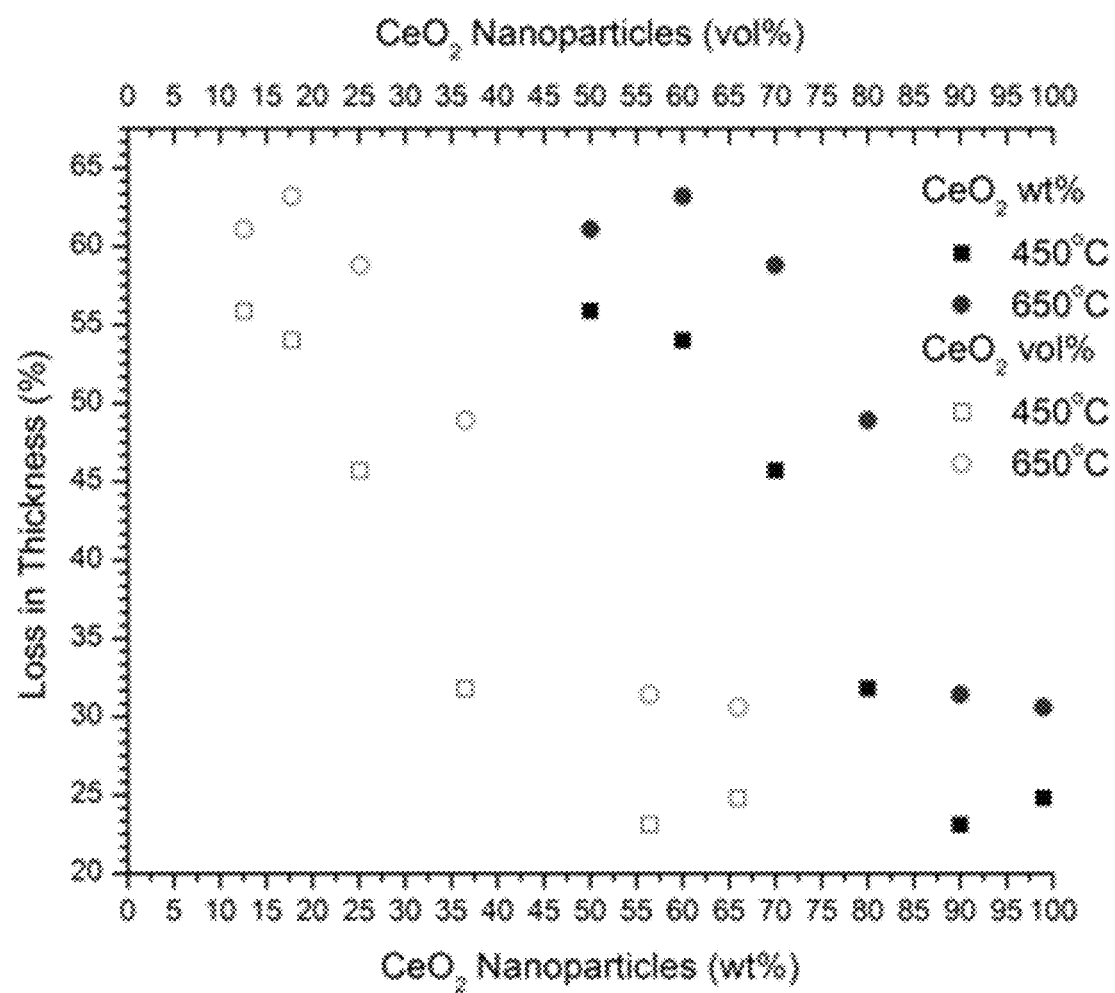
FIG. 10 depicts a graph of percent loss in thickness as a function of nanoparticle weight and volume percentage at various calcination temperatures.

After a sufficient time passed for the coating to dry, the mold was then carefully peeled off of the coating and the characteristic diffraction pattern for the particular mold could be seen over the entire film. FIG. 9 shows uncalcined SEM images of samples where relative concentrations of nanoparticles and binder in the nanoparticle compositions are 80 wt % CeO$_2$ and 20 wt % Ce(III) (NO$_3$)$_3$: top row [A), B) and C)] are shown as top down SEM images and bottom row [E), F), G)] are shown as SEM images tilted 50 degrees using a master mold having dimensions of 500 nm line width, 500 nm depth, and 1000 nm pitch. These compositions can then be calcined at elevated temperatures without significant shrinkage to the film thickness, as indicated in FIG. 10. FIG. 10 depicts the percent loss in thickness of planar films composed of CeO$_2$ nanoparticles and Ce(III) (NO$_3$)$_3$, calcined at 450 C and 650 C, as functions of nanoparticle loading (weight and volume percentages), shown to be less than 35% where the percent weight of CeO$_2$ nanoparticles is greater than 35 wt %.

Figure 11:
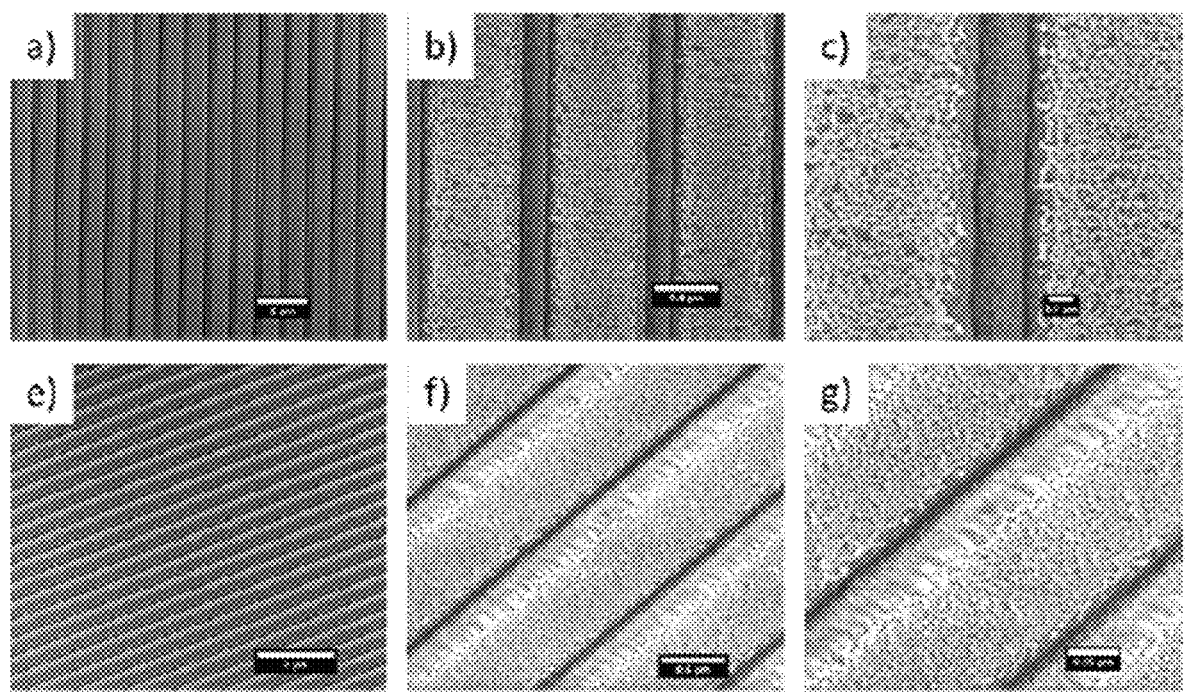
FIG. 11 shows SEM images of patterned nanoparticle structures having a line pattern in accordance with some examples.
Figure 12:
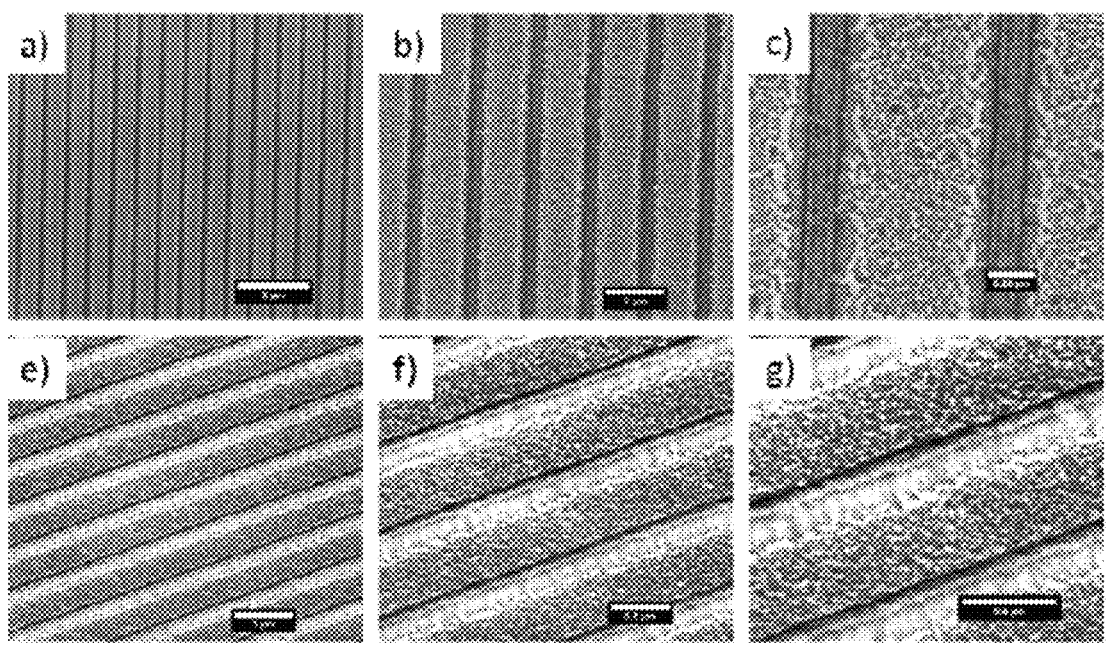
FIG. 12 illustrates SEM images of patterned nanoparticle structures having a line pattern in accordance with some examples.
Figure 13:
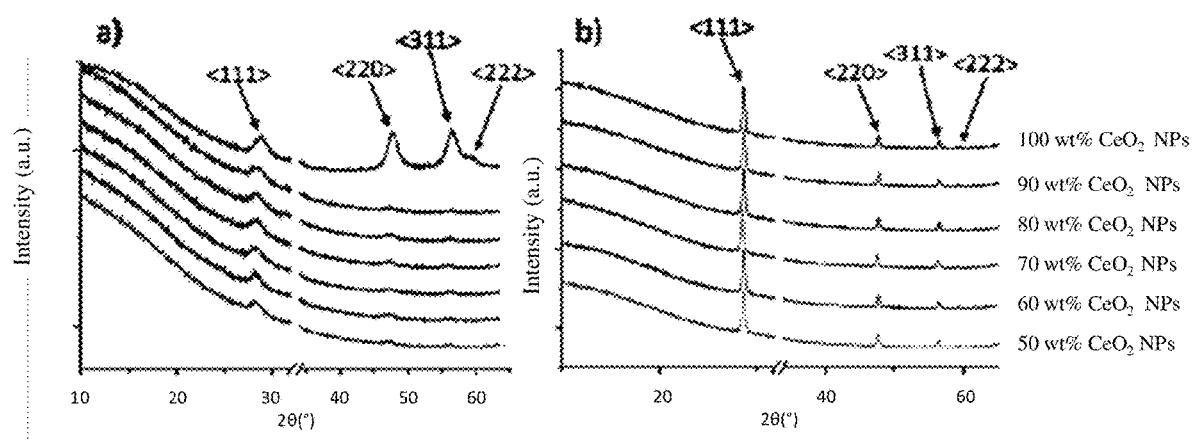
FIG. 13 depicts X-ray diffraction results of patterned nanoparticle structures in accordance with some examples.

FIG. 11 shows a single composition, 100 wt % CeO$_2$ and 0 wt % Ce(III) (NO$_3$)$_3$ after calcination at 1000 C: top row [A), B) and C)] are shown as top down SEM images and the bottom row [E), F), G)] are shown as SEM images tilted 60 degrees using a master mold having dimensions of 500 nm line width, 500 nm depth, and 1000 nm pitch. FIG. 12 depicts SEM images of a patterned nanostructure including 90 wt % CeO$_2$ and 10 wt % Ce(III) (NO$_3$)$_3$ after calcination at 1000 C: top row [A), B) and C)] are shown as top down SEM images and the bottom row [E), F), G)] are shown as SEM images tilted 60 degrees using a master mold having dimensions of 500 nm line width, 500 nm depth, and 1000 nm pitch. Upon calcination at 1000 C there is significant coarsening of the structure, and thus crystallization, as evidenced by the reduction in the full width at half maxima of the <111> reflection as seen in FIG. 13, which shows the XRD spectra for CeO$_2$ nanoparticles mixed with Ce(III) (NO$_3$)$_3$ a) before calcination and b) after calcination.

Figure 31:
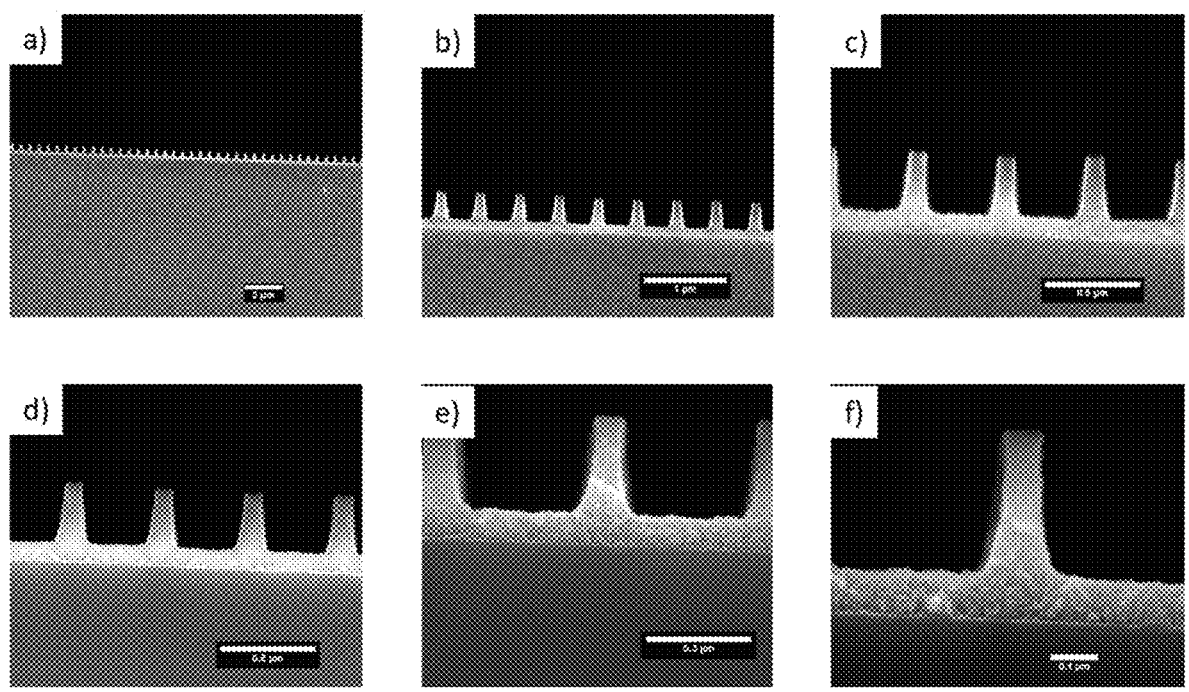
FIG. 31 shows cross sectional SEM images of high aspect ratio patterned nanoparticle structures having a line pattern in accordance with some examples.
Figure 32:
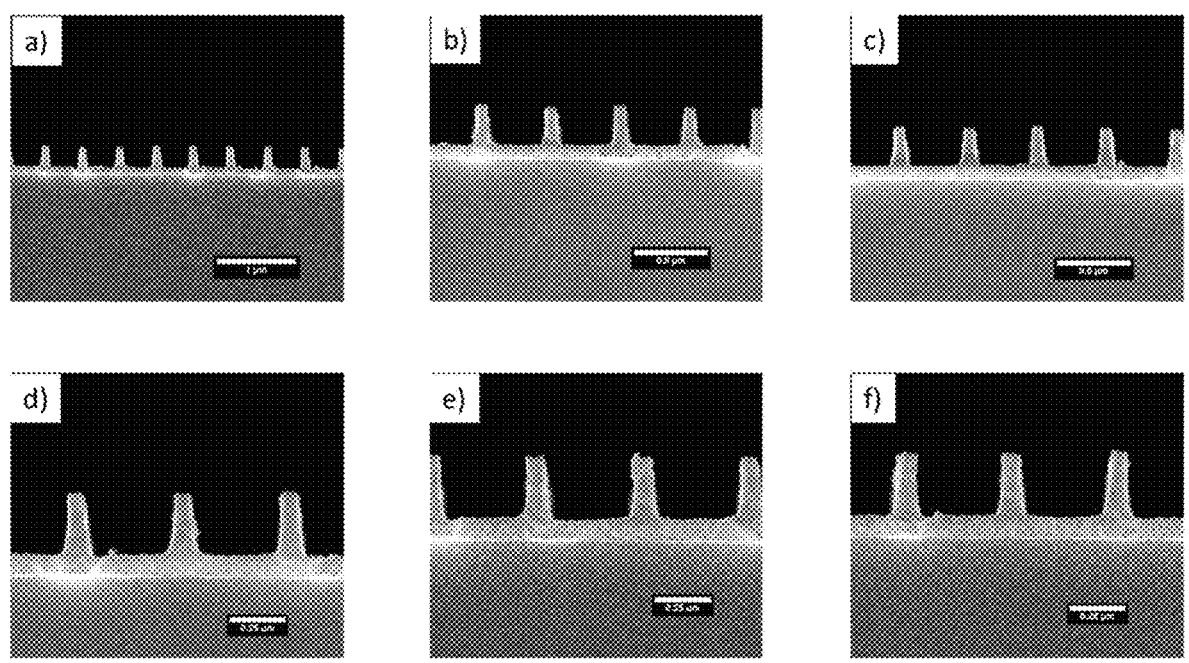
FIG. 32 illustrates cross sectional SEM images of high aspect ratio patterned nanoparticle structures having a line pattern in accordance with some examples.

FIG. 31 shows high aspect ratio, cross sectional SEM images at different magnifications for a nanoparticle composition that was uncalcined, 90 wt % CeO$_2$ and 10 wt % Ce(III) (NO$_3$)$_3$, using a master mold having dimensions of 250 nm line width, 500 nm depth, and 500 nm pitch. FIG. 32 shows high aspect ratio, cross sectional SEM images at different magnifications for a nanoparticle composition that was calcined at 650 C, 90 wt % CeO$_2$ and 10 wt % Ce(III) (NO$_3$)$_3$, using a master mold having dimensions of 250 nm line width, 500 nm depth, and 500 nm pitch. As such, techniques and processes described herein provide for repeatable fabrication of small, high-aspect ratio features.

Example 9: Patterning of Gadolinia Doped CeO$_2$ Nanoparticle Composites with Organic Solvent Dispersible Formulations Solvent exchanged cerium dioxide nanoparticles using the general procedure described in Example 1 (with 10 wt % CeO$_2$ in a 50:50 mixture of NMP: MeOH) was added to a 20 mL glass vial along with a 10 wt % solution of gadolinium (III) nitrate hexahydrate (Gd(III)(NO$_3$)$_3$) in NMP in amounts varying from 0 wt % Gd(III)(NO$_3$)$_3$ to 90 wt % Gd(III)(NO$_3$)$_3$. The solution was filtered through a 0.2 micron PTFE filter and then spun coat on a substrate (silicon, glass, or plastic, depending on the application) in a low humidity environment at 3000 rpm for 30 seconds and then the mold was placed on top of the substrate with the coating.

Figure 14:
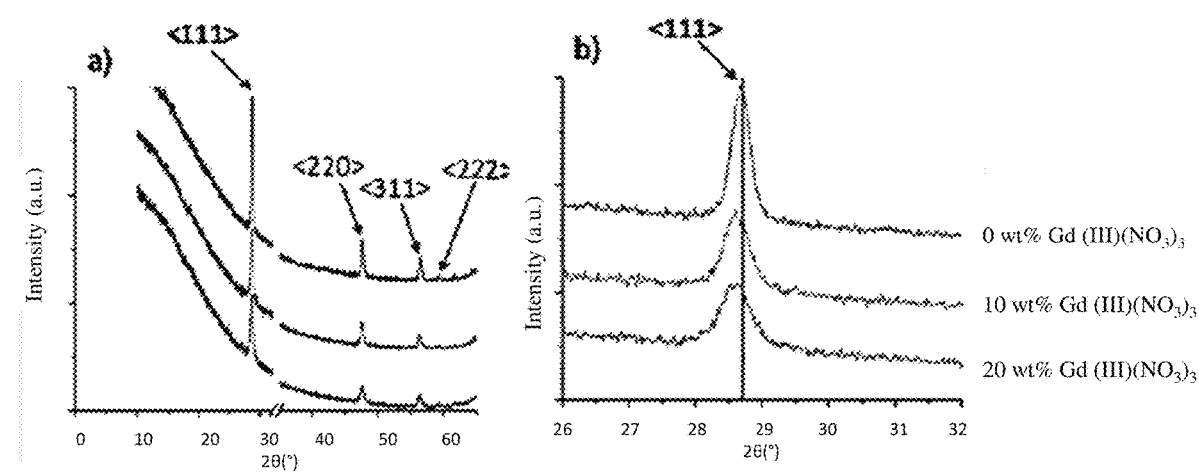
FIG. 14 shows X-ray diffraction results of patterned nanoparticle structures in accordance with some examples.
Figure 15A:
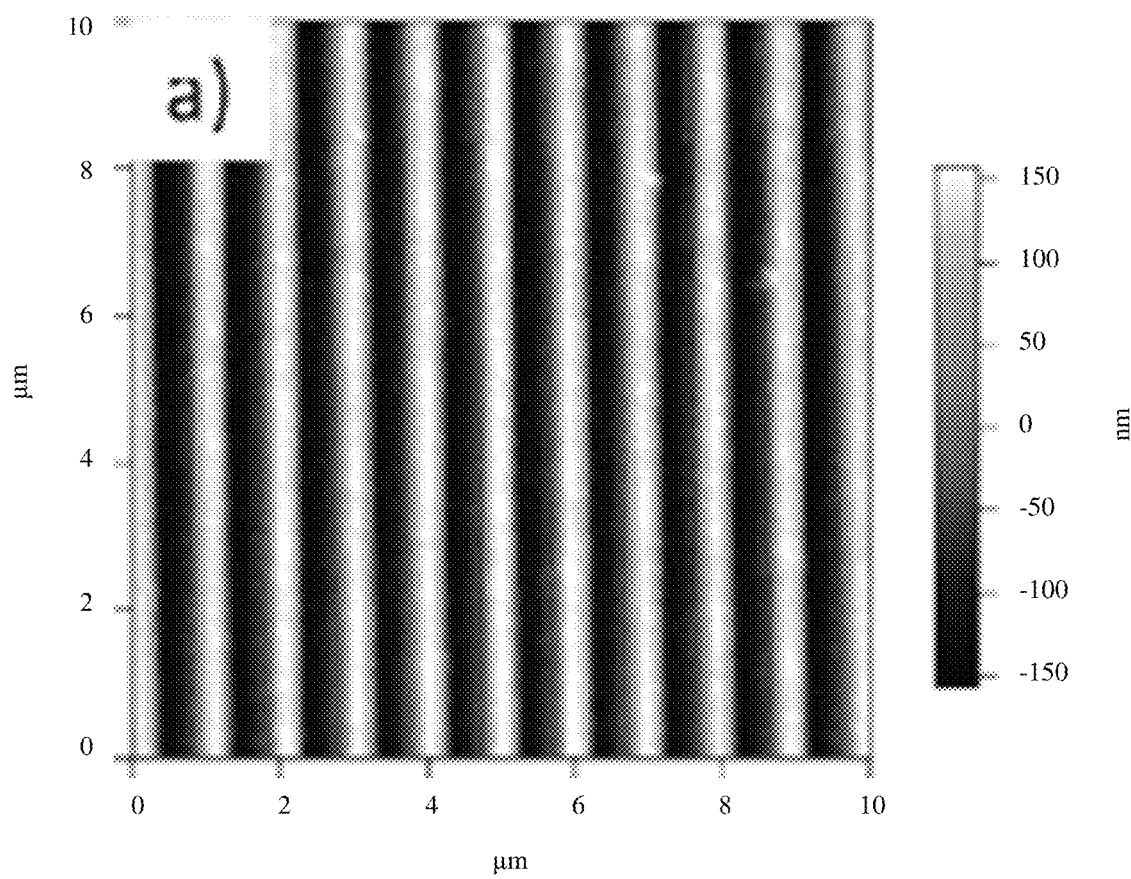
FIG. 15 depicts AFM images of patterned nanoparticle structures having a line pattern in accordance with some examples.
Figure 15B:
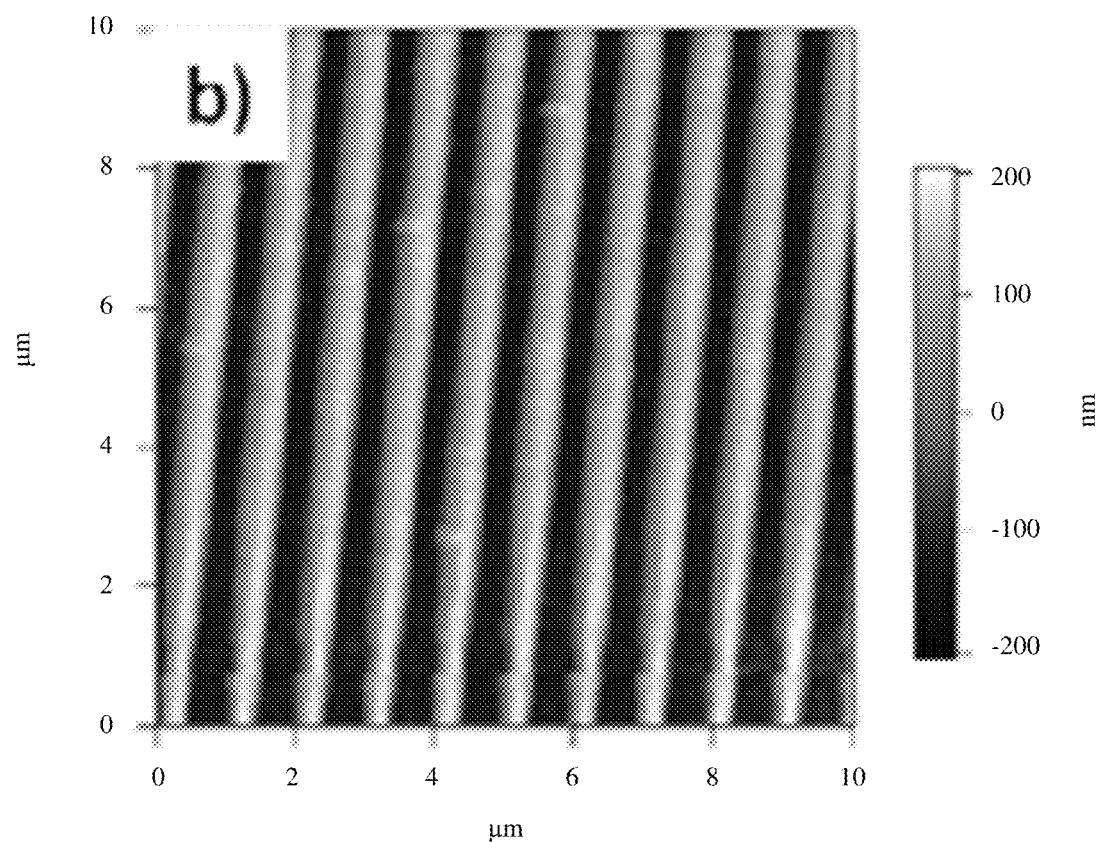
Figure 15C:
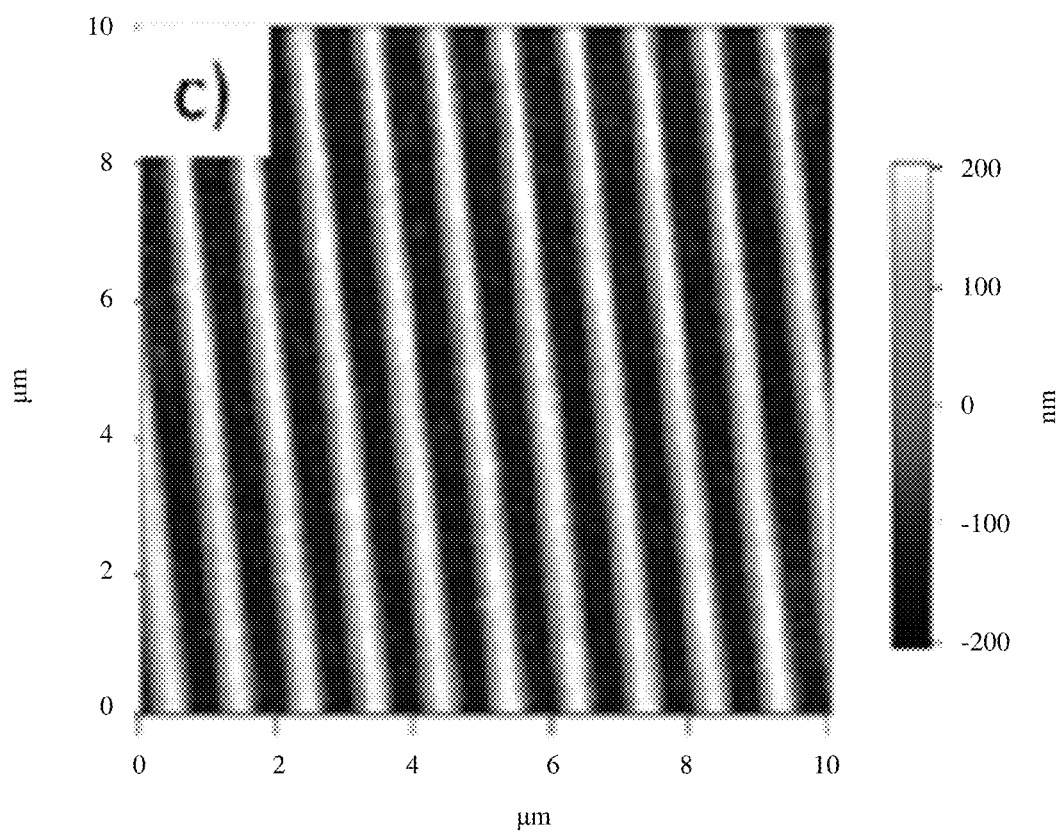
Figure 15D:
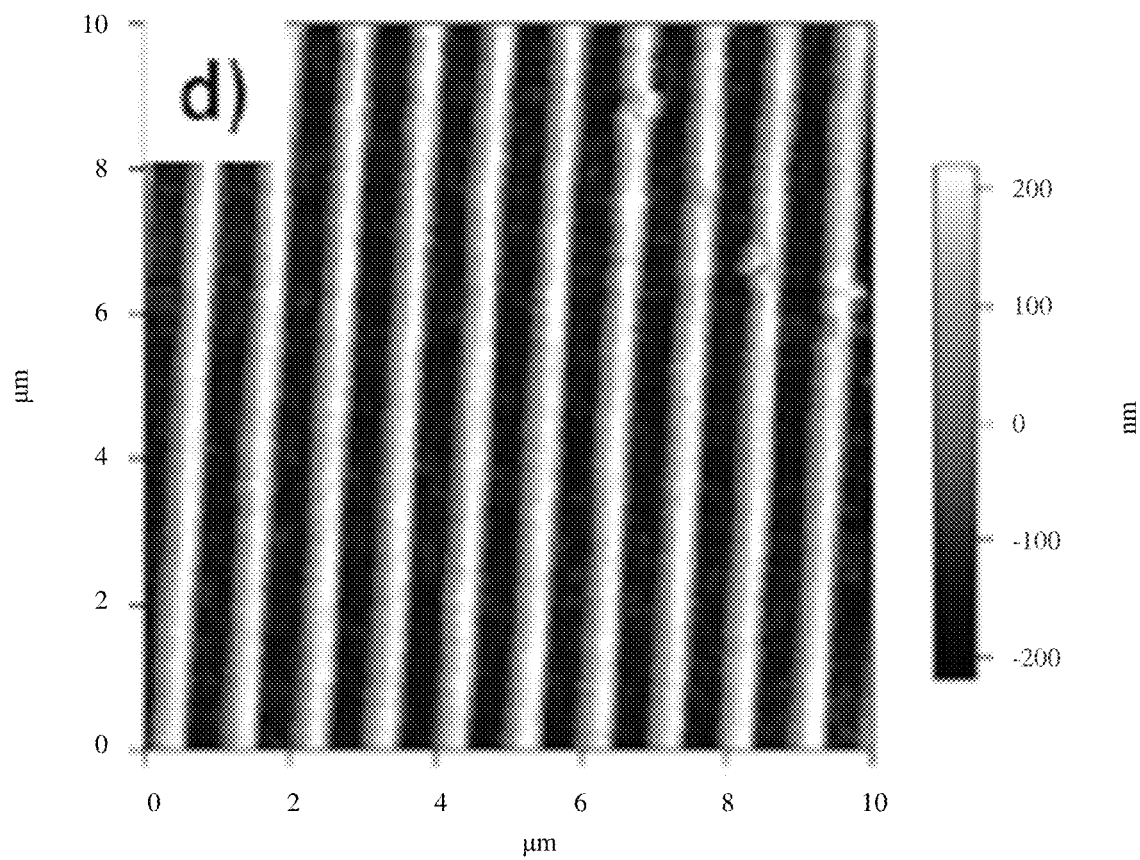
Figure 15E:
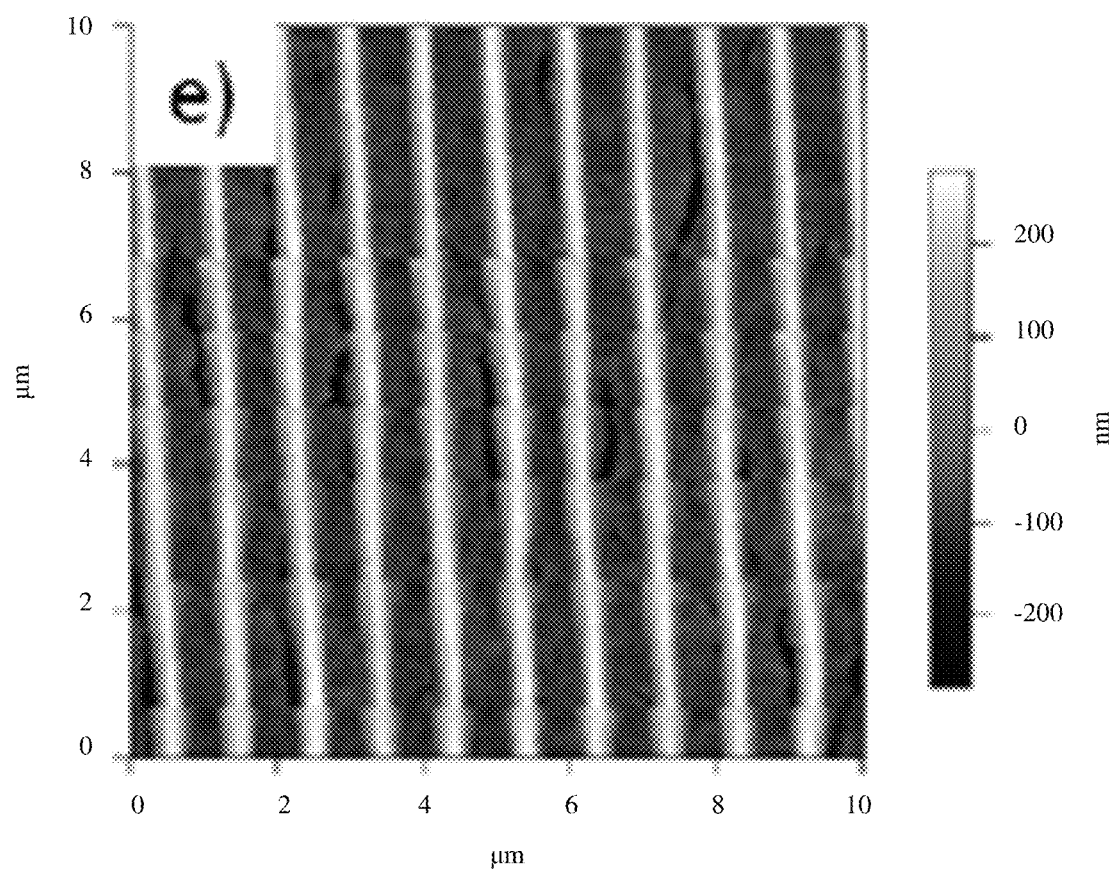
Figure 15F:
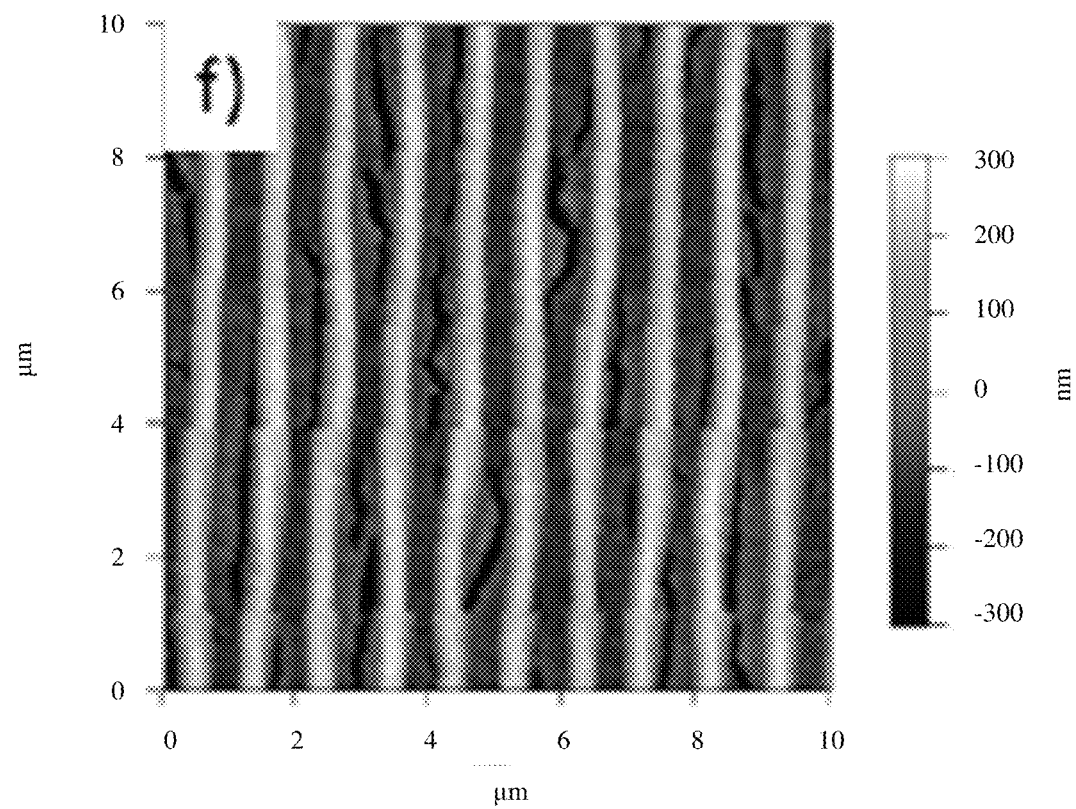
Figure 16A:
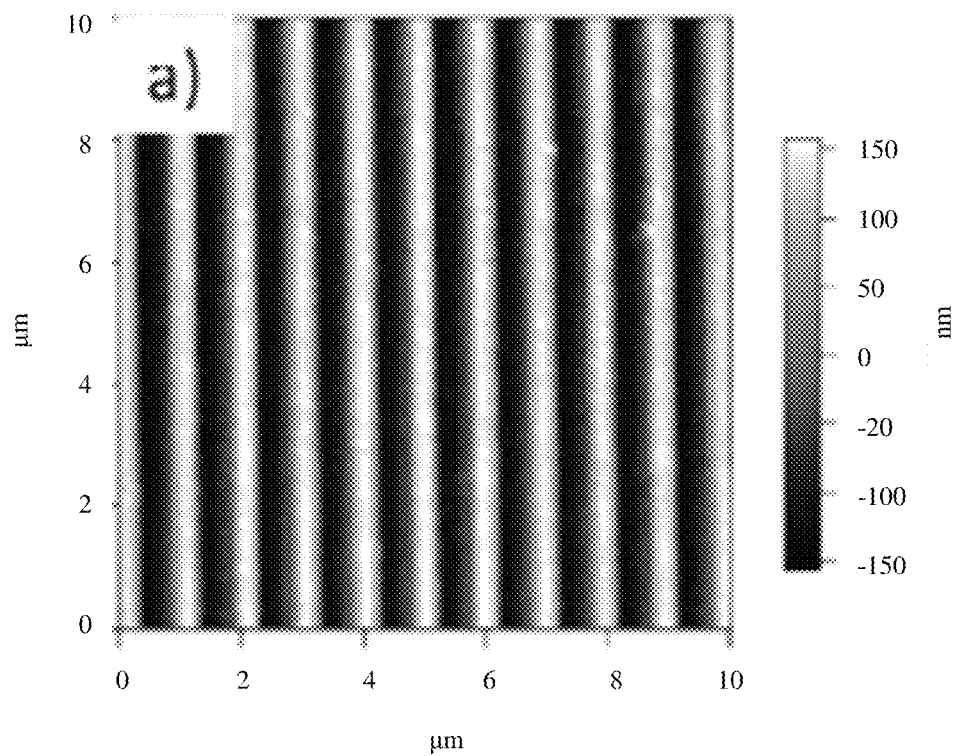
FIG. 16 shows AFM images of patterned nanoparticle structures having a line pattern in accordance with some examples.
Figure 16B:
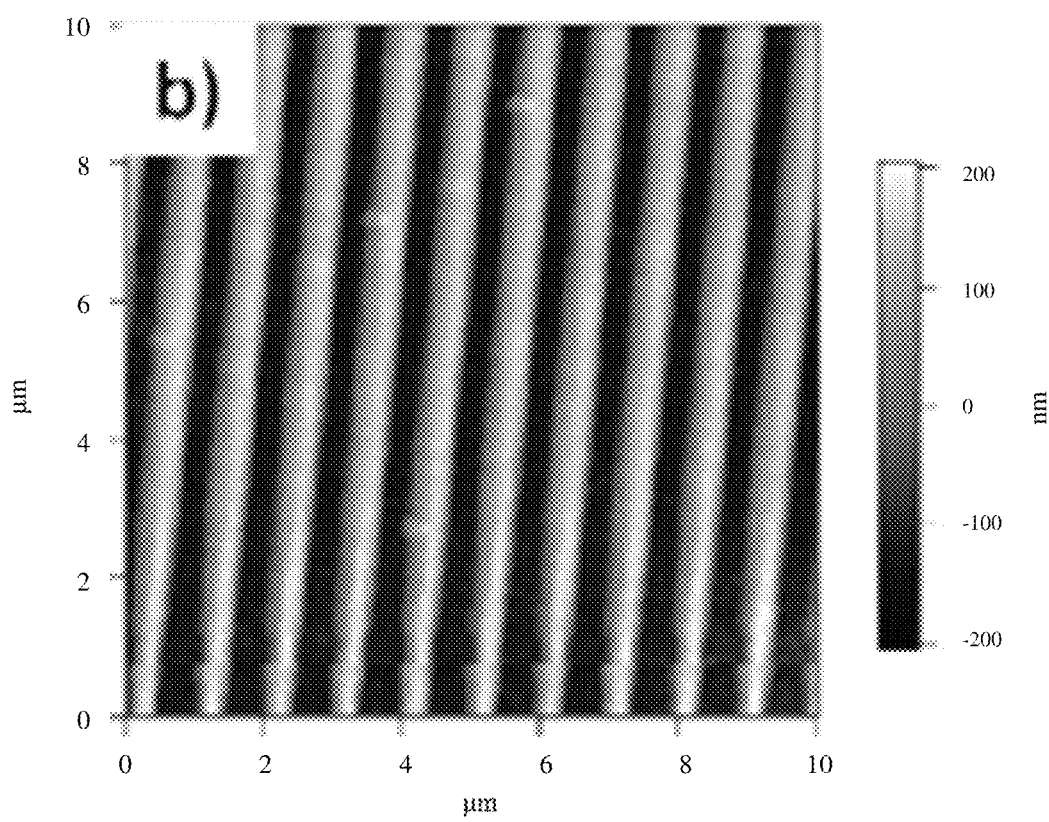
Figure 16C:
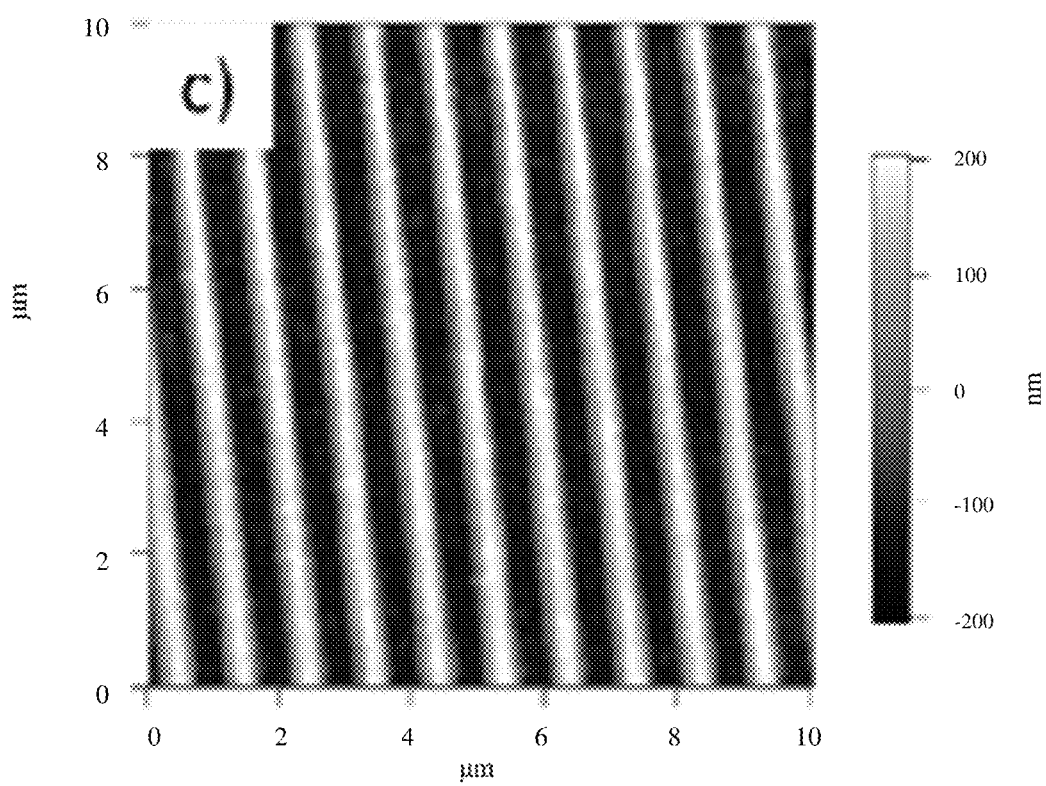
Figure 16D:
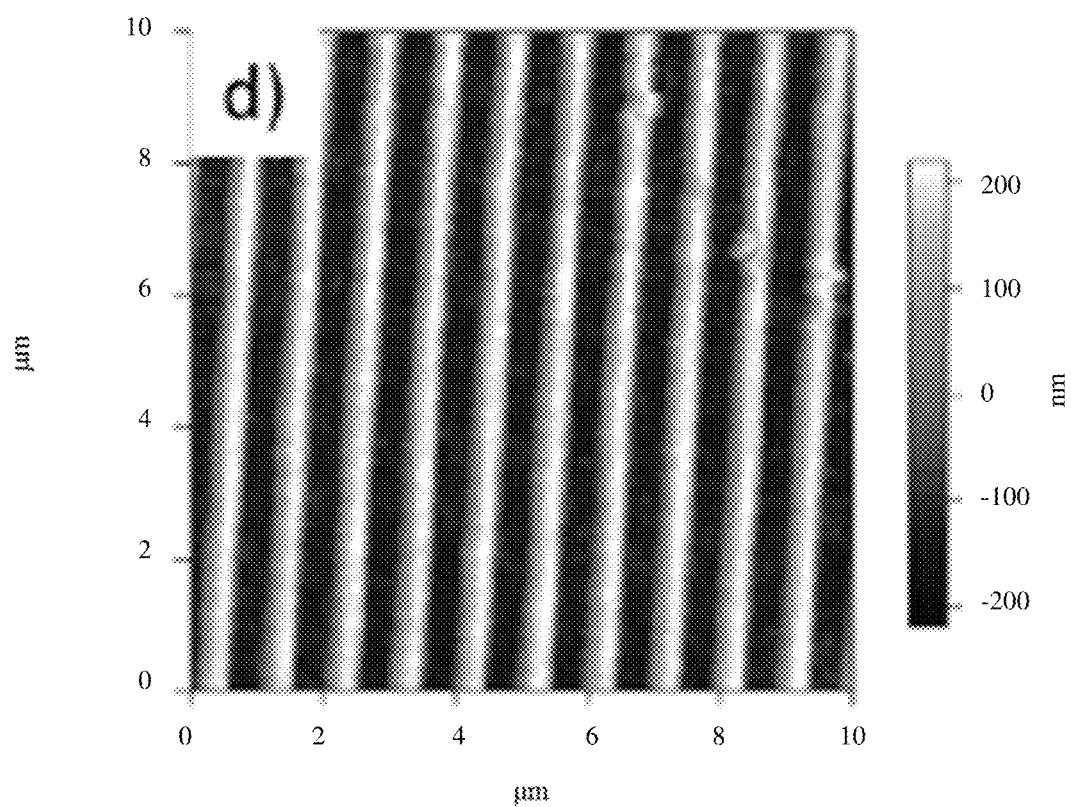
Figure 16E:
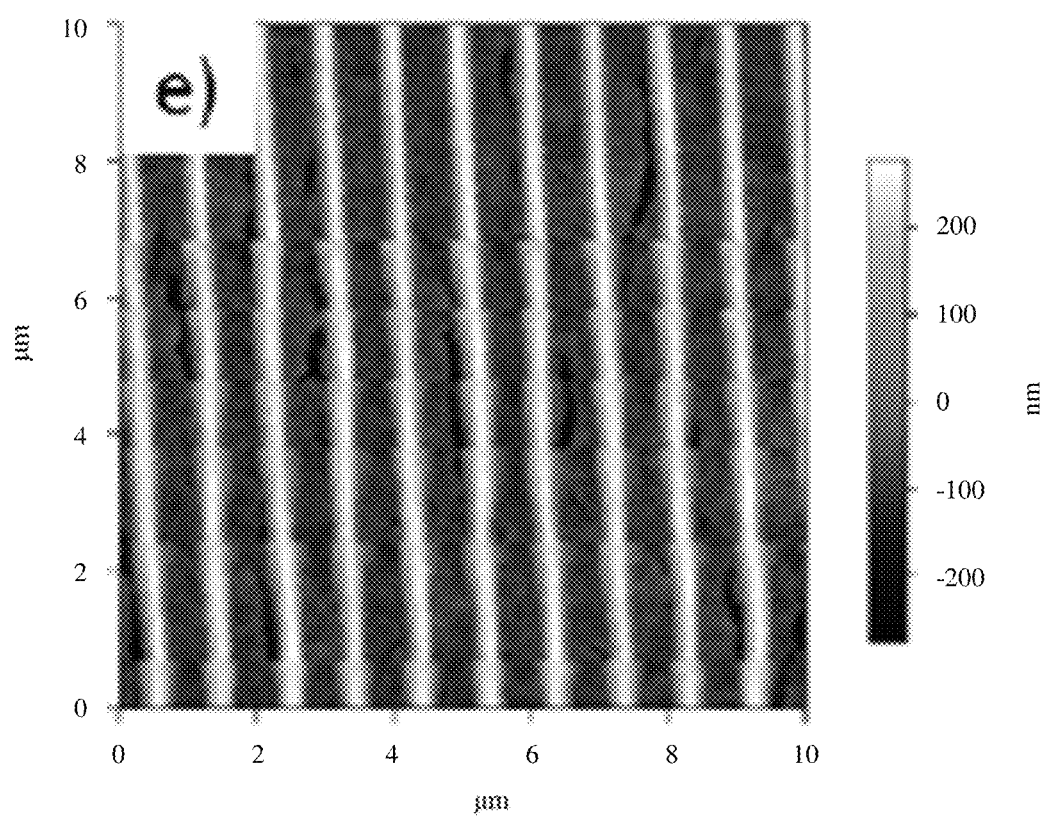
Figure 16F:
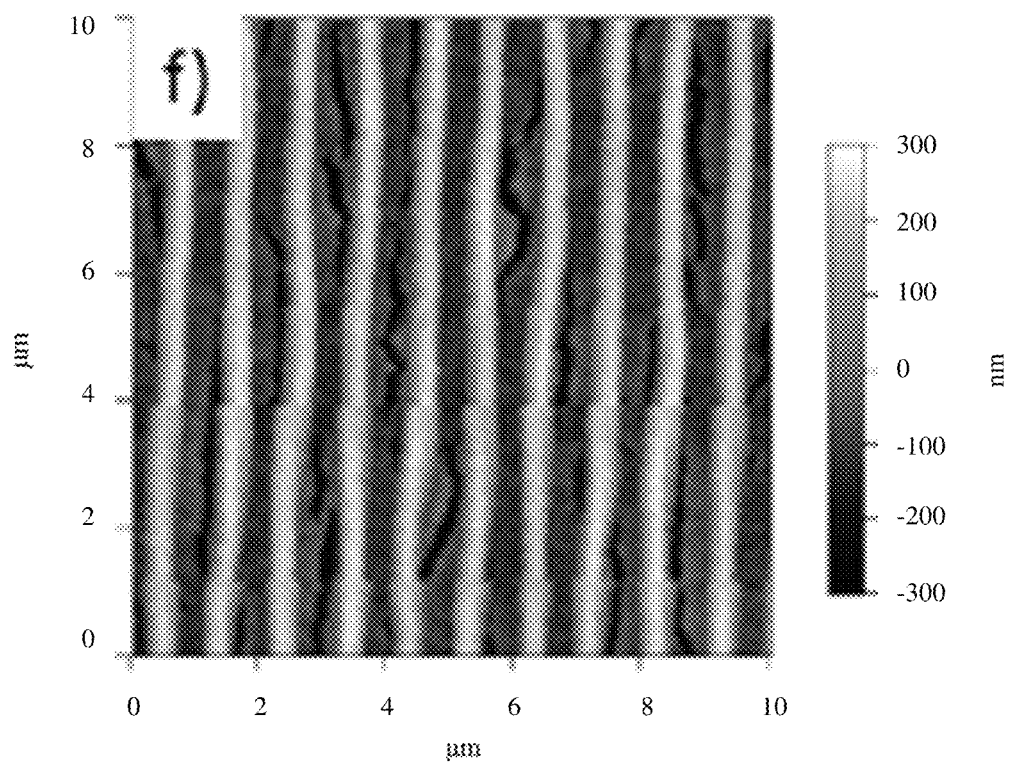

A sufficient time was allowed to pass for the coating to dry and the mold was carefully peeled off of the coating. The characteristic diffraction pattern for the particular mold could be seen over the entire film. X-ray photoelectron spectroscopy (XPS) has shown that gadolinia is present after calcination at 1000 C of the patterned gadolinia doped CeO$_2$ nanoparticle formulations. FIG. 14 shows the XRD spectra of the patterned CeO$_2$ nanoparticle formulations with gadolinia (Gd(III) (NO$_3$)$_3$) incorporated as the binder after calcination at 1000 C, showing a shift to a reduced 2θ upon incorporation of gadolinia within the CeO$_2$ lattice, indicating the presence of gadolinia.

Example 10: Patterning of ZrO$_2$ Nanoparticle Composites with Organic Solvent Dispersible Formulations Zirconium dioxide nanoparticles were used in the basic procedures described above. Solvent exchanging zirconium dioxide nanoparticles using the procedure in Example 1 was done by adding it to a 20 mL glass vial along with a solution of NOA60 in NMP in amounts varying from 0 wt % NOA60 to 90 wt % NOA60. The solution was sent through a 0.2 micron PTFE filter and then spun coat on a substrate (silicon, glass, or plastic, depending on the application) in a low humidity environment at 3000 rpm for 30 seconds and then the mold is put on top of the substrate with the coating. The coating was then irradiated with 365 nm UV light for 15 min with an intensity of 12 mW/cm$^2$ under a nitrogen environment. The mold was then carefully peeled from the coating.

Example 11: Synthesis of Zirconium (IV) (Isopropoxide)$_n$(Acetyl Acetonate)$_m$ A 100 mL amber glass vial was placed into a glass drying oven at 120° C. to remove the absorbed water. This vial was then charged with 20 mL of zirconium (IV) n-propoxide and between 4 mL and 10 mL of acetyl acetone, with stirring. An exothermic reaction takes place to yield a zirconium (IV) (isopropoxide)$_n$(acetyl acetonate)$_m$ sol-gel precursor. A sol-gel precursor that gave favorable results was zirconium (IV) (isopropoxide)$_{2.6}$(acetyl acetonate)$_{1.4}$, which was soluble within NMP.

Example 12: Patterned ZrO$_2$ Nanoparticle Composites with Zirconium Sol-Gel Precursors Solvent exchanged zirconium dioxide nanoparticles using the general procedure described in Example 1 (with 13.2 wt % ZrO$_2$ in a 50:50 mixture of NMP:MeOH) was added to a 20 mL glass vial along with a 30 wt % solution of zirconium (IV) (isopropoxide)$_n$(acetyl acetonate)$_m$ (ZPA) in n-propanol in amounts varying from 0 wt % ZPA to 90 wt % ZPA. The amount of ZPA that was added was adjusted to obtain the desired refractive index or dielectric constant.

The solution was filtered through a 0.2 micron PTFE filter and then spun coat on a substrate (silicon, glass, or plastic, depending on the application) in a low humidity environment at 3000 rpm for 30 seconds and then the mold was placed on top of the substrate with the coating. The coating was then irradiated with 365 nm UV light for 15 min with an intensity of 12 mW/cm$^2$. The mold was released from the coating and the characteristic diffraction pattern for the particular mold could be seen over the entire film.

FIG. 15 shows AFM images of samples patterned using solvent assisted UV-NIL (UV dose of approximately 10.7 J/cm$^2$) before calcination, where relative concentrations of nanoparticles and binder in the nanoparticle compositions are follows: A) 50 wt % ZrO$_2$ and 50 wt % ZPA, B) 60 wt % ZrO$_2$ and 40 wt % ZPA, C) 70 wt % ZrO$_2$ and 30 wt % ZPA, D) 80 wt % ZrO$_2$ and 20 wt % ZPA, E) 90 wt % ZrO$_2$ and 10 wt % ZPA and F) 100 wt % ZrO$_2$ and 0 wt % ZPA. FIG. 16 shows AFM images of the samples of FIG. 15 after calcination at 1000 C where relative concentrations of nanoparticles and binder in the nanoparticle compositions are follows: A) 50 wt % ZrO$_2$ and 50 wt % ZPA, B) 60 wt % ZrO$_2$ and 40 wt % ZPA, C) 70 wt % ZrO$_2$ and 30 wt % ZPA, D) 80 wt % ZrO$_2$ and 20 wt % ZPA, E) 90 wt % ZrO$_2$ and 10 wt % ZPA and F) 100 wt % ZrO$_2$ and 0 wt % ZPA.

Example 13: 3-D Fabrication of Patterned Nanoparticle Composites

In order to create a water releasable free standing structure, a tri-layer strategy using orthogonal solvents was employed. The first layer was the water soluble layer, which can be composed of poly(acrylic acid) (PAA), poly(vinyl alcohol) (PVOH), poly(styrene sulfonic acid), etc., and allows the structure to be free standing at the air-water interface until it is picked up.

A 5 wt % PVOH (Mowiol 4-88) solution in water was spun coat at 3000 rpm at ambient conditions and baked at 150 C for 1 minute to remove any residual solvent. The second layer was a bimodal poly(styrene) (PS, 45,000 g/mol), which acts as a barrier to the next nanoparticle composite layer. A 5 wt % PS solution in toluene was spun coat on top of the PVOH layer and baked at 90 C for 1 minute. Finally the solvent exchanged titanium dioxide nanoparticles using the general procedure describe in Example 1 (with 13.2 wt % TiO$_2$ in a 50:50 mixture of NMP:MeOH) was added to a 20 mL glass vial along with a 13.2 wt % solution of NOA60 in NMP in amounts varying from 0 wt % NOA60 to 90 wt % NOA60 can be spun coat. The amount of NOA60 that was added can be varied to obtain the desired refractive index, as can be seen in FIG. 20.

The solution was filtered through a 0.2 micron PTFE filter and then spun coat on a substrate (silicon, glass, or plastic, depending on the application) in a low humidity environment at 3000 rpm for 30 seconds and then the mold was placed on top of the substrate with the coating. The coating was then irradiated with 365 nm UV light for 15 min with an intensity of 12 mW/cm$^2$ under a nitrogen environment. The mold was carefully peeled off of the coating and the characteristic diffraction patterns for the particular mold could be seen over the entire film.

Figure 17:
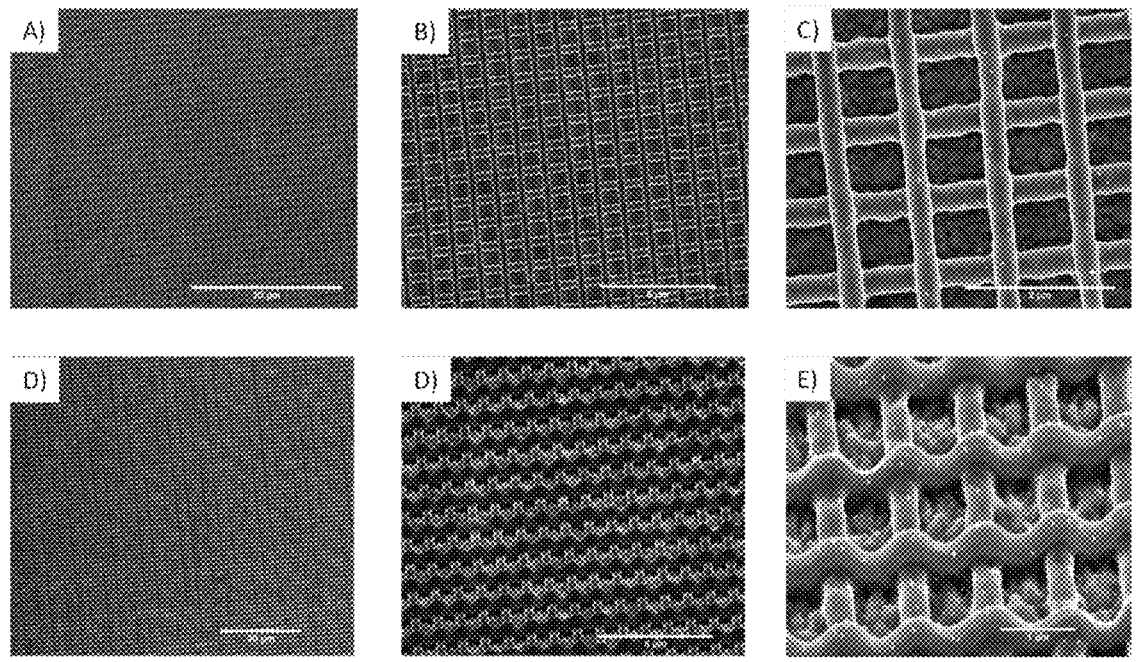
FIG. 17 shows SEM images of three-dimensional patterned nanoparticle structures in accordance with some examples.
Figure 18:
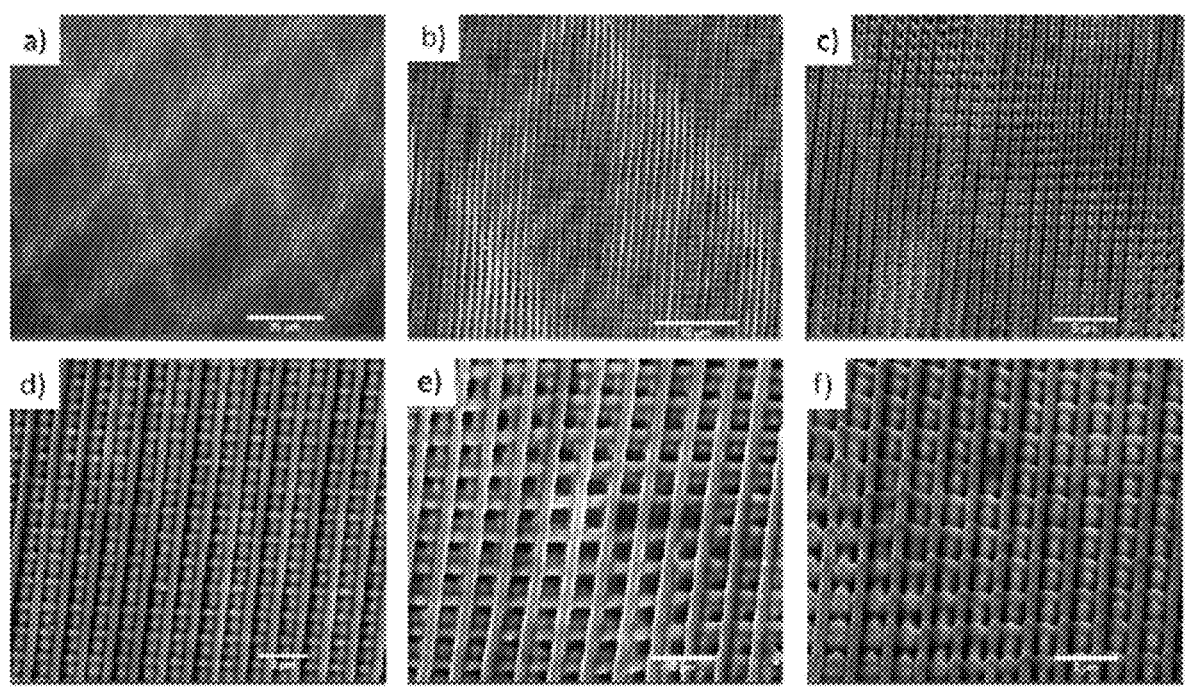
FIG. 18 depicts SEM images of three-dimensional patterned nanoparticle structures in accordance with some examples.
Figure 19:
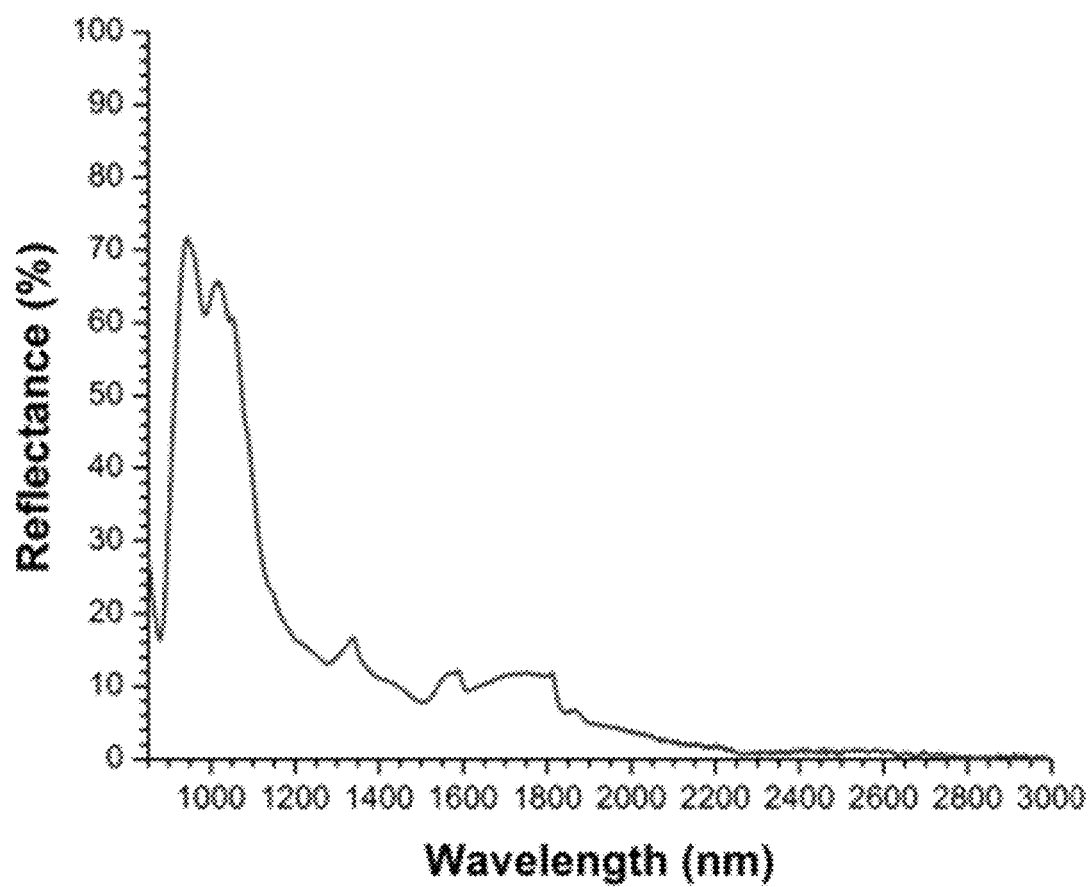
FIG. 19 shows a graph of reflectance as a function of wavelength of three-dimensional patterned nanoparticle structures in accordance with some examples.

Once the tri-layer has been created a water bath is then used to release the PS and patterned nanoparticle composite structure from the substrate. Then another substrate that was previously patterned was then picked up with the film at the air water interface (which may occur at any angle desired by the user). FIG. 17 shows SEM images of a cross double layer 3D patterned TiO$_2$ nanoparticle nanostructure (5 nm to 30 nm particle sizes) using a commercially available thiol-ene based photoresist (NOA60) with mold dimensions of 500 nm line width, 500 nm depth and 1.0 micron pitch. The relative compositions of nanoparticle and binder were 50 wt % TiO$_2$ and 50 wt % NOA60. FIG. 17 shows top down SEM images in A), B), and C) and SEM images tilted 50 degrees for D), E), and F) at different magnifications. FIG. 18 depicts SEM images of a four layer 3D photonic crystal patterned TiO$_2$ nanoparticle nanostructure where the relative composition of nanoparticle and binder were 50 wt % TiO$_2$ and 50 wt % NOA60. FIG. 18 shows top down SEM images at different magnifications. FIG. 19 illustrates a reflectance spectra of a 6 layer log-pile photonic crystal. The spectra shows the capability of these 3D photonic crystals to reflect a large amount of the electromagnetic spectrum, depending on the lattice parameters of the patterned nanoparticle composite.

Example 14: Patterned Nanoparticle Composites Using Photolithography

Solvent exchanged titanium dioxide nanoparticles using the general procedure described in Example 1 (with 13.2 wt % TiO$_2$ in a 50:50 mixture of NMP:MeOH) was added to a 20 mL glass vial along with a 13.2 wt % solution of NOA60 in NMP in amounts varying from 0 wt % NOA60 to 90 wt % NOA60. The amount of NOA60 was adjusted to obtain the desired refractive index, as can be seen in FIG. 21. The solution was filtered through a 0.2 micron PTFE filter and then spun coat on a substrate (silicon, glass, or plastic, depending on the application) in a low humidity environment at 3000 rpm for 30 seconds and then the mold was placed on top of the substrate with the coating. A lithographic mask is placed on top of the films and the film is irradiated with UV light to induce a crosslinking reaction in the exposed regions of the film. The mask is removed and the unexposed regions are removed using solvent to produce a patterned nanoparticle composition.

Example 15: Patterned Nanoparticle Compositions Using UV-assisted Nanoinscribing Solvent exchanged titanium dioxide nanoparticles using the general procedure described in Example 1 (with 13.2 wt % $TiO_2$ in a 50:50 mixture of NMP:MeOH) may be added to a 20 mL glass vial along with a 13.2 wt % solution of NOA60 in NMP in amounts varying from 0 wt % NOA60 to 90 wt % NOA60. The amount of NOA60 may be adjusted to obtain the desired refractive index, as can be seen in FIG. 20. FIG. 20 shows a graph of refractive index as a function of wavelength for the nanoparticle nanocomposites. The solution may be filtered through a 0.2 micron PTFE filter and then spun coat on a substrate (silicon, glass, or plastic, depending on the application) in a low humidity environment at 3000 rpm for 30 seconds. A transparent quartz master containing 200 nm groves may be brought into contact with the nanoparticle formulation and the substrate. Then the substrate may be translated relative to the master such that nanoparticle formulation is directed through the channels in the quartz master while the master and the film may be illuminated by UV light, which would cross-link the nanoparticle formulation to produce a pattern. The patterned substrate may be subject to additional illumination after contact with the master to induce additional crosslinking to produce a patterned nanoparticle composition.

Example 16: Patterned Nanoparticle Compositions with Titania Sols Using UV-Assisted Nanoinscribing Solvent exchanged titanium dioxide nanoparticles prepared using the general procedure described in Example 1 (with 13.2 wt % $TiO_2$ in a 50:50 mixture of NMP:MeOH) may be added to a 20 mL glass vial along with a 70 wt % solution of titanium diisopropoxide bis(acetylacetonate) in isopropanol in amounts varying from 0 wt % titanium diisopropoxide bis(acetylacetonate) to 90 wt % titanium diisopropoxide b(acetylacetonate). The amount of titanium diisopropoxide bis(acetylacetonate) that is added may be adjusted to obtain the desired refractive index. The solution may be filtered through a 0.2 micron PTFE filter and then spun coat on a substrate (silicon, glass, or plastic, depending on the application) in a low humidity environment at 3000 rpm for 30 seconds. A transparent quartz master containing 200 nm groves may be brought into contact with the nanoparticle formulation and the substrate. Then the substrate may be translated relative to the master such that nanoparticle formulation is directed through the channels in the quartz master while the master and the film may be illuminated by UV light, which may cross-link the nanoparticle formulation to produce a pattern. The patterned substrate may be subject to additional illumination after contact with the master to induce additional crosslinking to produce a patterned nanoparticle composition.

Example 17: Patterned Nanoparticle Compositions Using Optical Flash Lamp Pulse Curing (Photonic Curing) System Organic solvent based nanoparticle dispersions of indium doped tin oxide (ITO) or antimony doped tin oxide (ATO) nanoparticles prepared using the general procedure described in Example 1 or obtained by other methods may be added to a 20 mL glass vial. These organic solvent or aqueous based ITO or ATO slurries can be coated on a number of substrates, including, but not limited to: silicon, glass, poly(ethylene terephthalate) (PET), poly(ethylene naphthalate) (PEN), poly(imide) (PI), etc. A mold with various features described herein on it can be placed on top of the coated ITO or ATO nanoparticle film, after the majority of the solvent has been removed and then cured using a pulsed Xenon source (flash lamp), while the mold is in contact or not in contact with the nanoparticles. The photonic curing can take place in very short times, which may allow for roll-to-roll sintering of patterned ITO and ATO nanoparticle films to be generated at high speeds (>1 $m^2/s$). Photonic curing allows for the thermal processing of thin films on relatively low temperature substrates, without damaging the substrate.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A material comprising:
a substrate;
a plurality of nanoparticles formed as a patterned nanostructure on a uniform portion of the substrate, wherein a feature size of the patterned nanostructure is less than 5 microns, wherein the feature size does not include a film thickness of the patterned nanostructure, wherein the plurality of the nanoparticles have an average particle size of less than 100 nm, and wherein the patterned nanostructure includes features with an aspect ratio of height to width between or equal to 1.5:1 and 10:1.

2. The material of claim 1, wherein the material further includes a binder material mixed with the plurality of the nanoparticles.

3. The material of claim 1, wherein the plurality of the nanoparticles comprise at least one of metal, metal oxide, semiconductor, insulator, carbonaceous material, and combinations thereof.

4. The material of claim 1, wherein the plurality of the nanoparticles comprise at least one of $RuO_2$, $TiO_2$, $In_2O_3$, $ZrO_2$, $Y_2O_3$, $CeO_2$, YSZ, $Al_2O_3$, $SnO_2$, ZnO, $Fe_2O_3$, $Fe_3O_4$, ITO, and combinations thereof.

5. The material of claim 1, wherein the plurality of the nanoparticles are crystalline.

6. The material of claim 1, wherein the plurality of the nanoparticles are amorphous.

7. The material of claim 1, wherein the plurality of the nanoparticles have surfaces that are unmodified.

8. The material of claim 1, wherein the plurality of the nanoparticles have surfaces modified by a covalently bound ligand.

9. The material of claim 2, wherein the binder material comprises at least one of a monomer, oligomer, polymer and combinations thereof.

10. The material of claim 2, wherein the binder material comprises a sol-gel precursor material.

11. The material of claim 2, wherein the binder material comprises an insulative material.

12. The material of claim 2, wherein the binder material comprises a conductive material.

13. The material of claim 2, wherein the binder material comprises less than or equal to 50% by weight of the patterned nanostructure.

14. The material of claim 1, wherein the patterned nanostructure has an index of refraction of between 1.5 and 5.0.

15. The material of claim 1, wherein a geometry of the patterned nanostructure is constructed and arranged to manipulate electromagnetic radiation.

16. A material comprising:
a substrate;
a plurality of nanoparticles formed as a patterned nanostructure on a uniform portion of the substrate, wherein a feature size of the patterned nanostructure is less than 5 microns, wherein the feature size does not include a film thickness of the patterned nanostructure, wherein the plurality of the nanoparticles have an average particle size of less than 100 nm; and
a binder mixed with the plurality of the nanoparticles, wherein the binder is a precursor of a material of the nanoparticles.

17. The material of claim 16, wherein the plurality of the nanoparticles comprise at least one of metal, metal oxide, semiconductor, insulator, carbonaceous material, and combinations thereof.

18. The material of claim 16, wherein the plurality of the nanoparticles comprise at least one of $RuO_2$, $TiO_2$, $In_2O_3$, $ZrO_2$, $Y_2O_3$, $CeO_2$, YSZ, $Al_2O_3$, $SnO_2$, ZnO, $Fe_2O_3$, $Fe_3O_4$, ITO, and combinations thereof.

19. The material of claim 16, wherein the binder comprises a sol-gel precursor material.

20. The material of claim 16, wherein a geometry of the patterned nanostructure is constructed and arranged to manipulate electromagnetic radiation.

21. The material of claim 16, wherein the binder comprises an insulative material.

22. The material of claim 16, wherein the binder comprises a conductive material.

23. The material of claim 16, wherein the binder comprises less than or equal to 50% by weight of the patterned nanostructure.

24. The material of claim 16, wherein the patterned nanostructure has an index of refraction of between 1.0 and 5.0.

25. The material of claim 16, wherein a uniform composition within the patterned nanostructure forms when the plurality of the nanoparticles and the binder are calcined.

26. A material comprising:
a substrate;
a continuous film formed on a uniform portion of the substrate, wherein the continuous film includes a plurality of nanoparticles and a patterned nanostructure is formed in the continuous film, wherein a feature size of the patterned nanostructure is less than 5 microns, wherein the feature size does not include a film thickness of the patterned nanostructure, and wherein the plurality of the nanoparticles have an average particle size of less than 100 nm.

27. The material of claim 26, wherein the material further includes a binder material mixed with the plurality of the nanoparticles.

28. The material of claim 27, wherein the binder comprises a precursor of a material of the nanoparticles.

29. The material of claim 28, wherein a uniform composition within the patterned nanostructure forms when the plurality of the nanoparticles and the binder are calcined.

30. The material of claim 26, wherein the patterned nanostructure includes features with an aspect ratio of height to width between or equal to 1.5:1 and 10:1.

31. A material comprising:
a substrate;
a plurality of nanoparticles formed as a patterned nanostructure on a uniform portion of the substrate, wherein a feature size of the patterned nanostructure is less than 5 microns, wherein the feature size does not include a film thickness of the patterned nanostructure, wherein the plurality of the nanoparticles have an average particle size of less than 100 nm, and wherein the plurality of the nanoparticles are electrically conductive and the plurality of the nanoparticles within the nanostructure are electrically connected with one another.

32. The material of claim 31, wherein the material further includes an electrically conductive binder material mixed with the plurality of the nanoparticles.

33. The material of claim 32, wherein the binder comprises a precursor of a material of the nanoparticles.

34. The material of claim 33, wherein a uniform composition within the patterned nanostructure forms when the plurality of the nanoparticles and the binder are calcined.

35. The material of claim 31, wherein the patterned nanostructure includes features with an aspect ratio of height to width between or equal to 1.5:1 and 10:1.

36. The material of claim 2, wherein a nanoparticle composition including the binder material and the nanoparticles is optically transparent.

37. The material of claim 36, wherein the nanoparticle composition is at least 90% transparent at at least one wavelength.

38. The material of claim 1, wherein the plurality of nanoparticles comprises a transparent conductive oxide.

39. The material of claim 2, wherein the binder material is crosslinked.

40. The material of claim 1, wherein the nanoparticles are catalytic.

41. The material of claim 16, wherein a nanoparticle composition including the binder material and the nanoparticles is optically transparent.

42. The material of claim 41, wherein the nanoparticle composition is at least 90% transparent at at least one wavelength.

43. The material of claim 16, wherein the plurality of nanoparticles comprises a transparent conductive oxide.

44. The material of claim 16, wherein the binder material is crosslinked.

45. The material of claim 16, wherein the nanoparticles are catalytic.

46. The material of claim 27, wherein a nanoparticle composition including the binder material and the nanoparticles is optically transparent.

47. The material of claim 46, wherein the nanoparticle composition is at least 90% transparent at at least one wavelength.

48. The material of claim 26, wherein the plurality of nanoparticles comprises a transparent conductive oxide.

49. The material of claim 27, wherein the binder material is crosslinked.

50. The material of claim 26, wherein the nanoparticles are catalytic.

51. The material of claim 32, wherein a nanoparticle composition including the binder material and the nanoparticles is optically transparent.

52. The material of claim 51, wherein the nanoparticle composition is at least 90% transparent at at least one wavelength.

53. The material of claim 31, wherein the plurality of nanoparticles comprises a transparent conductive oxide.

54. The material of claim 32, wherein the binder material is crosslinked.

55. The material of claim 31, wherein the nanoparticles are catalytic.

\* \* \* \* \*